(12) United States Patent
Takeuchi et al.

(10) Patent No.: US 7,260,130 B2
(45) Date of Patent: Aug. 21, 2007

(54) SEMICONDUCTOR LASER DEVICE AND METHOD OF FABRICATING THE SAME

(75) Inventors: Kunio Takeuchi, Joyo (JP); Ryoji Hiroyama, Kyo-tanabe (JP); Daijiro Inoue, Kyoto (JP); Shigeyuki Okamoto, Kobe (JP); Noriaki Matsuoka, Kyo-tanabe (JP); Shingo Kameyama, Hirakata (JP); Kiyoshi Oota, Neyagawa (JP)

(73) Assignee: Sanyo Electric Co., Ltd., Osaka (JP)

( * ) Notice: Subject to any disclaimer, the term of this patent is extended or adjusted under 35 U.S.C. 154(b) by 324 days.

(21) Appl. No.: 10/811,137

(22) Filed: Mar. 29, 2004

(65) Prior Publication Data

US 2004/0252739 A1 Dec. 16, 2004

(30) Foreign Application Priority Data

Mar. 31, 2003 (JP) ............................. 2003-093976
Sep. 29, 2003 (JP) ............................. 2003-337877

(51) Int. Cl.
*H01S 5/00* (2006.01)
(52) U.S. Cl. .................. 372/46.01; 372/43.01
(58) Field of Classification Search ............. 372/46.01, 372/43.01, 45.01
See application file for complete search history.

(56) References Cited

U.S. PATENT DOCUMENTS 5,387,544 A * 2/1995 Hayafuji ................... 117/89

| | | | |
|---|---|---|---|
| 6,323,530 B1 | 11/2001 | Kubota | |
| 6,387,721 B1 | 5/2002 | Hashimoto et al. | |
| 2002/0028390 A1* | 3/2002 | Mazed | 430/5 |
| 2002/0117104 A1 | 8/2002 | Hata et al. | |
| 2002/0146855 A1* | 10/2002 | Goto et al. | 438/29 |

FOREIGN PATENT DOCUMENTS

| | | | |
|---|---|---|---|
| JP | 6-45683 | | 2/1994 |
| JP | 9-167875 | | 6/1997 |
| JP | 10-284794 | | 10/1998 |
| JP | 11-145558 | | 5/1999 |
| JP | 2000-164986 | | 6/2000 |
| JP | 2000-244063 | | 9/2000 |
| JP | 2001-024280 | | 1/2001 |
| JP | 2002-223039 | * | 8/2002 |
| JP | 2002-223039 | * | 9/2002 |
| JP | 2002-252421 | | 9/2002 |
| JP | 2003-031905 | | 1/2003 |

* cited by examiner

*Primary Examiner*—Dung (Michael) T. Nguyen
(74) *Attorney, Agent, or Firm*—McDermott Will & Emery LLP

(57) ABSTRACT

A semiconductor laser device capable of improving heat dissipativity, simplifying the fabrication process and improving the fabrication yield is obtained. This semiconductor laser device comprises a semiconductor layer formed on an emission layer while constituting a convex ridge portion, a current blocking layer consisting of a semiconductor formed to cover at least the side surfaces of the ridge portion, a first metal electrode formed to be in contact with the upper surface of the ridge portion and convex support portions arranged on both sides of the ridge portion at a prescribed interval from the ridge portion.

21 Claims, 26 Drawing Sheets

SEMICONDUCTOR LASER DEVICE AND METHOD OF FABRICATING THE SAME

BACKGROUND OF THE INVENTION

1. Field of the Invention

The present invention relates to a semiconductor laser device and a method of fabricating the same, and more particularly, it relates to a semiconductor laser device having a convex ridge portion and a method of fabricating the same.

2. Description of the Background Art

A semiconductor laser device having a convex ridge portion serving as a current path is known in general. For example, Japanese Patent Laying-Open No. 2002-252421 discloses this type of semiconductor laser device.

FIG. 50 is a sectional view for illustrating a conventional semiconductor laser device having a ridge portion. The structure of the conventional semiconductor laser device having a ridge portion is described with reference to FIG. 50.

In the conventional semiconductor laser device having a ridge portion, an n-type buffer layer 202 of n-type GaInP, an n-type cladding layer 203 of n-type AlGaInP, an emission layer 204 including a multiple quantum well (MQW) active layer of GaInP/AlGaInP and a p-type first cladding layer 205 of p-type AlGaInP are successively formed on an n-type GaAs substrate 201, as shown in FIG. 50.

A mesa (trapezoidal) ridge portion constituted of a p-type second cladding layer 206 of p-type AlGaInP, an intermediate layer 207 of p-type GaInP and a contact layer 208 of p-type GaAs is formed on a prescribed region of the upper surface of the p-type first cladding layer 205. This ridge portion is formed in a striped (elongated) shape.

Current blocking layers 209 prepared by stacking n-type AlInP layers and n-type GaAs layers are formed to cover the upper surface of the p-type first cladding layer 205 and both side surfaces of the ridge portion while exposing only the upper surface of the ridge portion (contact layer 208). A p-type cap layer 210 of p-type GaAs is formed to cover the exposed upper surface of the ridge portion and the upper surfaces of the current blocking layers 209.

A p-side electrode 211 is formed on a portion of the p-type cap layer 210 around the aforementioned ridge portion. An n-side electrode 212 is formed on the back surface of the n-type GaAs substrate 201.

A process of fabricating the conventional semiconductor laser device having a ridge portion is now described with reference to FIG. 50. First, the n-type buffer layer 202 of n-type GaInP, the n-type cladding layer 203 of n-type AlGaInP, the emission layer 204 including the multiple quantum well (MQW) active layer of GaInP/AlGaInP, the p-type first cladding layer 205 of p-type AlGaInP, the p-type second cladding layer 206 of p-type AlGaInP, the intermediate layer 207 of p-type GaInP and the contact layer 208 of p-type GaAs are successively formed on the n-type GaAs substrate 201 by MOVPE (metal organic vapor phase epitaxy).

Then, SiO$_2$ layers (not shown) are formed on the contact layer 208 by photolithography and etching at a prescribed interval. The SiO$_2$ layers are employed as masks for etching the p-type second cladding layer 206, the intermediate layer 207 and the contact layer 208, thereby forming the mesa (trapezoidal) ridge portion consisting of the p-type second cladding layer 206, the intermediate layer 207 and the contact layer 208 in the striped shape on the central portion of the p-type first cladding layer 205.

Then, an SiO$_2$ layer (not shown) formed on the ridge portion is employed as a mask for growing the current blocking layers 209 consisting of the n-type AlInP layers and the n-type GaAs layers to cover the upper surface of the p-type first cladding layer 205 and both side surfaces of the ridge portion. Thereafter the SiO$_2$ layer (not shown) is removed from the ridge portion.

Thereafter the p-type cap layer 210 of p-type GaAs is formed by MOVPE to cover the exposed upper surface of the ridge portion and the upper surfaces of the current blocking layers 209. The p-side electrode 211 is formed on the portion of the p-type cap layer 210 around the aforementioned ridge portion by the lift off method.

The back surface of the n-type GaAs substrate 201 is etched for thereafter forming the n-side electrode 212 on this back surface. The conventional semiconductor laser device having a ridge portion is formed in the aforementioned manner.

FIG. 51 is a sectional view illustrating the conventional semiconductor laser device shown in FIG. 50 in a state mounted on a submount 251 in a junction-down system. According to the junction-down system, the semiconductor laser device is mounted on the submount 251 from the surface closer to the emission layer (active layer) 204. Referring to FIG. 51, a projecting portion of the p-side electrode 211 provided on the surface of the aforementioned conventional semiconductor laser device is directed downward and mounted on a metal film (electrode) 252 of the submount 251 through a welding material 253 consisting of a low melting point metal such as solder. In this case, the submount 251 also has a function of a heat sink absorbing heat of the semiconductor laser device and dissipating the same outward in general. Therefore, the heat generated from the semiconductor laser device is dissipated by the submount 251 from the aforementioned ridge portion through the p-type cap layer 210, the p-side electrode 211, the welding material 253 and the metal film 252.

When the aforementioned conventional semiconductor laser device is mounted on the submount 251 in the junction-down system, however, the heat generated from the semiconductor laser device is dissipated by the submount 251 through the p-type cap layer 210 of p-type GaAs having lower thermal conductivity than the welding material 253 of a low melting point metal such as solder, to disadvantageously reduce heat dissipativity. Therefore, the conventional semiconductor laser device is disadvantageously reduced in reliability (lifetime).

In the aforementioned conventional semiconductor laser device, further, three crystal growth steps must be carried out in total by MOVPE for growing the layers from the n-type buffer layer 202 to the contact layer 208, the current blocking layers 209 and the p-type cap layer 210 respectively. Consequently, the fabrication process for the semiconductor laser device is disadvantageously complicated.

When mounted on the submount 251 in the junction-down system, further, the aforementioned conventional semiconductor laser device is so easily inclined with respect to the submount 251 that the welding material 253 such as solder adheres to the side end surfaces of the inclined semiconductor laser device to easily electrically short the n-type semiconductor layers 202 and 203 and the p-type semiconductor layers 205 to 208 holding the emission layer 204 including the MQW active layer therebetween. Consequently, the fabrication yield is disadvantageously reduced.

When the aforementioned semiconductor laser device is mounted on the submount 251 in the junction-down system, in addition, only the projecting portion of the p-side electrode 211 comes into contact with the metal film 252 of the submount 251, to disadvantageously easily apply stress to the ridge portion located under the projecting portion of the p-side electrode 211. When stress is applied to the ridge portion, the operating current and the operating voltage are disadvantageously increased. When stress is applied to the ridge portion, further, the intensity ratio of polarization between a TE mode having an electric field component in a direction parallel to the emission layer 204 including the MQW active layer and a TM mode having an electric field component in a direction perpendicular to the emission layer 204 (intensity of TE mode/intensity of TM mode: polarization ratio) is disadvantageously reduced in light emitted from the semiconductor laser device.

SUMMARY OF THE INVENTION

An object of the present invention is to provide a semiconductor laser device capable of improving heat dissipativity and reliability (lifetime), simplifying the fabrication process and improving the fabrication yield.

In order to attain the aforementioned object, a semiconductor laser device according to a first aspect of the present invention comprises an emission layer formed on a substrate, a semiconductor layer formed on the emission layer while constituting a convex ridge portion, a current blocking layer consisting of a semiconductor formed to cover at least the side surfaces of the ridge portion, a first metal electrode formed to be in contact with the upper surface of the ridge portion and convex support portions arranged on both sides of the ridge portion at a prescribed interval from the ridge portion.

In the semiconductor laser device according to the first aspect, as hereinabove described, the first metal electrode is formed to be in contact with the upper surface of the ridge portion so that heat generated from the semiconductor laser device in a driven state can be more easily dissipated as compared with a case of forming a cap layer of a semiconductor having lower thermal conductivity than a metal on the upper surface of the ridge portion. Thus, the semiconductor laser device can be inhibited from temperature rise in the driven state, whereby the reliability (lifetime) thereof can be improved. The convex support portions are so arranged on both sides of the ridge portion that the semiconductor laser device is not inclined when the same is mounted on a submount through a welding layer of solder or the like. Thus, solder hardly reaches the side surfaces of the semiconductor laser device, whereby the semiconductor laser device can be inhibited from a short between p- and n-type semiconductor layers or generation of a leakage current through the support portions. Thus, the semiconductor laser device can be so inhibited from a short or a leakage current as to improve the fabrication yield and the reliability (lifetime). Further, no semiconductor cap layer may be formed on the upper surfaces of the ridge portion and the current blocking layer, whereby the number of steps of growing semiconductor layers can be reduced by one. Thus, the fabrication process can be simplified. Consequently, the semiconductor laser device can improve heat dissipativity and reliability (lifetime), simplify the fabrication process and improve the fabrication yield.

In the aforementioned semiconductor laser device according to the first aspect, the current blocking layer of a semiconductor is preferably formed not on the upper surface of the ridge portion but on the upper surfaces of the support portions. According to this structure, the height of the support portions exceeds that of the ridge portion by the thickness of the current blocking layer if the thicknesses of the ridge portion and the support portions are identical to each other, whereby the height of portions of the first metal electrode located on the support portions exceeds that of the remaining portion when the first metal electrode is formed on the ridge portion and the support portions. When the first metal electrode is mounted on a submount, therefore, the portions of the first metal electrode located on the support portions come into contact with the submount while the remaining portion located on the ridge portion is not in contact with the submount, whereby stress applied to the ridge portion can be reduced. Thus, the semiconductor laser device can be prevented from deterioration of the characteristics resulting from stress, whereby the reliability (lifetime) of the semiconductor laser device can be improved. If stress applied to the ridge portion is small, the polarization ratio of a laser beam emitted from the semiconductor laser device is so increased that a polarization ratio of at least 50 necessary for recording in a recording-type optical disk can be easily obtained. In this case, the support portions are preferably substantially flush with the upper surface of the ridge portion.

In the aforementioned semiconductor laser device according to the first aspect, the first metal electrode may include a plurality of metal electrode layers.

In the aforementioned semiconductor laser device according to the first aspect, the first metal electrode preferably includes an upper surface having an irregular shape reflecting the shape of the convex ridge portion, the shape of the support portions and the shape of the current blocking layer. According to this structure, the semiconductor laser device can be easily prevented from inclination when the first metal electrode is mounted on the submount, due to the portions of the first metal electrode located on the support portions.

In this case, the height of portions of the first metal electrode located on the support portions preferably exceeds that of a portion located on the ridge portion. According to this structure, the first metal electrode can be so easily mounted on the submount that the portions located on the support portions are in contact with the submount and the remaining portion located on the ridge portion is not in contact with the submount, whereby stress applied to the ridge portion can be reduced.

In the aforementioned semiconductor laser device according to the first aspect, the convex ridge portion and the support portions may be mounted on a submount through a welding layer. According to this structure, heat generated in the ridge portion can be dissipated through the submount.

In this case, the first metal electrode is so mounted on the submount that portions of the first metal electrode located on the support portions are in contact with the submount and a portion of the first metal electrode located on the ridge portion is not in contact with the submount. According to this structure, stress applied to the ridge portion can be easily reduced.

In the aforementioned semiconductor device according to the first aspect, side surfaces of the support portions closer to end surfaces of the semiconductor laser device (side surfaces of the semiconductor laser device perpendicular to cavity facets are preferably arranged inward beyond the end surfaces of the semiconductor laser device at a prescribed interval. According to this structure, the end surfaces of the semiconductor laser device are provided with no support potions, whereby a welding layer of solder or the like can be inhibited from reaching the end surfaces of the semiconductor laser device through outer side surfaces of support portions located on the end surfaces of the semiconductor laser device. Thus, p- and n-type layers can be prevented from a disadvantageous short resulting from the welding layer of solder or the like reaching the end surfaces of the semiconductor laser device.

In the aforementioned semiconductor laser device according to the first aspect, the current blocking layer preferably covers side surfaces of the support portions closer to end surfaces of the semiconductor laser device, the upper surfaces of the support portions and side surfaces of the support portions closer to the ridge portion. According to this structure, current for energizing the semiconductor laser device flows only to the ridge portion also when the first metal electrode is mounted on a submount and a welding layer of solder or the like adheres to the side surfaces of the support portions since no current flows to the support portions. Thus, the semiconductor laser device can attain high quantum efficiency.

In the aforementioned semiconductor laser device according to the first aspect, the thickness of the first metal electrode may be at least 5 μm. According to this structure, flexibility of the first metal electrode is improved due to the large thickness, whereby stress acting on the ridge portion can be reduced. Consequently, the polarization ratio of the laser beam emitted from the semiconductor laser device can be so increased that a polarization ratio of at least 50 necessary for a recording-type optical disk can be easily obtained.

In the aforementioned semiconductor device according to the first aspect, the first metal electrode preferably contains a dopant having the same conductivity type as the semiconductor layer constituting the ridge portion. According to this structure, the first metal electrode and the semiconductor layer constituting the ridge portion can be brought into ohmic contact with each other, whereby contact resistance can be reduced. Consequently, the semiconductor laser device can be further inhibited from heat generation.

In this case, the semiconductor layer constituting the ridge portion preferably consists of a group III-V compound semiconductor, and the dopant, contained in the first metal electrode, having the same conductivity type as the semiconductor layer constituting the ridge portion preferably includes at least one element selected from a group consisting of Zn, Cd, Be, Mg, Ca and Ba. According to this structure, the group III-V compound semiconductor layer constituting the ridge portion can be easily converted to a p type due to the aforementioned element, and the first metal electrode and the aforementioned ridge portion converted to the p type can be easily brought into ohmic contact with each other.

In the aforementioned semiconductor laser device according to the first aspect, a plurality of convex support portions may be arranged on each side of the ridge portion. According to this structure, a contact area between the semiconductor laser device mounted on a submount with a welding layer of solder or the like and the submount is so increased that the semiconductor laser device can be more stably mounted.

In the aforementioned semiconductor laser device according to the first aspect, the emission layer includes a plurality of emission layers, formed on the substrate at a prescribed interval, each having an emission portion, and the semiconductor layer constituting the convex ridge portion, the current blocking layer, the first metal electrode and the convex support portions are formed on each of the plurality of emission layers. According to this structure, improvement of heat conduction and reliability (lifetime), simplification of a fabrication process and improvement of the fabrication yield can be attained in a multi-beam laser (semiconductor laser device) having a plurality of emission portions.

In the aforementioned semiconductor laser device according to the first aspect, the interval between the lower end of the ridge portion and the lower ends of the support portions is preferably at least 20 μm. According to this structure, the degree of adhesion of a polycrystalline growth film to a mask formed on the upper surface of the ridge portion is reduced in formation of the current blocking layer, whereby resistance can be inhibited from increase resulting from adhesion of the polycrystalline growth film to the mask formed on the upper surface of the ridge portion. Thus, the operating voltage can be inhibited from increase. Further, the interval between the lower end of the ridge portion and those of the support portions is so set to at least 20 μm that the resistance can be inhibited from increase without complicating the structure.

In the aforementioned semiconductor laser device setting the interval between the lower end of the ridge portion and those of the support portions to at least 20 μm, the interval between the lower end of the ridge portion and the lower ends of the support portions may be not more than 100 μm. According to this structure, a welding material of solder or the like smoothly reaches a trench portion of an electrode formed between the ridge portion and the support portions in junction-down assembling. Thus, no space is defined between the electrode and a submount or a heat sink. Consequently, heat generated in the semiconductor laser device can be sufficiently dissipated to the submount or the heat sink.

In the aforementioned semiconductor laser device setting the interval between the lower end of the ridge portion and those of the support portions to at least 20 μm, the current blocking layer may consist of a compound semiconductor containing aluminum. When the interval between the lower end of the ridge portion and those of the support portions is set to at least 20 μm in formation of the current blocking layer consisting of the compound semiconductor containing aluminum, the effect of reducing the degree of adhesion of the polycrystalline growth film to the mask formed on the upper surface of the ridge portion is remarkable.

A semiconductor laser device according to a second aspect of the present invention comprises an emission layer formed on a substrate, a semiconductor layer formed on the emission layer while constituting a convex ridge portion, a current blocking layer formed on a side of the ridge portion, a first metal electrode formed to be in contact with the upper surface of the ridge portion and a second metal electrode, formed on the first metal electrode, superior in adhesiveness to the first metal electrode.

In the semiconductor laser device according to the second aspect, as hereinabove described, the first metal electrode is so formed to be in contact with the upper surface of the ridge portion that heat generated from the semiconductor laser device under operation can be more easily dissipated as compared with a case of forming a semiconductor cap layer having lower thermal conductivity than a metal on the upper surface of the ridge portion. Thus, the semiconductor laser device can be inhibited from temperature rise in the driven state, whereby the reliability (lifetime) thereof can be improved. Further, the second metal electrode superior in adhesiveness to the first metal electrode is so formed on the first metal electrode that the first metal electrode can be inhibited from separating from the upper surface of the ridge portion also when adhesiveness between the first metal electrode and the semiconductor layer constituting the ridge portion is low. Thus, the reliability (lifetime) of the semiconductor laser device can be improved. In addition, no semiconductor cap layer may be formed on the upper surfaces of the ridge portion and the current blocking layer, whereby the number of steps of growing semiconductor layers can be reduced by one. Thus, the fabrication process can be simplified. Consequently, the semiconductor laser device can improve heat dissipativity and reliability (lifetime), simplify the fabrication process and improve the fabrication yield.

In the aforementioned semiconductor laser device including the first and second metal electrodes, the second metal electrode is preferably formed to be in contact with the current blocking layer. According to this structure, the first metal electrode can be easily inhibited from separating from the upper surface of the ridge portion also when adhesiveness between the first metal electrode and the semiconductor layer constituting the ridge portion is low.

In the aforementioned semiconductor laser device including the first and second metal electrodes, the first metal electrode preferably contains a dopant having the same conductivity type as the semiconductor layer constituting the ridge portion. According to this structure, the first metal electrode and the semiconductor layer constituting the ridge portion can be brought into ohmic contact with each other, whereby contact resistance can be reduced. Consequently, the semiconductor laser device can be further inhibited from heat generation.

In this case, the semiconductor layer constituting the ridge portion preferably consists of a group III-V compound semiconductor, and the dopant, contained in the first metal electrode, having the same conductivity type as the semiconductor layer constituting the ridge portion preferably includes at least one element selected from a group consisting of Zn, Cd, Be, Mg, Ca and Ba. According to this structure, the group III-V compound semiconductor layer constituting the ridge portion can be easily converted to a p type due to the aforementioned element, and the first metal electrode and the aforementioned ridge portion converted to the p type can be easily brought into ohmic contact with each other.

In the aforementioned semiconductor laser device according to the second aspect, the sum of the thicknesses of the first metal electrode and the second metal electrode is preferably at least 5 µm. According to this structure, the first and second metal electrodes are so improved in flexibility that stress acting on the ridge portion can be reduced. Consequently, the polarization ratio of a laser beam emitted from the semiconductor laser device can be so increased that a polarization ratio of at least 50 necessary for a recording-type optical disk can be easily obtained.

A method of fabricating a semiconductor laser device according to a third aspect of the present invention comprises steps of forming an emission layer on a substrate, forming a semiconductor layer constituting a convex ridge portion on the emission layer, forming a current blocking layer consisting of a semiconductor to cover at least the side surfaces of the ridge portion and forming a convex support portion so that the interval between the lower end of the ridge portion and the lower end of the support portion is at least 20 µm.

In the method of fabricating a semiconductor laser device according to the third aspect, as hereinabove described, the convex support portion is so formed that the interval between the lower end of the ridge portion and that of the support portion is at least 20 µm, whereby the degree of adhesion of a polycrystalline growth film to a mask formed on the upper surface of the ridge portion is reduced in formation of the current blocking layer and resistance can be inhibited from increase resulting from adhesion of the polycrystalline growth film to the mask formed on the upper surface of the ridge portion. Thus, the operating voltage can be inhibited from increase. Further, the interval between the lower end of the ridge portion and that of the support portion is so set to at least 20 µm that the resistance can be inhibited from increase without complicating the structure.

In the aforementioned method of fabricating a semiconductor laser device according to the third aspect, the step of forming the support portion preferably includes a step of forming the support portion so that the interval between the lower end of the ridge portion and the lower end of the support portion is not more than 100 µm. According to this structure, a welding material of solder or the like smoothly reaches a trench portion of an electrode formed between the ridge portion and the support portion in junction-down assembling. Thus, no space is defined between the electrode and a submount or a heat sink. Consequently, heat generated in the semiconductor laser device can be sufficiently dissipated to the submount or the heat sink.

In the aforementioned method of fabricating a semiconductor laser device according to the third aspect, the step of forming the current blocking layer preferably includes steps of forming a mask consisting of a dielectric substance on the upper surface of the ridge portion and crystal-growing the current blocking layer consisting of a semiconductor on a portion other than the mask. According to this structure, the current blocking layer can be selectively grown on both side surfaces of the ridge portion, upper and both side surfaces of the support portion and a region between the ridge portion and the support portion through the mask consisting of a dielectric substance. Further, the interval between the lower end of the ridge portion and that of the support portion is so set to at least 20 µm that a polycrystalline growth film can be inhibited from adhering to the mask formed on the upper surface of the ridge portion.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

The structure of a semiconductor laser device according to a first embodiment is described with reference to FIGS. 1 and 2.

Figure 1:
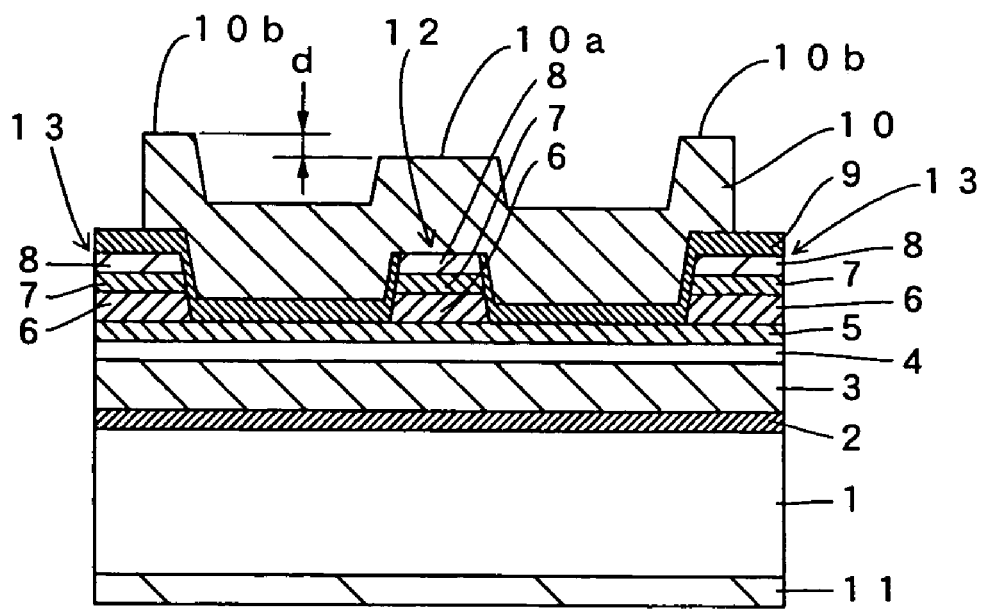
FIG. 1 is a sectional view for illustrating a semiconductor laser device according to a first embodiment of the present invention.

In the semiconductor laser device according to the first embodiment, an n-type buffer layer 2, an n-type cladding layer 3, an emission layer 4 and a p-type first cladding layer 5 are successively formed on an n-type GaAs substrate 1 inclined from the (100) plane by 9° in the [011] direction, as shown in FIG. 1. The n-type buffer layer 2 has a thickness of about 0.3 μm, and consists of n-type GaInP doped with Si. The n-type cladding layer 3 has a thickness of about 2 μm, and consists of n-type AlGaInP (Al composition ratio: 0.7) doped with Si by a dose of $3 \times 10^{17}$ cm$^{-3}$.

Figure 2:
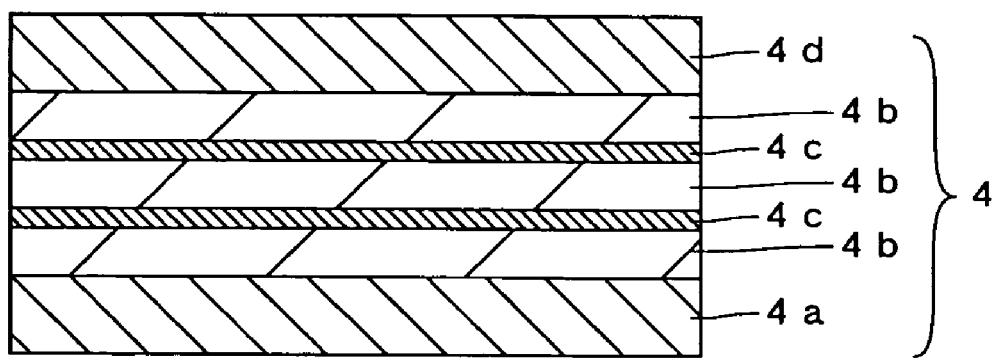
FIG. 2 is a sectional view for illustrating the structure of an emission layer of the semiconductor laser device according to the first embodiment of the present invention.

As shown in FIG. 2, the emission layer 4 is constituted of a first light guide layer 4a of AlGaInP (Al composition ratio: 0.2) having a thickness of about 20 nm, an active layer having a multiple quantum well (MQW) structure obtained by alternately stacking three well layers 4b of AlGaInP (Al composition ratio: 0) (GaInP) each having a thickness of 8 nm and two barrier layers 4c of AlGaInP (Al composition ratio: 0.6) each having a thickness of 5 nm and a second light guide layer 4d of AlGaInP (Al composition ratio: 0.5) having a thickness of about 20 nm. Compression strain is introduced into the well layers 4b in order to reduce threshold current and improve laser characteristics. Further, tensile strain is introduced into the barrier layers 4c oppositely to the well layers 4b, so that the emission layer 4 including the MQW active layer has a strain compensatory structure. The p-type first cladding layer 5 has a thickness of about 0.25 μm, and consists of p-type AlGaInP (Al composition ratio: 0.7) doped with Zn by a dose of $1\times10^{18}$ cm$^{-3}$.

As shown in FIG. 1, a mesa (trapezoidal) ridge portion 12 and a pair of dummy ridge portions 13 constituted of p-type second cladding layers 6, intermediate layers 7 and contact layers 8 respectively are formed on the upper surface of the p-type first cladding layer 5. The dummy ridge portions 13 are examples of the "support portion(s)" in the present invention. The p-type second cladding layers 6 have a thickness of about 1.3 μm, and consist of p-type AlGaInP (Al composition ratio: 0.7) doped with Zn by a dose of $1\times10^{18}$ cm$^{-3}$. The intermediate layers 7 have a thickness of about 0.1 μm, and consist of p-type GaInP doped with Zn by a dose of $1\times10^{18}$ cm$^{-3}$. The contact layers 8 have a thickness of about 0.3 μm, and consist of p-type GaAs doped with Zn by a dose of $2\times10^{19}$ cm$^{-3}$. The ridge portion 12 is formed in a striped shape (elongated shape) having a bottom portion of about 2.5 μm in width and an upper portion of about 1.5 μm in width. The dummy ridge portions 13 are formed at an interval of about 50 μm from the ridge portion 12, to hold the ridge portion 12 therebetween.

Current blocking layers 9 prepared by stacking n-type AlInP layers, doped with Se, having a thickness of about 0.5 μm and n-type GaAs layers having a thickness of about 0.3 μm are formed to cover the upper surface of the p-type first cladding layer 5, both side surfaces of the ridge portion 12, the upper surfaces of the dummy ridge portions 13 and first side surfaces of the dummy ridge portions 13 facing the ridge portion 12. In other words, the upper surface of the ridge portion 12 and second side surfaces of the dummy ridge portions 13 opposite to the ridge portion 12 are covered with no current blocking layers 9.

According to the first embodiment, the current blocking layers 9 are formed not on the upper surface of the ridge portion 12 but on the upper surfaces of the dummy ridge portions 13, whereby the height of the upper surfaces of the dummy ridge portions 13 exceeds that of the upper surface of the ridge portion 12 by the thickness (=d) (about 0.8 μm) of the current blocking layers 9. A first p-side electrode 10 consisting of a Cr/Au layer, having a total thickness of about 3 μm, prepared by stacking a Cr layer and an Au layer successively from the side closer to the p-type first cladding layer 5 is formed to cover the exposed upper surface of the ridge portion 12 (contact layer 8) and the upper surfaces of the current blocking layers 9. The first p-side electrode 10 is formed in an irregular shape reflecting the shapes of the ridge portion 12, the dummy ridge portions 13 and the current blocking layers 9. Therefore, the height of portions 10b of the first p-side electrode 10 located on the dummy ridge portions 13 exceeds that of a portion 10a located on the ridge portion 12 by the thickness (=d) of the current blocking layers 9. The first p-side electrode 10 is an example of the "first metal electrode" in the present invention.

An n-side electrode 11 consisting of an Au—Ge/Au layer prepared by stacking an Au—Ge layer and an Au layer successively from the side closer to the n-type GaAs substrate 1 is formed on the back surface of the n-type GaAs substrate 1.

An impurity such as Zn is diffused into the ridge portion 12 and the dummy ridge portions 13 in the vicinity of cavity facets of the semiconductor laser device according to the first embodiment over the layers from the contact layer 8 to the emission layer 4 including the MQW active layer, thereby forming a window structure disordering the MQW active layer in the vicinity of the cavity facets. Further, the current blocking layers 9 are formed on the upper surface of the ridge portion 12 in the vicinity of the cavity facets constituting the aforementioned window structure, thereby forming non-injection structure for injecting no unnecessary current into the ridge portion 12 in the vicinity of the aforementioned cavity facets.

Figure 3:
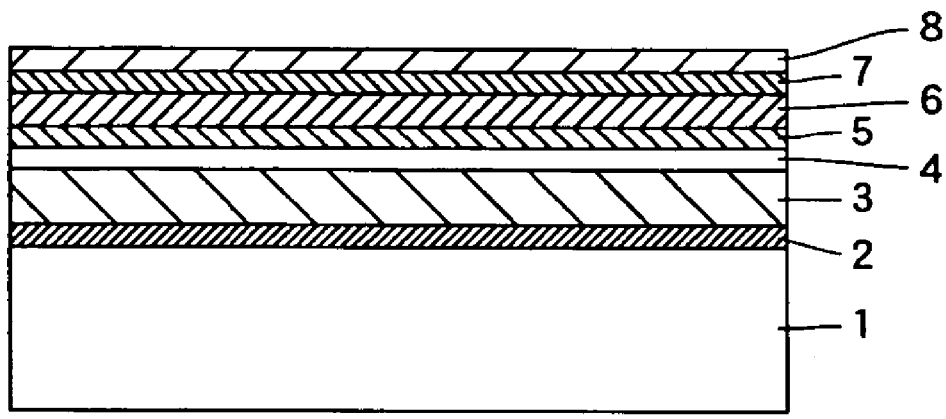
FIGS. 3 to 6 are sectional views for illustrating a process of fabricating the semiconductor laser device according to the first embodiment of the present invention.

A process of fabricating the semiconductor laser device according to the first embodiment of the present invention having the aforementioned structure is described with reference to FIGS. 1 to 6. As shown in FIG. 3, the semiconductor layers 2 to 8 are formed on the n-type GaAs substrate 1 inclined from the (100) plane by 9° in the [011] direction by MOVPE. More specifically, the n-type buffer layer 2 of n-type GaInP doped with Si is formed on the n-type GaAs substrate 1 with the thickness of about 0.3 μm. Thereafter the n-type cladding layer 3 of n-type AlGaInP doped with Si by the dose of $3\times10^{17}$ cm$^{-3}$ is formed on the n-type buffer layer 2 with the thickness of about 2 μm. Thereafter the emission layer 4 including the MQW active layer consisting of GaInP/AlGaInP is formed on the n-type cladding layer 3. The p-type first cladding layer 5 of p-type AlGaInP (Al composition ratio: 0.7) doped with Zn by the dose of $1\times10^{18}$ cm$^{-3}$ is formed on the emission layer 4 with the thickness of about 0.25 μm. Further, the p-type second cladding layers 6 of p-type AlGaInP (Al composition ratio: 0.7) doped with Zn by the dose of $1\times10^{18}$ cm$^{-3}$ are formed on the p-type first cladding layer 5 with the thickness of about 1.3 μm. Thereafter the intermediate layers 7 of p-type GaInP doped with Zn by the dose of $1\times10^{18}$ cm$^{-3}$ are formed on the p-type second cladding layers 6 with the thickness of about 0.1 μm. Then, the contact layers 8 of p-type GaAs doped with Zn by the dose of $2\times10^{19}$ cm$^{-3}$ are formed with the thickness of about 0.3 μm.

As shown in FIG. 2, the emission layer 4 is formed by successively stacking the first light guide layer 4a of AlGaInP (Al composition ratio: 0.2) having the thickness of about 20 nm, the active layer having the multiple quantum well (MQW) structure consisting of the three well layers 4b of AlGaInP (Al composition ratio: 0) (GaInP) each having the thickness of 8 nm and the two barrier layers 4c of AlGaInP (Al composition ratio: 0.6) each having the thickness of 5 nm and the second light guide layer 4d of AlGaInP (Al composition ratio: 0.5) having the thickness of about 20 nm.

Figure 4:
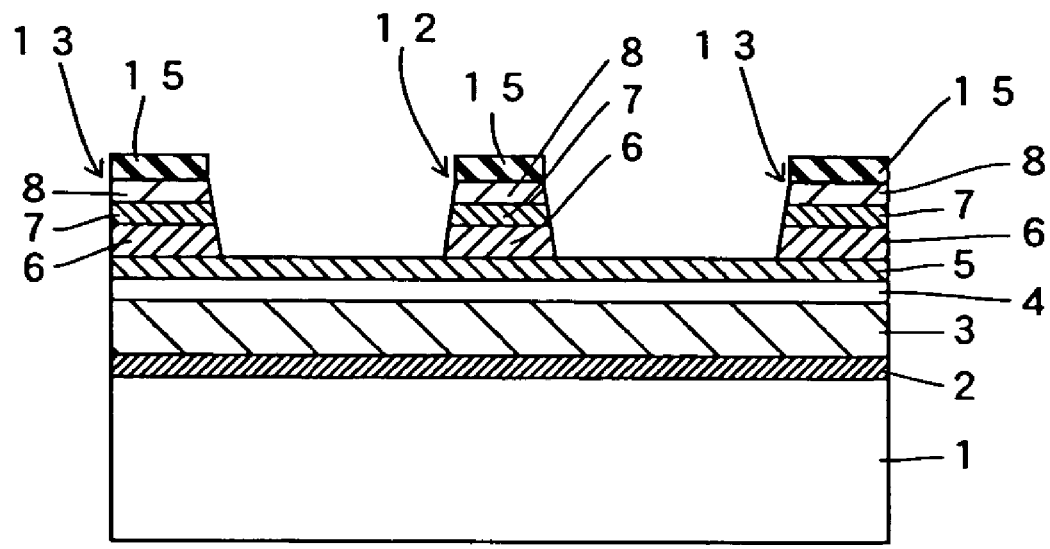

As shown in FIG. 4, $SiO_2$ layers 15 are formed on the contact layer 8 by photolithography and etching at prescribed intervals. The $SiO_2$ layers 15 are employed as masks for etching the p-type second cladding layers 6, the intermediate layers 7 and the contact layers 8 thereby forming the mesa (trapezoidal) ridge portion 12 and the dummy ridge portions 13. The ridge portion 12 is formed in the striped shape so that the bottom portion thereof has the width of about 2.5 μm.

Figure 5:
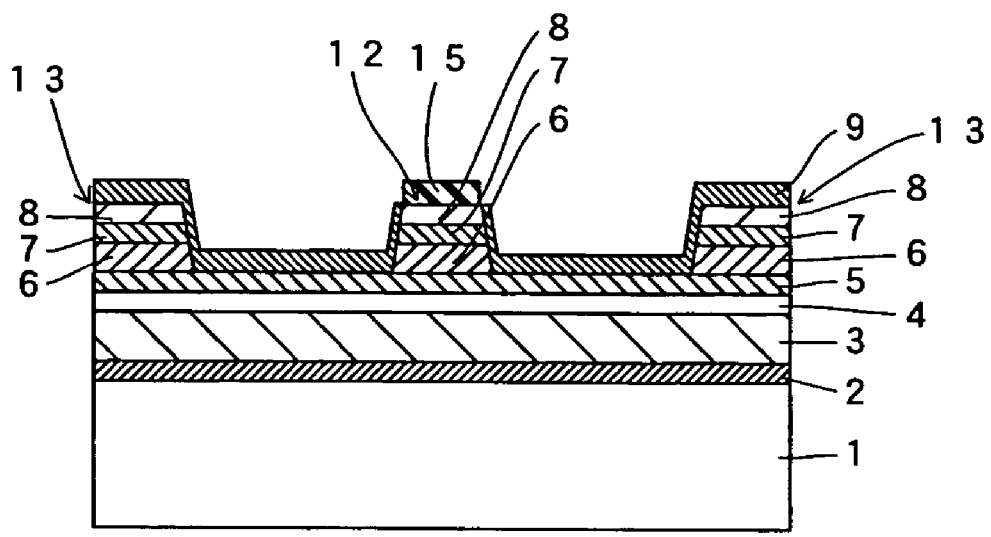

As shown in FIG. 5, the $SiO_2$ layers 15 formed on the dummy ridge portions 13 are removed while leaving only the $SiO_2$ layer 15 formed on the ridge portion 12. The $SiO_2$ layer 15 formed on the ridge portion 12 is employed as a mask for forming the n-type current blocking layers 9 consisting of the AlInP layers, doped with Se, having the thickness of about 0.5 μm and the n-type GaAs layers having the thickness of about 0.3 μm to cover the upper surface of the p-type first cladding layer 5, both side surfaces of the ridge portion 12, the upper surfaces of the dummy ridge portions 13 and the first side surfaces of the dummy ridge portions 13 facing the ridge portion 12. In other words, the upper surface of the ridge portion 12 and the second side surfaces of the dummy ridge portions 13 opposite to the ridge portion 12 are exposed from the current blocking layers 9.

Then, the mask of the SiO$_2$ layer 15 is removed from the ridge portion 12. Thereafter heat treatment is performed in a nitrogen atmosphere at 520° C. for 10 minutes, thereby converting the p-type first cladding layer 5, the p-type second cladding layers 6 and the intermediate layers 7 to the p types.

Figure 6:
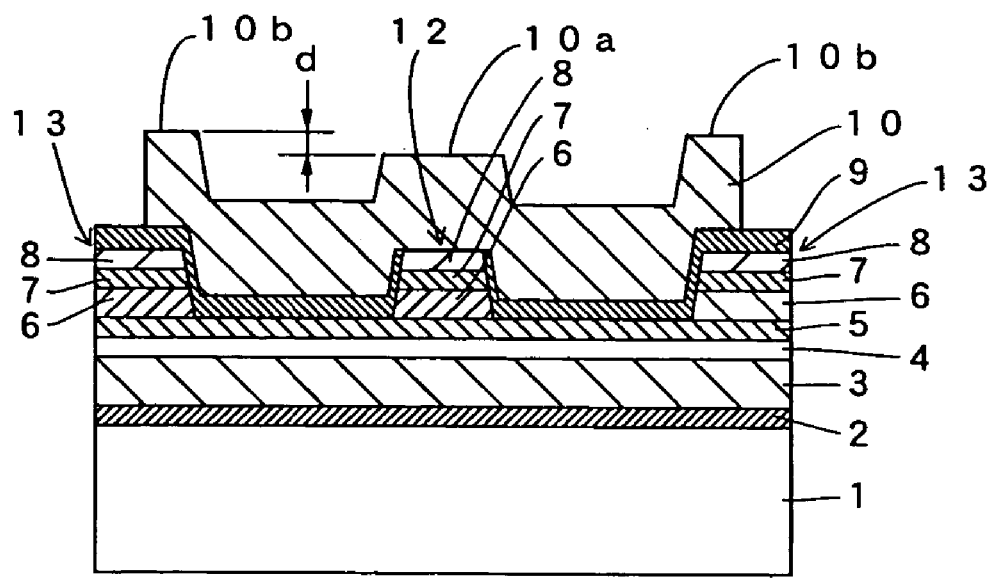

As shown in FIG. 6, the first p-side electrode 10 consisting of the Cr/Au layer, prepared by stacking the Cr layer and the Au layer successively from the side closer to the p-type first cladding layer 5, having the total thickness of about 3 μm is formed to cover the exposed upper surface of the ridge portion 12 and the upper surfaces of the current blocking layers 9. The first p-side electrode 10 is formed in the irregular shape reflecting the shapes of the ridge portion 12, the dummy ridge portions 13 and the current blocking layers 9, whereby the height of the portions 10b of the first p-side electrode 10 located on the dummy ridge portions 13 exceeds that of the portion 10a located on the ridge portion 12 by the thickness (=d) of the current blocking layers 9.

Thereafter the back surface of the n-type GaAs substrate 1 is etched so that the thickness of the n-type GaAs substrate 1 is about 100 μm, and the n-side electrode 11 consisting of the Au—Ge/Au layer prepared by stacking the Au—Ge layer and the Au layer successively from the side closer to the n-type GaAs substrate 1 is formed on the back surface of the n-type GaAs substrate 1, as shown in FIG. 1. Thereafter heat treatment is performed in H$_2$/N$_2$ ambient at 430° C. for 5 minutes, thereby attaining ohmic contact between the first p-side electrode 10 and the n-side electrode 11. The semiconductor laser device according to the first embodiment of the present invention is formed in the aforementioned manner.

Figure 7:
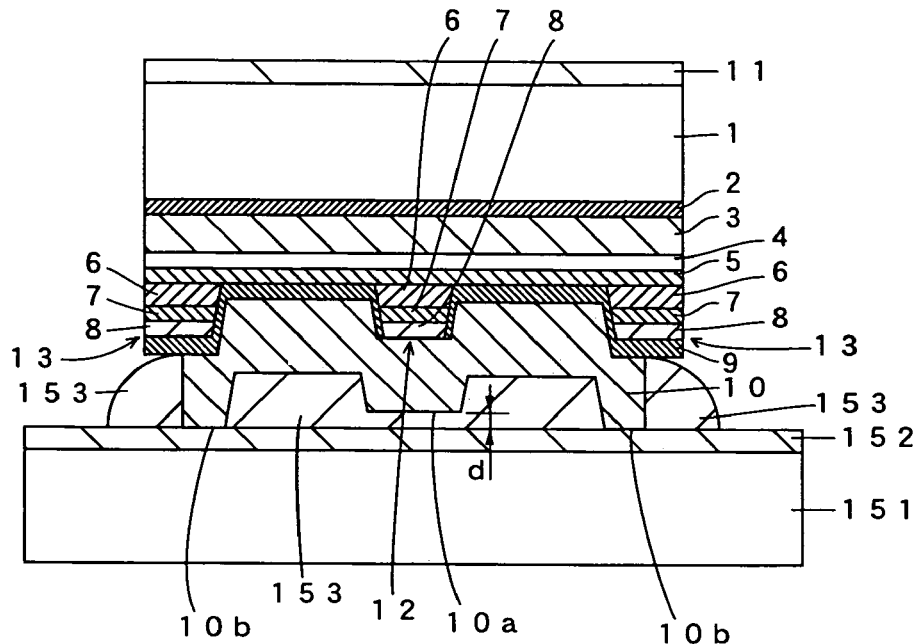
FIG. 7 is a sectional view illustrating the semiconductor laser device according to the first embodiment shown in FIG. 1 in a state mounted on a submount in a junction-down system.
Figure 8:
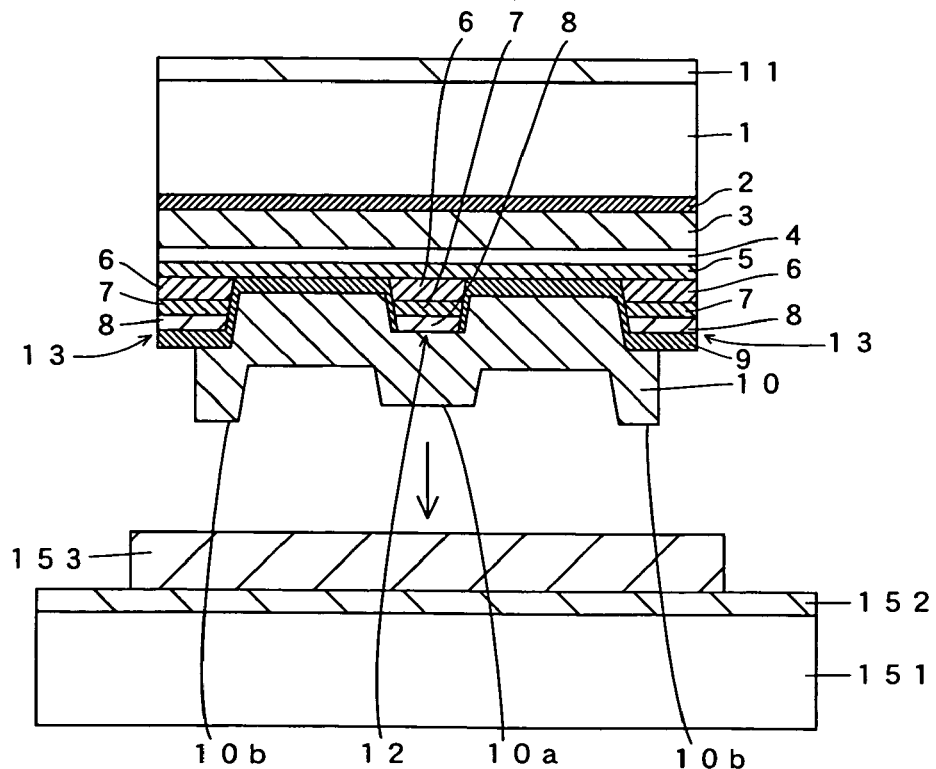
FIG. 8 is a sectional view for illustrating a method of mounting the semiconductor laser device according to the first embodiment shown in FIG. 1 on the submount in the junction-down system.

Referring to FIGS. 7 and 8, the semiconductor laser device according to the first embodiment is mounted on a metal film (electrode) 152 of a submount 151 through a welding material 153 of a low melting point metal such as solder while directing a projecting portion of the first p-side electrode 10 formed on the front surface of the semiconductor laser device downward. The height of the portions 10b of the first p-side electrode 10 located on the dummy ridge portions 13 exceeds that of the portion 10a located on the ridge portion 12 by the thickness (=d) of the current blocking layers 9, and hence a prescribed gap (=d) is defined between the metal film 152 of the submount 151 and the portion 10a of the first p-side electrode 10 formed on the ridge portion 12 when the aforementioned semiconductor laser device according to the first embodiment is mounted on the submount 151 in a junction-down system.

According to the first embodiment, as hereinabove described, the first p-side electrode 10 is so formed to be in contact with the upper surface of the ridge portion 12 that heat generated from the semiconductor laser device in a driven state can be more easily dissipated as compared with a case of forming a p-type cap layer 210 (see FIG. 50) of a semiconductor on the upper surface of the ridge portion 12. Thus, the semiconductor laser device can be inhibited from temperature rise in the driven state, whereby the reliability (lifetime) thereof can be improved. Further, no p-type cap layer 210 (see FIG. 50) of a semiconductor may be formed on the upper surfaces of the ridge portion 12 and the current blocking layers 9 dissimilarly to the conventional semiconductor laser device, whereby the number of steps of growing semiconductor layers by MOVPE can be reduced by one. Thus, the fabrication process can be simplified.

The dummy ridge portions 13 are so provided on both sides of the ridge portion 12 that the semiconductor laser device is not inclined when mounted on the submount 151 in the junction-down system. Thus, solder hardly reaches the side surfaces of the semiconductor laser device, whereby the p- and n-type semiconductor layers can be inhibited from a short. Thus, the fabrication yield and the reliability of the semiconductor laser device can be improved. Further, the height of the portions 10b of the first p-side electrode 10 located on the dummy ridge portions 13 exceeds that of the portion 10a located on the ridge portion 12 by the thickness (=d) of the current blocking layers 9, whereby the prescribed gap (=d) (see FIG. 7) can be defined between the submount 151 and the portion 10a of the first p-side electrode 10 formed on the ridge portion 12 when the semiconductor laser device is mounted on the submount 151. Thus, stress applied to the ridge portion 12 can be reduced when the semiconductor laser device is mounted on the submount 151 in the junction-down system as shown in FIGS. 7 and 8. Therefore, the semiconductor laser device can be inhibited from deterioration of the characteristics resulting from stress. Consequently, the reliability and the fabrication yield of the semiconductor laser device can be improved.

Second Embodiment

Figure 9:
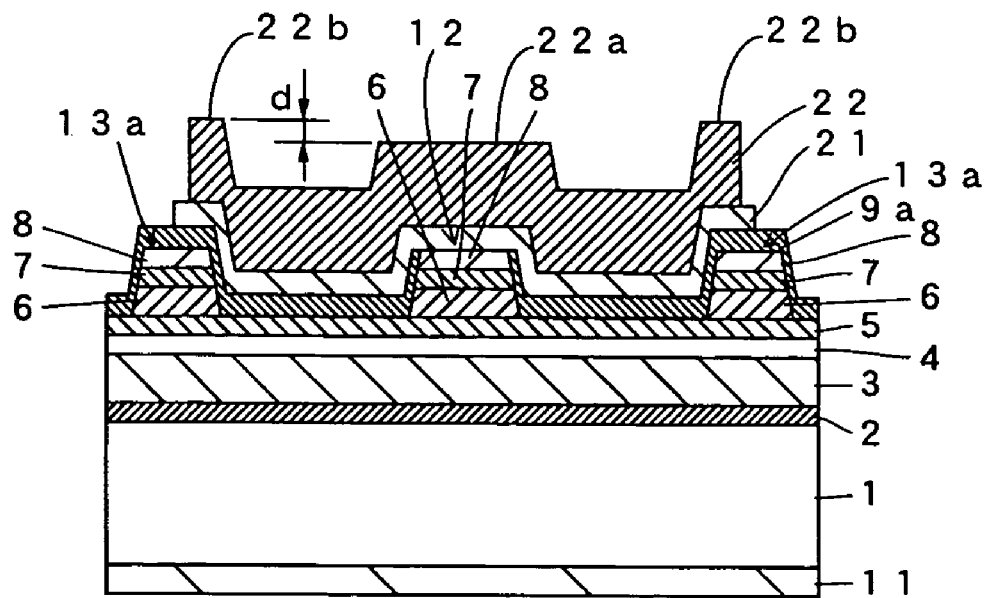
FIG. 9 is a sectional view for illustrating a semiconductor laser device according to a second embodiment of the present invention.

Referring to FIG. 9, p-side electrodes are provided in a two-layer structure while current blocking layers are formed on the upper surfaces and both side surfaces of dummy ridge portions in a semiconductor laser device according to a second embodiment of the present invention.

The structure of the semiconductor laser device according to the second embodiment of the present invention is described with reference to FIG. 9. In the semiconductor laser device according to the second embodiment, an n-type buffer layer 2, an n-type cladding layer 3, an emission layer 4 and a p-type first cladding layer 5 are successively formed on an n-type GaAs substrate 1, similarly to the semiconductor laser device according to the first embodiment shown in FIG. 1. A mesa (trapezoidal) ridge portion 12 and dummy ridge portions 13a constituted of p-type second cladding layers 6, intermediate layers 7 and contact layers 8 respectively are formed on the upper surface of the p-type first cladding layer 5. The dummy ridge portions 13a are examples of the "support portion(s)" in the present invention.

According to the second embodiment, the dummy ridge portions 13a are formed slightly inward beyond end portions of the n-type GaAs substrate 1. Thus, regions partially exposing the upper surface of the p-type first cladding layer 5 are formed between the dummy ridge portions 13a and the end portions of the n-type GaAs substrate 1. Current blocking layers 9a prepared by stacking n-type AlInP layers, doped with Se, having a thickness of about 0.5 μm and n-type GaAs layers having a thickness of about 0.3 μm are formed to cover the upper surface of the p-type first cladding layer 5, both side surfaces of the ridge portion 12 and the upper surfaces and both side surfaces of the dummy ridge portions 13a. The layers 2 to 8 of the semiconductor device according to the second embodiment are similar in composition and thickness to the layers 2 to 8 of the semiconductor laser device according to the first embodiment respectively.

According to the second embodiment, a first p-side electrode 21 consisting of a Cr/Au layer, having a total thickness of about 1 μm, prepared by stacking a Cr layer and an Au layer successively from the side closer to the p-type first cladding layer 5 and a second p-side electrode 22 consisting of a Pd/Au layer, having a total thickness of about 2 μm, prepared by stacking a Pd layer and an Au layer successively from the side closer to the first p-side electrode 21 are formed to cover the exposed upper surface of the ridge portion 12 and the upper surfaces of the current blocking layers 9a. The first and second p-side electrodes 21 and 22 are formed in irregular shapes reflecting the shapes of the ridge portion 12, the dummy ridge portions 13a and the current blocking layers 9a. Therefore, the height of portions 22b of the second p-side electrode 22 located on the dummy ridge portions 13a exceeds that of a portion 22a located on the ridge portion 12 by the thickness (=d) of the current blocking layers 9a. The first and second p-side electrodes 21 and 22 are examples of the "first metal electrode" in the present invention.

An n-side electrode 11 consisting of an Au—Ge/Au layer prepared by stacking an Au—Ge layer and an Au layer successively from the side closer to the n-type GaAs substrate 1 is formed on the back surface of the n-type GaAs substrate 1, similarly to the first embodiment. Thus, the semiconductor laser device according to the second embodiment is formed.

The semiconductor laser device according to the second embodiment is formed with a window structure disordering an MQW active layer in the vicinity of cavity facets, similarly to the first embodiment. Further, the current blocking layers 9a are formed on the upper surface of the ridge portion 12 in the vicinity of the cavity facets constituting the aforementioned window structure, thereby forming non-injection structure similarly to the first embodiment.

Figure 10:
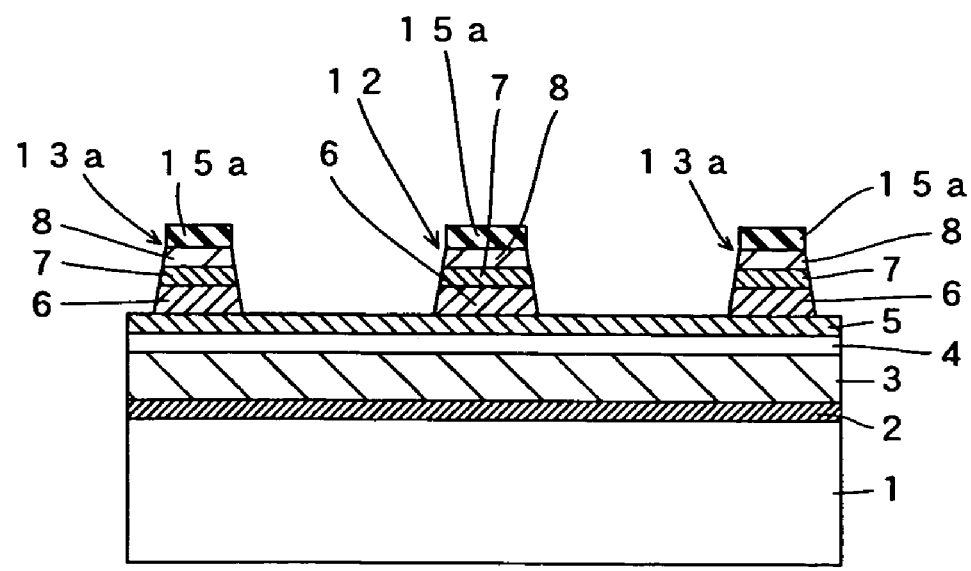
FIGS. 10 to 12 are sectional views for illustrating a process of fabricating the semiconductor laser device according to the second embodiment of the present invention.
Figure 11:
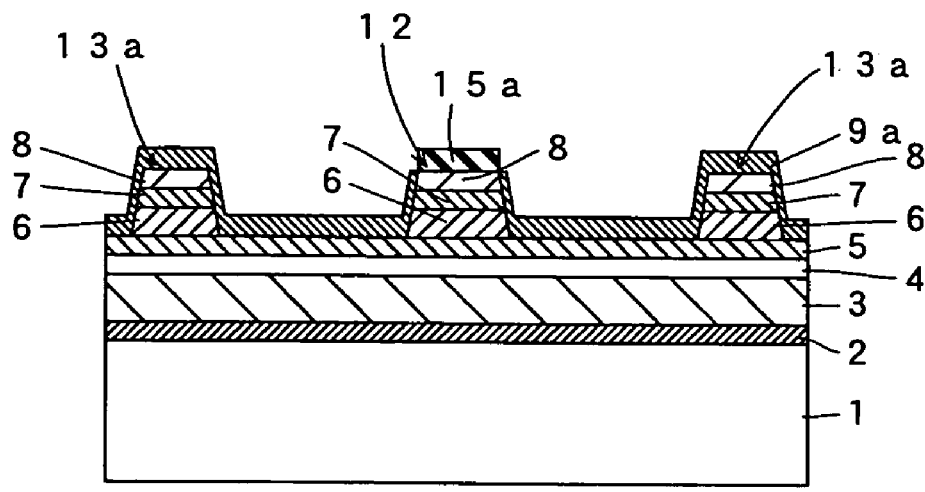
Figure 12:
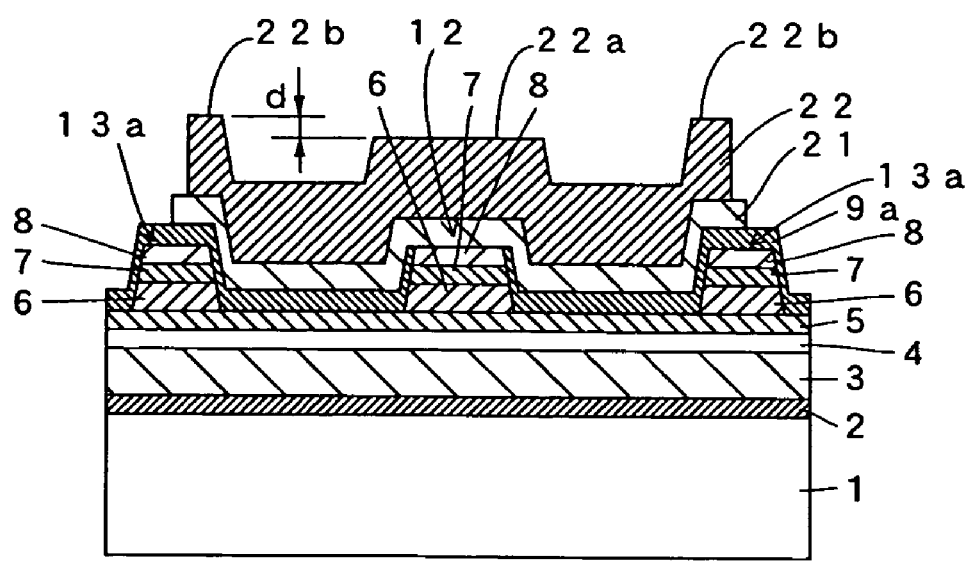

FIGS. 10 to 12 are sectional views for illustrating a process of fabricating the semiconductor laser device according to the second embodiment of the present invention. The process of fabricating the semiconductor laser device according to the second embodiment is described with reference to FIGS. 9 to 12. First, the n-type buffer layer 2, the n-type cladding layer 3, the emission layer 4, the p-type first cladding layer 5, the p-type second cladding layers 6, the intermediate layers 7 and the contact layers 8 are successively formed on the n-type GaAs substrate 1 through a fabrication step similar to that of the first embodiment shown in FIG. 3. As shown in FIG. 10, $SiO_2$ layers 15a are thereafter formed on the contact layer 8 by photolithography and etching at prescribed intervals. The $SiO_2$ layers 15a are employed as masks for etching the p-type second cladding layers 6, the intermediate layers 7 and the contact layers 8 thereby forming the mesa (trapezoidal) ridge portion 12 and the dummy ridge portions 13a. At this time, the dummy ridge portions 13a are formed slightly inward beyond the end portions of the n-type GaAs substrate 1, thereby forming the regions partially exposing the upper surface of the p-type first cladding layer 5 between the dummy ridge portions 13a and the end portions of the n-type GaAs substrate 1.

As shown in FIG. 11, the $SiO_2$ layers 15a are removed from the dummy ridge portions 13a while leaving only the central $SiO_2$ layer 15a on the ridge portion 12. The $SiO_2$ layer 15a left on the ridge portion 12 is employed as a mask for growing the current blocking layers 9a consisting of the n-type AlInP layers, doped with Se, having the thickness of about 0.5 μm and the n-type GaAs layers having the thickness of about 0.3 μm to cover the upper surface of the p-type first cladding layer 5, both side surfaces of the ridge portion 12 and the upper surfaces and both side surfaces of the dummy ridge portions 13a.

Then, the mask of the $SiO_2$ layer 15a left on the ridge portion 12 is removed. Thereafter heat treatment is performed in a nitrogen atmosphere at 520° C. for 10 minutes, thereby converting the p-type first and second cladding layers 5 and 6 and the intermediate layers 7 to the p types.

As shown in FIG. 12, the first p-side electrode 21 is formed by vacuum evaporation or the like to cover the exposed upper surface of the ridge portion 12 and the upper surfaces of the current blocking layers 9a. The second p-side electrode 22 consisting of the Pd/Au layer, having the total thickness of about 2 μm, prepared by stacking the Pd layer and the Au layer successively from the side closer to the first p-side electrode 21 is formed on the first p-side electrode 21. The first and second p-side electrodes 21 and 22 are formed in the irregular shapes reflecting the shapes of the ridge portion 12, the dummy ridge portions 13a and the current blocking layers 9a, whereby the height of the portions 22b of the second p-side electrode 22 located on the dummy ridge portions 13a exceeds that of the portion 22a located on the ridge portion 12 by the thickness (=d) of the current blocking layers 9a.

Thereafter the back surface of the n-type GaAs substrate 1 is etched for forming the n-side electrode 11 thereon as shown in FIG. 9. Thereafter heat treatment is performed in $H_2/N_2$ ambient at 430° C. for 5 minutes, thereby attaining ohmic contact between the first and second p-side electrodes 21 and 22 and the n-side electrode 11. The semiconductor laser device according to the second embodiment of the present invention is formed in the aforementioned manner.

Figure 13:
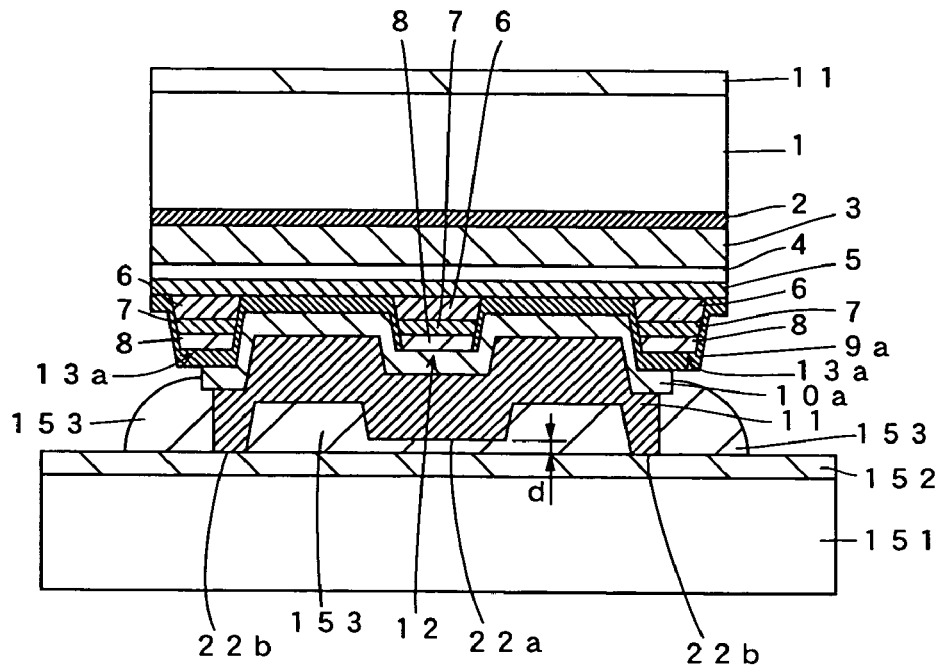
FIG. 13 is a sectional view illustrating the semiconductor laser device according to the second embodiment shown in FIG. 9 in a state mounted on a submount in a junction-down system.
Figure 14:
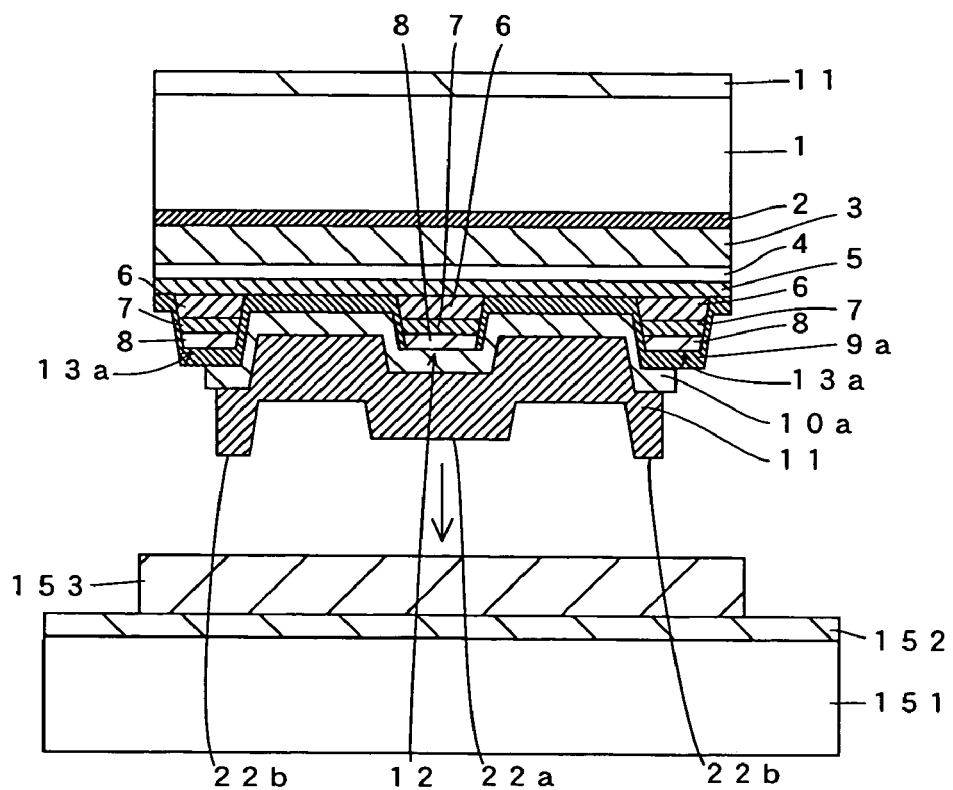
FIG. 14 is a sectional view for illustrating a method of mounting the semiconductor laser device according to the second embodiment shown in FIG. 9 on the submount in the junction-down system.

Referring to FIGS. 13 and 14, the semiconductor laser device according to the second embodiment of the present invention is mounted on a metal film (electrode) 152 of a submount 151 through a welding material 153 of a low melting point metal such as solder while directing a projecting portion of the second p-side electrode 22 formed on the front surface of the semiconductor laser device downward. The height of the portions 22b of the second p-side electrode 22 located on the dummy ridge portions 13a exceeds that of the portion 22a located on the ridge portion 12 by the thickness (=d) of the current blocking layers 9a, and hence a prescribed gap (=d) is defined between the submount 151 and the portion 22a of the second p-side electrode 22 formed on the ridge portion 12 when the aforementioned semiconductor laser device according to the second embodiment is mounted on the submount 151 in a junction-down system.

Figure 50:
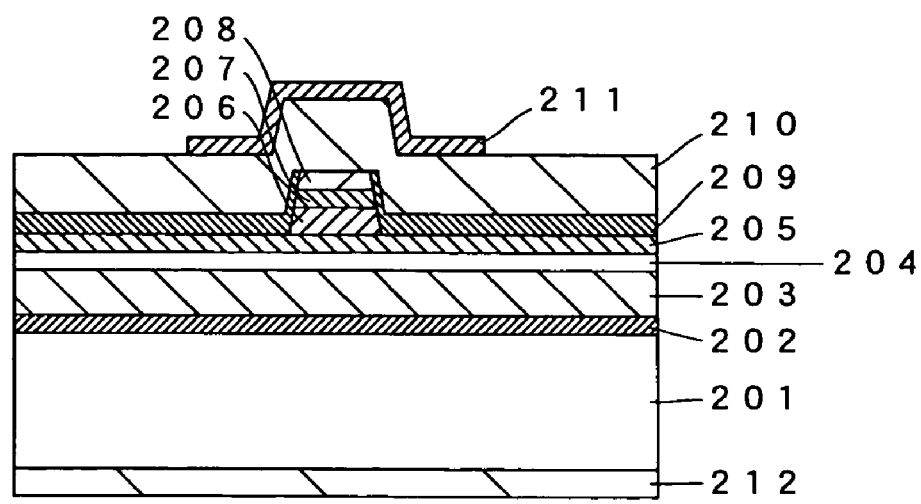
FIG. 50 is a sectional view for illustrating a conventional semiconductor laser device having a ridge portion.
Figure 51:
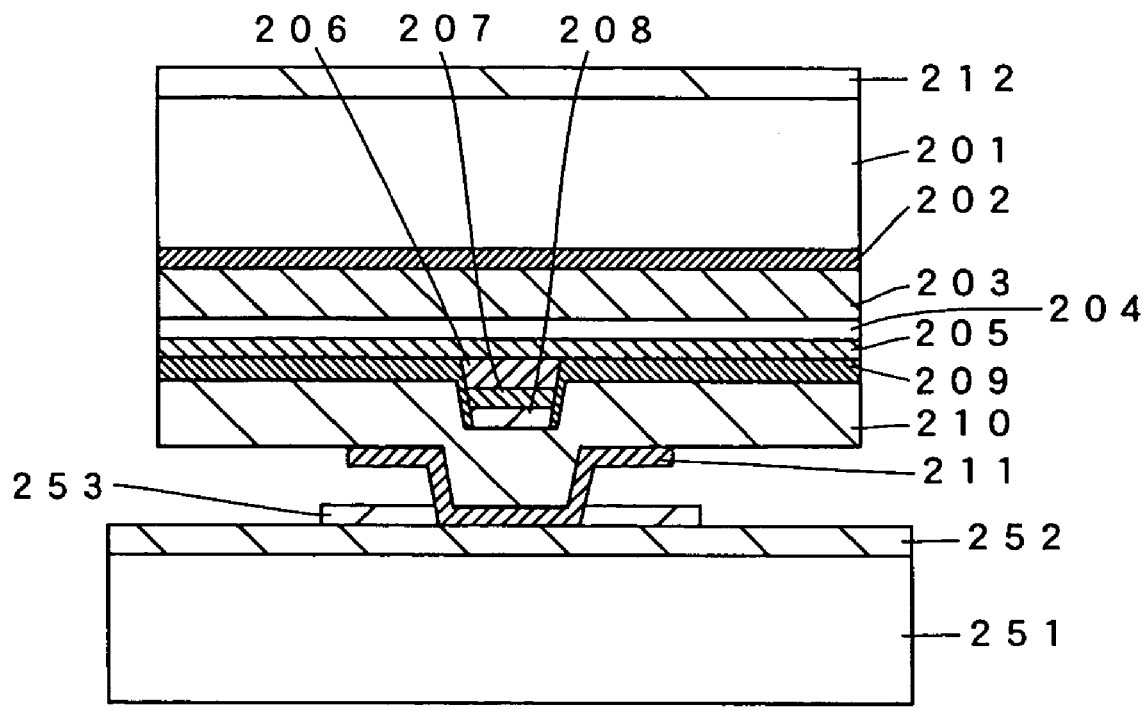
FIG. 51 is a sectional view illustrating the conventional semiconductor laser device shown in FIG. 50 in a state mounted on a submount in a junction-down system.

The operating characteristics of the semiconductor laser device according to the second embodiment and the conventional semiconductor laser device (comparative example) shown in FIG. 50 were evaluated. When a continuous-wave (CW) oscillation output at 70° C. was 50 mW, the conventional semiconductor laser device (comparative example) exhibited an operating current (Iop) of 107.9 mA, while the semiconductor laser device according to the second embodiment exhibited an operating current (Iop) of 88.4 mA, which was smaller by about 20%. Therefore, it has been proved that the semiconductor laser device according to the second embodiment can suppress increase of the operating current as compared with the conventional semiconductor laser device (comparative example). Thus, the quantity of heat generation resulting from increase of the operating current can be suppressed according to the second embodiment.

According to the second embodiment, as hereinabove described, the p-side electrodes are formed in the multilayer structure of the first and second p-side electrodes 21 and 22 to be easily increased in thickness, whereby stress applied to the ridge portion 12 can be controlled. Thus, the polarization ratio of a laser beam emitted from the semiconductor laser device can be controlled. In order to confirm this effect, influence exerted by a p-side electrode thickness on the optical output of the semiconductor laser device according to the second embodiment was evaluated.

Figure 15:
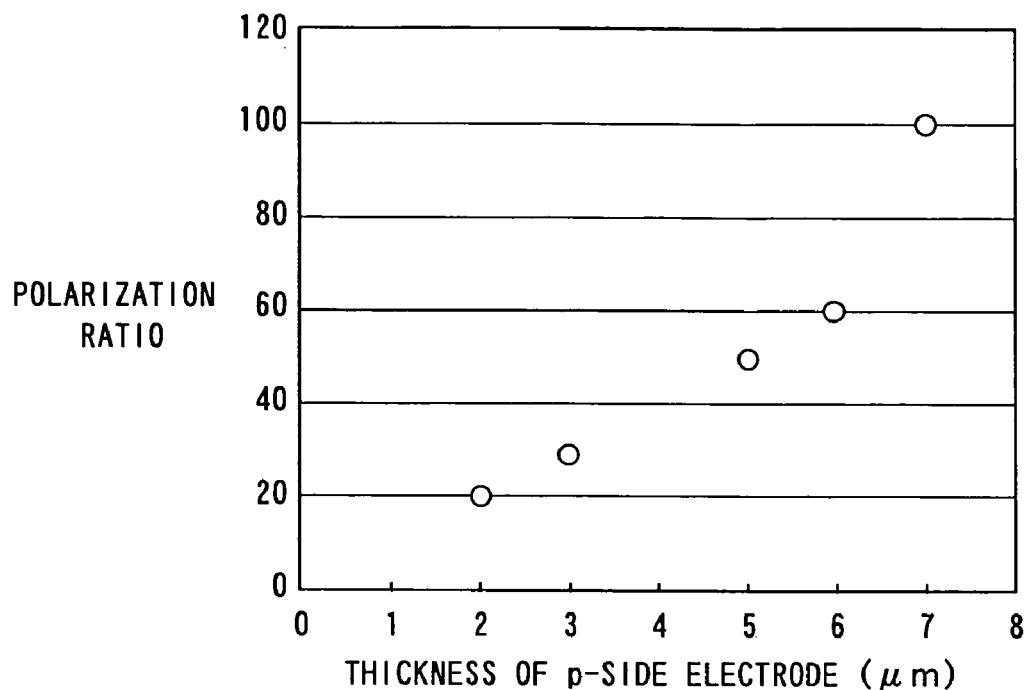
FIG. 15 is a characteristic diagram showing the relation between the thickness of a p-side electrode of the semiconductor laser device according to the second embodiment and a polarization ratio.

FIG. 15 shows the relation between the p-side electrode thickness and the polarization ratio of the semiconductor laser device according to the second embodiment of the present invention. In this case, the p-side electrode thickness corresponds to the sum of the thicknesses of the first and second p-side electrodes 21 and 22. Referring to FIG. 15, the polarization ratio tends to increase following increase of the p-side electrode thickness. Thus, it is understood that the polarization ratio is increased as the p-side electrode thickness is increased, suitably for recording in a recording-type optical disk. When the p-side electrode thickness was set to about 6 μm by stacking first and second p-side electrodes having thicknesses of about 1 μm and about 5 μm respectively with each other, for example, the polarization ratio was increased to 60. Thus, it has been recognized that a polarization ratio of at least 50 necessary for recording in a recording-type optical disk is obtained by setting the p-side electrode thickness to at least about 5 μm.

According to the second embodiment, as hereinabove described, the current blocking layers 9a are formed on the upper surfaces and both side surfaces of the dummy ridge portions 13a to cover the dummy ridge portions 13a so that no current flows to the dummy ridge portions 13a also when the welding material 153 of solder for mounting the semiconductor laser device on the submount 151 in the junction-down system adheres to the side surfaces of the dummy ridge portions 13a. Thus, the current fed to the semiconductor laser device flows only to the ridge portion 12, whereby the semiconductor laser device can attain high quantum efficiency.

According to the second embodiment, further, the dummy ridge portions 13a are formed slightly inward beyond the end portions of the n-type GaAs substrate 1 so that not the dummy ridge portions 13a but the current blocking layers 9a having upper surfaces parallel to the n-type GaAs substrate 1 are formed on the end portions of the n-type GaAs substrate 1. Thus, the welding material 153 of solder for mounting the semiconductor laser device on the submount 151 hardly reaches the p-type first cladding layer 5, the emission layer 4 and the n-type cladding layer 3 from the current blocking layers 9a on the end portions of the n-type GaAs substrate 1. Consequently, end portions of the p- and n-side semiconductor layers further hardly cause a short, whereby the reliability of the semiconductor laser device can be further improved.

Third Embodiment

Figure 16:
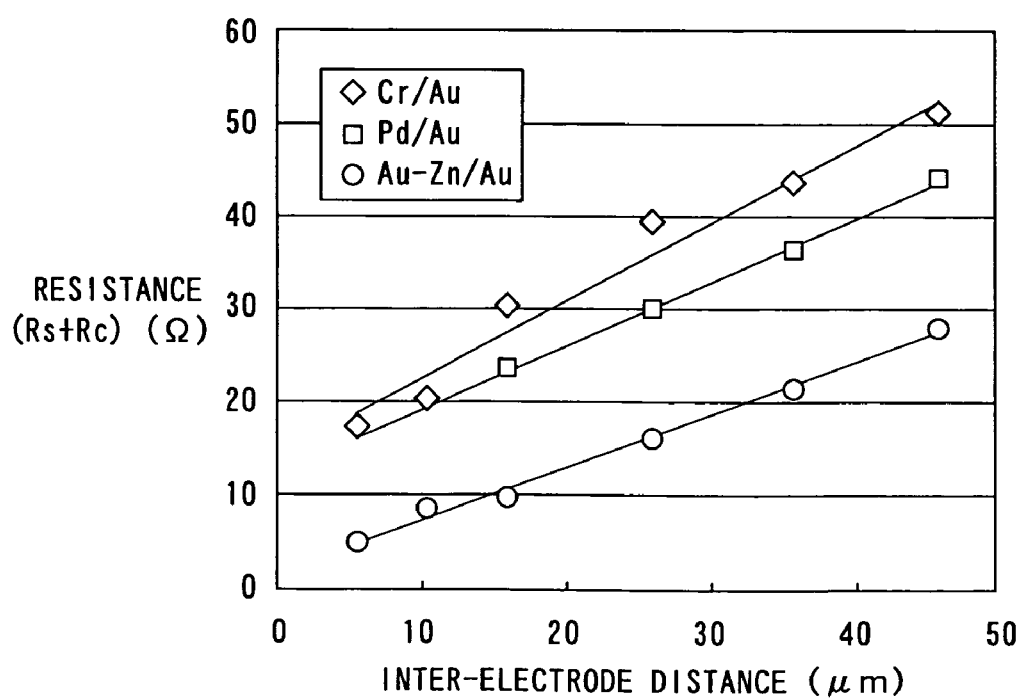
FIG. 16 is a characteristic diagram showing the relation between resistance between p-type GaAs layers doped with Zn and metal layers and inter-electrode distances.
Figure 17:
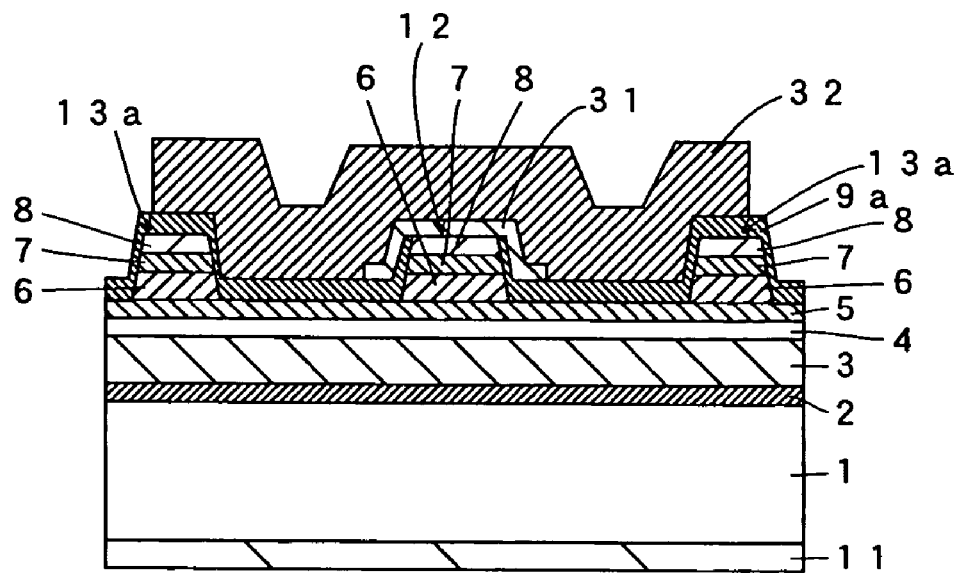
FIG. 17 is a sectional view for illustrating a semiconductor laser device according to a third embodiment of the present invention.

Referring to FIGS. 16 and 17, a semiconductor laser device according to a third embodiment of the present invention employs a first metal electrode containing a p-type dopant and a second metal electrode having higher adhesiveness than the first metal electrode.

FIG. 16 shows values of resistance between electrodes consisting of metal layers formed on p-type GaAs layers doped with Zn measured at various inter-electrode distances. The p-type GaAs layers and the metal layers were brought into ohmic contact with each other by performing heat treatment in $H_2/N_2$ ambient at 430° C. for 5 minutes after forming the metal layers on the p-type GaAs layers. Referring to FIG. 16, it is understood that the resistance between the p-type GaAs layer and an Au—Zn/Au layer formed by stacking an Au—Zn layer containing Zn, the dopant for the p-type GaAs layer, and an Au layer successively from the side closer to the p-type GaAs layer was smaller than that between the p-type GaAs layer and a Cr/Au layer formed by stacking a Cr layer and an Au layer successively from the side closer to the p-type GaAs layer and that between the p-type GaAs layer and a Pd/Au layer formed by stacking a Pd layer and an Au layer successively from the side closer to the p-type GaAs layer at any inter-electrode distance. Thus, it has been recognized that excellent ohmic constant can be attained with small contact resistance when a metal electrode contains a dopant (Zn) of the same conductivity type as a semiconductor layer (p-type GaAs layer). As a result of evaluation of adhesion strength to the p-type GaAs layers, it has also been recognized that the Au—Zn/Au layer exhibited weak adhesion strength with respect to the p-type GaAs layer with a possibility of separation, while the Cr—Au layer and the Pd/Au layer exhibited sufficient adhesion strength with respect to the p-type GaAs layers.

The structure of the semiconductor laser device according to the third embodiment of the present invention is described with reference to FIG. 17. Referring to FIG. 17, portions identical to those shown in FIG. 9 are denoted by the same reference numerals, and redundant description is not repeated. In the semiconductor laser device according to the third embodiment, an n-type buffer layer 2, an n-type cladding layer 3, an emission layer 4 and a p-type first cladding layer 5 are successively formed on an n-type GaAs substrate 1, similarly to the semiconductor laser device according to the second embodiment shown in FIG. 9. A mesa (trapezoidal) ridge portion 12 and dummy ridge portions 13a constituted of p-type second cladding layers 6, intermediate layers 7 and contact layers 8 respectively are formed on the upper surface of the p-type first cladding layer 5. Current blocking layers 9a prepared by stacking n-type AlInP layers, doped with Se, having a thickness of about 0.5 μm and n-type GaAs layers having a thickness of about 0.3 μm are formed to cover the upper surface of the p-type first cladding layer 5, both side surfaces of the ridge portion 12 and the upper surfaces and both side surfaces of the dummy ridge portions 13a. The layers 2 to 8 of the semiconductor laser device according to the third embodiment are similar in composition and thickness to the layers 2 to 8 of the semiconductor laser device according to the second embodiment respectively.

According to the third embodiment, a first p-side electrode 31 consisting of an Au—Zn/Au layer, having a thickness of about 1 μm, prepared by successively stacking an Au—Zn layer and an Au layer is formed on the upper surfaces of the ridge portion 12 and the current blocking layers 9a to cover the exposed upper surface of the ridge portion 12. Further, a second p-side electrode 32 consisting of a Cr/Au layer, having a total thickness of about 5 μm, prepared by forming a Cr layer and an Au layer successively from the side closer to the p-type first cladding layer 5 is formed on the upper surfaces of the current blocking layers 9a, the upper surface and both side surfaces of the first p-side electrode 31 and the upper surfaces and both side surfaces of the dummy ridge portions 13a to cover the first p-side electrode 31. The first p-side electrode 31 is an example of the "first metal electrode" in the present invention, and the second p-side electrode 32 is an example of the "second metal electrode" in the present invention. Further, Zn is an example of the "dopant having the same conductivity type as said semiconductor layer constituting said ridge portion" in the present invention.

An n-side electrode 11 consisting of an Au—Ge/Au layer prepared by stacking an Au—Ge layer and an Au layer successively from the side closer to the n-type GaAs substrate 1 is formed on the back surface of the n-type GaAs substrate 1, similarly to the second embodiment. Thus, the semiconductor laser device according to the third embodiment is formed.

The semiconductor laser device according to the third embodiment is formed with a window structure (not shown) disordering an MQW active layer in the vicinity of cavity facets, similarly to the first embodiment. Further, the current blocking layers 9a are formed on the upper surface of the ridge portion 12 in the vicinity of the cavity facets constituting the aforementioned window structure thereby forming non-injection structure, similarly to the first embodiment.

A process of fabricating the semiconductor laser device according to the third embodiment is now described. First, the layers up to the current blocking layers 9a are formed through steps similar to those of the second embodiment shown in FIGS. 10 and 11, and a mask of a central $SiO_2$ layer 15a (see FIG. 11) is removed from the ridge portion 12. Thereafter heat treatment is performed in a nitrogen atmosphere at 520° C. for 10 minutes, thereby converting the p-type first and second cladding layers 5 and 6 and the intermediate layers 7 to the p types.

Thereafter the first p-side electrode 31 consisting of the Au—Zn/Au layer, having the thickness of about 1 μm, prepared by successively stacking the Au—Zn layer and the Au layer is formed on the upper surfaces of the ridge portion 12 and the current blocking layers 9a by vacuum evaporation or the like to cover the exposed upper surface of the ridge portion 12, and thereafter patterned to remain only in the vicinity of the ridge portion 12. Further, the second p-side electrode 32 consisting of the Cr/Au layer, having the total thickness of about 5 μm, prepared by forming the Cr layer and the Au layer successively from the side closer to the p-type first cladding layer 5 is formed on the upper surfaces of the current blocking layers 9a, the upper surface and both side surfaces of the first p-side electrode 31 and the upper surfaces and both side surfaces of the dummy ridge portions 13a to cover the first p-side electrode 31.

Similarly to the second embodiment, the back surface of the n-type GaAs substrate 1 is etched for thereafter forming the n-side electrode 11 on this back surface. Thereafter heat treatment is performed in $H_2/N_2$ ambient at 430° C. for 5 minutes, thereby attaining ohmic contact between the first and second p-side electrodes 31 and 32 and the n-side electrode 11. The semiconductor laser device according to the third embodiment of the present invention is formed in the aforementioned manner.

According to the third embodiment, the first p-side electrode 31 contains Zn of the same conductivity type as the contact layers 8, whereby contact resistance between the first p-side electrode 31 and the contact layers 8 is so reduced that excellent ohmic contact can be attained. Thus, the semiconductor laser device can be further inhibited from heat generation in operation. Further, the p-side electrode 32 having high adhesiveness is formed to cover the first p-side electrode 31 and the current blocking layers 9a having small adhesiveness to the contact layers 8, whereby the first p-side electrode 31 can be inhibited from separation. Thus, the semiconductor laser device can be improved in reliability.

Fourth Embodiment

Figure 18:
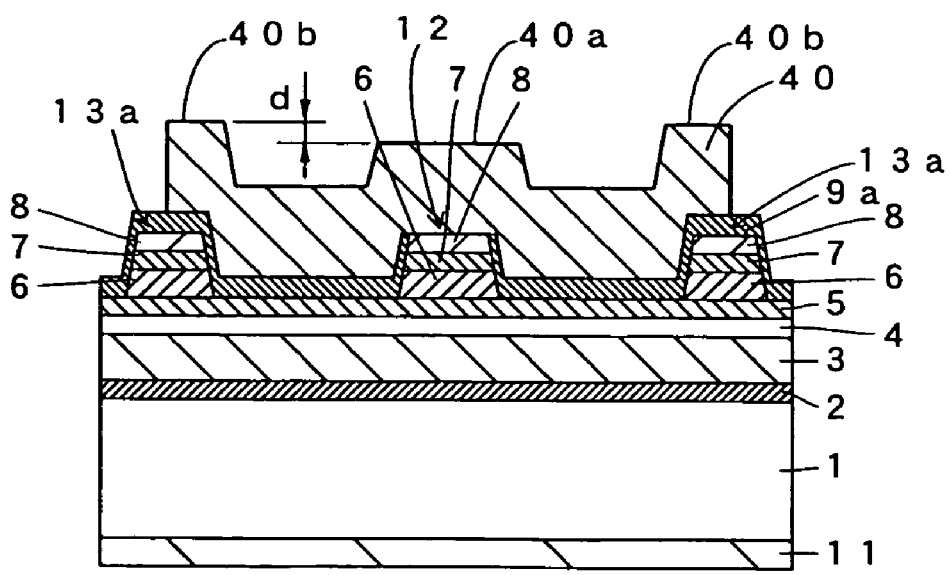
FIG. 18 is a sectional view for illustrating a semiconductor laser device according to a fourth embodiment of the present invention.

Referring to FIG. 18, a semiconductor laser device according to a fourth embodiment of the present invention has a one-layer first p-side electrode in a structure similar to that of the aforementioned semiconductor laser device according to the second embodiment. The remaining structure of the fourth embodiment is similar to that of the aforementioned second embodiment.

The structure of the semiconductor laser device according to the fourth embodiment is described with reference to FIG. 18. In the semiconductor laser device according to the fourth embodiment, an n-type buffer layer 2, an n-type cladding layer 3, an emission layer 4 and a p-type first cladding layer 5 are successively formed on an n-type GaAs substrate 1, similarly to the semiconductor laser device according to the second embodiment shown in FIG. 9. A mesa (trapezoidal) ridge portion 12 and dummy ridge portions 13a constituted of p-type second cladding layers 6, intermediate layers 7 and contact layers 8 respectively are formed on the upper surface of the p-type first cladding layer 5.

According to the fourth embodiment, the dummy ridge portions 13a are formed slightly inward beyond end portions of the n-type GaAs substrate 1, similarly to the second embodiment. Thus, regions partially exposing the upper surface of the p-type first cladding layer 5 are formed between the dummy ridge portions 13a and the end portions of the n-type GaAs substrate 1. Current blocking layers 9a prepared by stacking n-type AlInP layers, doped with Se, having a thickness of about 0.5 μm and n-type GaAs layers having a thickness of about 0.3 μm are formed to cover the upper surface of the p-type first cladding layer 5, both side surfaces of the ridge portion 12 and the upper surfaces and both side surfaces of the dummy ridge portions 13a. The layers 2 to 8 of the semiconductor device according to the fourth embodiment are similar in composition and thickness to the layers 2 to 8 of the semiconductor laser device according to the second embodiment respectively.

According to the fourth embodiment, a first p-side electrode 40 consisting of a Cr/Au layer, having a total thickness of about 3 μm, prepared by stacking a Cr layer and an Au layer successively from the side closer to the p-type first cladding layer 5 is formed to cover the exposed upper surface of the ridge portion 12 and the upper surfaces of the current blocking layers 9a. The first p-side electrode 40 is formed in an irregular shape reflecting the shapes of the ridge portion 12, the dummy ridge portions 13a and the current blocking layers 9a. Therefore, the height of portions 40b of the first p-side electrode 40 located on the dummy ridge portions 13a exceeds that of a portion 40a located on the ridge portion 12 by the thickness (=d) of the current blocking layers 9a. The first p-side electrode 40 is an example of the "first metal electrode" in the present invention.

An n-side electrode 11 consisting of an Au—Ge/Au layer prepared by stacking an Au—Ge layer and an Au layer successively from the side closer to the n-type GaAs substrate 1 is formed on the back surface of the n-type GaAs substrate 1, similarly to the second embodiment. Thus, the semiconductor laser device according to the fourth embodiment is formed.

The semiconductor laser device according to the fourth embodiment is fabricated through a process similar to that for fabricating the aforementioned semiconductor laser device according to the second embodiment except a step of fabricating the first p-side electrode 40. The first p-side electrode 40 consisting of the Cr/Au layer, having the total thickness of about 3 μm, prepared by stacking the Cr layer and the Au layer successively from the side closer to the p-type first cladding layer 5 is formed by vacuum evaporation or the like to cover the exposed upper surface of the ridge portion 12 and the upper surfaces of the current blocking layers 9a. In this case, the first p-side electrode 40 is formed in the irregular shape reflecting the shapes of the ridge portion 12, the dummy ridge portions 13a and the current blocking layers 9a, whereby the height of the portions 40b of the first p-side electrode 40 located on the dummy ridge portions 13a exceeds that of the portion 40a located on the ridge portion 12 by the thickness (=d) of the current blocking layers 9a.

Figure 19:
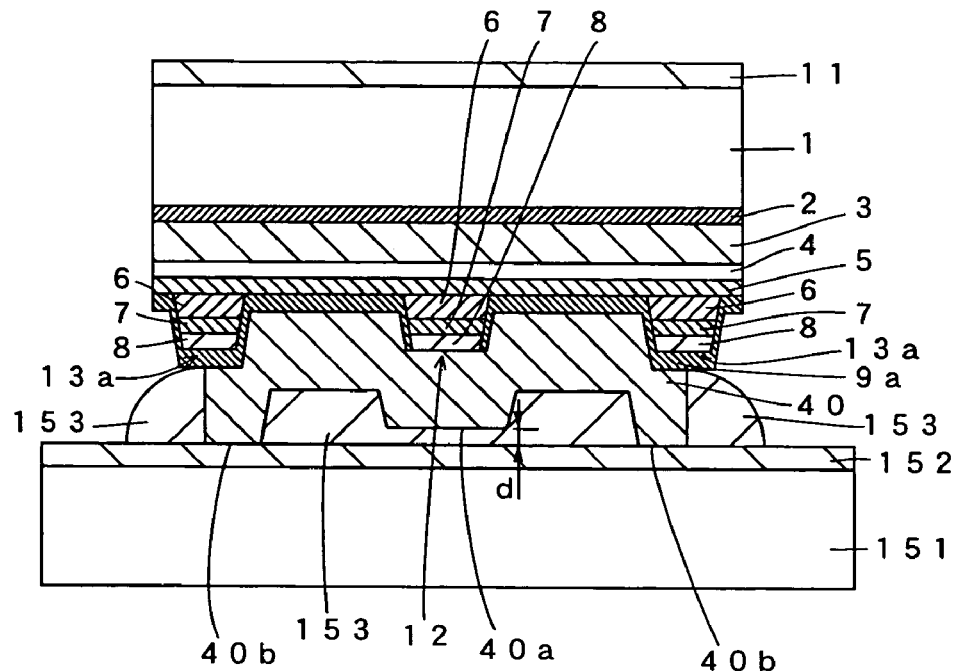
FIG. 19 is a sectional view illustrating the semiconductor laser device according to the fourth embodiment shown in FIG. 18 in a state mounted on a submount in a junction-down system.
Figure 20:
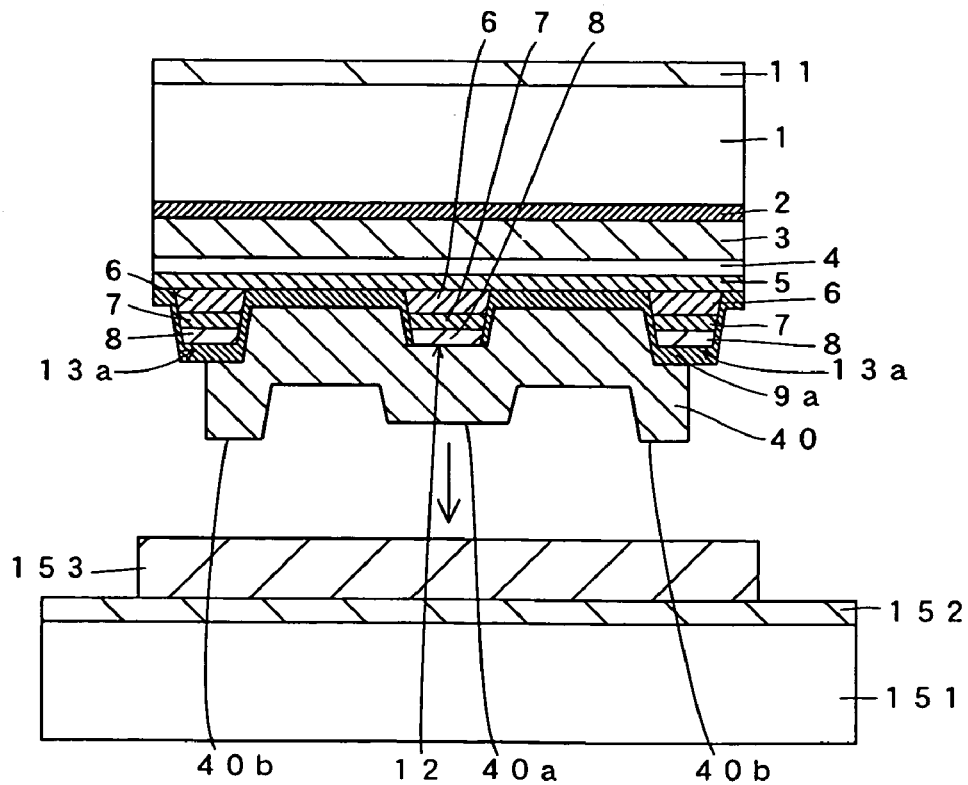
FIG. 20 is a sectional view for illustrating a method of mounting the semiconductor laser device according to the fourth embodiment shown in FIG. 18 on the submount in the junction-down system.

Referring to FIGS. 19 and 20, the semiconductor laser device according to the fourth embodiment is mounted on a metal film (electrode) 152 of a submount 151 through a welding material 153 of a low melting point metal such as solder while directing a projecting portion of the first p-side electrode 40 formed on the front surface of the semiconductor laser device downward. The height of the portions 40b of the first p-side electrode 40 located on the dummy ridge portions 13a exceeds that of the portion 40a located on the ridge portion 12 by the thickness (=d) of the current blocking layers 9a, and hence a prescribed gap (=d) is defined between the submount 151 and the portion 40a of the first p-side electrode 40 formed on the ridge portion 12 when the aforementioned semiconductor laser device according to the fourth embodiment is mounted on the submount 151 in a junction-down system. Thus, stress applied to the ridge portion 12 can be reduced.

According to the fourth embodiment, the current blocking layers 9a are formed on the upper surfaces and both side surfaces of the dummy ridge portions 13a similarly to the aforementioned second embodiment so that no current flows to the dummy ridge portions 13a also when the welding material 153 of solder or the like for mounting the semiconductor laser device on the submount 151 in the junction-down system adheres to the side surfaces of the dummy ridge portions 13a. Thus, the current fed to the semiconductor laser device flows only to the ridge portion 12, whereby the semiconductor laser device can attain high quantum efficiency.

According to the fourth embodiment, further, the dummy ridge portions 13a are formed slightly inward beyond the end portions of the n-type GaAs substrate 1 similarly to the aforementioned second embodiment so that not the dummy ridge portions 13a but the current blocking layers 9a having upper surfaces parallel to the n-type GaAs substrate 1 are formed on the end portions of the n-type GaAs substrate 1. Thus, the welding material 153 of solder for mounting the semiconductor laser device on the submount 151 hardly reaches the p-type first cladding layer 5, the emission layer 4 and the n-type cladding layer 3 from the current blocking layers 9a on the end potions of the n-type GaAs substrate 1. Consequently, end portions of the p- and n-side semiconductor layers further hardly cause a short, whereby the reliability of the semiconductor laser device can be further improved.

The remaining effects of the fourth embodiment are similar to those of the aforementioned second embodiment.

Fifth Embodiment

Figure 21:
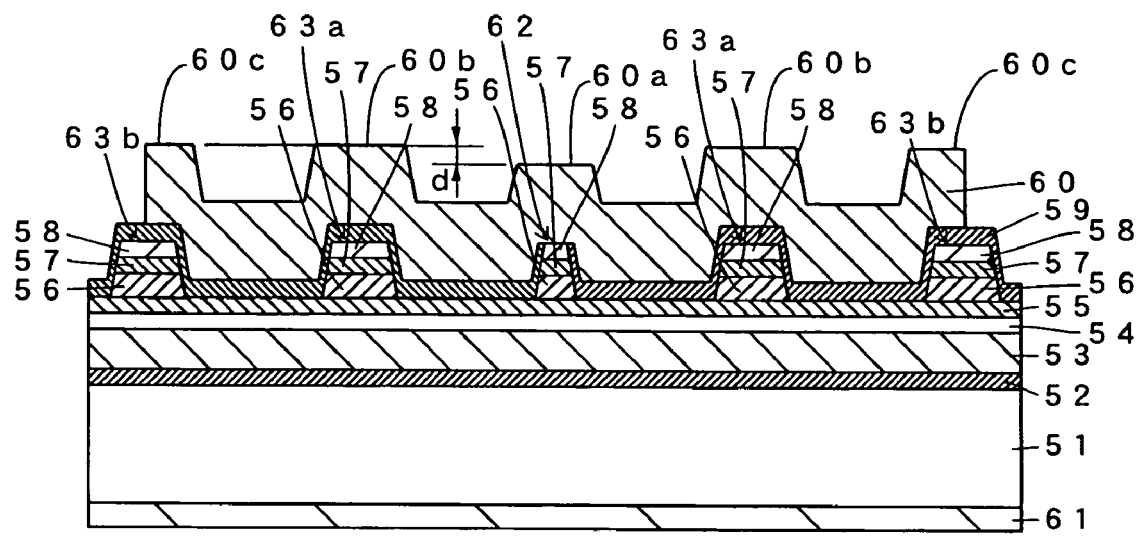
FIG. 21 is a sectional view for illustrating a semiconductor laser device according to a fifth embodiment of the present invention.

Referring to FIG. 21, a semiconductor laser device according to a fifth embodiment of the present invention is provided with a plurality of (two) dummy ridge portions on each side of a ridge portion in a structure similar to that of the aforementioned semiconductor laser device according to the fourth embodiment.

The structure of the semiconductor laser device according to the fifth embodiment is described with reference to FIG. 21. In the semiconductor laser device according to the fifth embodiment, an n-type buffer layer 52, an n-type cladding layer 53, an emission layer 54 and a p-type first cladding layer 55 are successively formed on an n-type GaAs substrate 51. A mesa (trapezoidal) ridge portion 62 having a width (lower end width) of about 2.5 µm and mesa (trapezoidal) dummy ridge portions 63a and 63b having a width (lower end width) of about 30 µm are formed on the upper surface of the p-type first cladding layer 55. The dummy ridge portions 63a and 63b are examples of the "support portion(s)" in the present invention. The ridge portion 62 and the dummy ridge portions 63a and 63b are constituted of p-type second cladding layers 56, intermediate layers 57 and contact layers 58 respectively.

According to the fifth embodiment, two dummy ridge portions 63a and 63b are formed on each side of the ridge portion 62. The center distance between the ridge portion 62 and the inner dummy ridge portion 63a closer to the ridge portion 62 is about 70 µm, and that between the ridge portion 62 and the outer dummy ridge portion 63b is about 120 µm. The chip width (width of the n-type GaAs substrate 51 shown in FIG. 21) is about 300 µm. The outer dummy ridge portion 63b is formed slightly inward beyond an end portion of the n-type GaAs substrate 51. Thus, a region partially exposing the upper surface of the p-type first cladding layer 55 is formed between the outer dummy ridge portion 63b and the end portion of the n-type GaAs substrate 51. Current blocking layers 59 prepared by stacking n-type AlInP layers, doped with Se, having a thickness of about 0.5 µm and n-type GaAs layers having a thickness of about 0.3 µm are formed to cover the upper surface of the p-type first cladding layer 55, both side surfaces of the ridge portion 62 and the upper surfaces and both side surfaces of the dummy ridge portions 63a and 63b. The layers 52 to 58 of the semiconductor laser device according to the fifth embodiment are similar in composition and thickness to the layers 2 to 8 of the semiconductor laser device according to the first embodiment respectively.

According to the fifth embodiment, a first p-side electrode 60 consisting of a Cr/Au layer, having a total thickness of about 3 µm, prepared by stacking a Cr layer and an Au layer successively from the side closer to the p-type first cladding layer 55 is formed to cover the exposed upper surface of the ridge portion 62 and the upper surfaces of the current blocking layers 59. The first p-side electrode 60 is formed in an irregular shape reflecting the shapes of the ridge portion 62, the dummy ridge portions 63a and 63b and the current blocking layers 59. Therefore, the height of portions 60b and 60c of the first p-side electrode 60 located on the dummy ridge portions 63a and 63b exceeds that of a portion 60a located on the ridge portion 62 by the thickness (=d) of the current blocking layers 59. The first p-side electrode 60 is an example of the "first metal electrode" in the present invention.

An n-side electrode 61 consisting of an Au—Ge/Au layer prepared by stacking an Au—Ge layer and an Au layer successively from the side closer to the n-type GaAs substrate 51 is formed on the back surface of the n-type GaAs substrate 51. Thus, the semiconductor laser device according to the fifth embodiment is formed.

Figure 22:
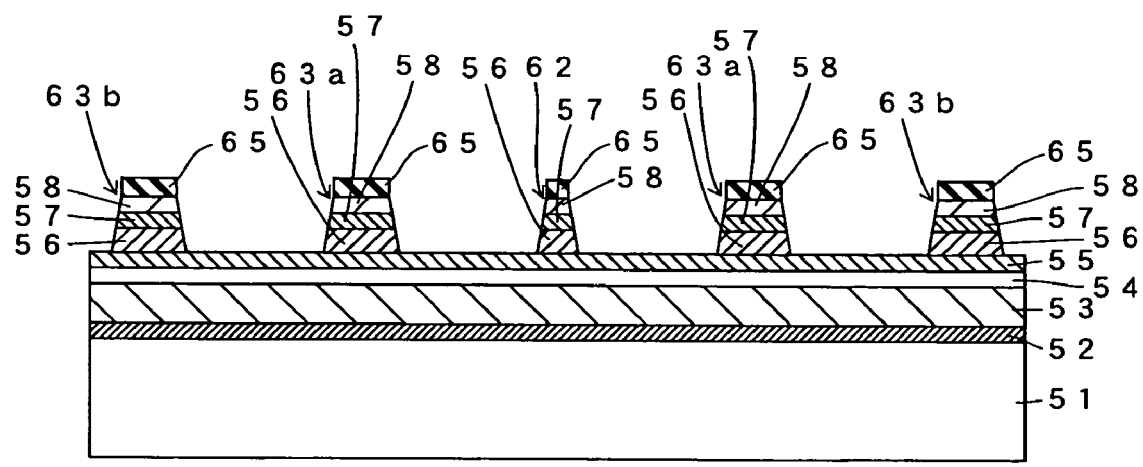
FIGS. 22 to 24 are sectional views for illustrating a process of fabricating the semiconductor laser device according to the fifth embodiment of the present invention.

A process of fabricating the semiconductor laser device according to the fifth embodiment is described with reference to FIGS. 21 to 24. The n-type buffer layer 52, the n-type cladding layer 53, the emission layer 54, the p-type first cladding layer 55, the p-type second cladding layers 56, the intermediate layers 57 and the contact layers 58 are successively formed on the n-type GaAs substrate 51 through a step similar to that of the first embodiment shown in FIG. 3. Thereafter $SiO_2$ layers 65 are formed on the contact layers 58 by photolithography and etching at prescribed intervals, as shown in FIG. 22. The SiO$_2$ layers 65 are employed as masks for etching the p-type second cladding layers 56, the intermediate layers 57 and the contact layers 58, thereby forming the mesa (trapezoidal) ridge portion 62 and the mesa (trapezoidal) inner and outer dummy ridge portions 63a and 63b. At this time, the outer dummy ridge portions 63b are formed slightly inward beyond the end portions of the n-type GaAs substrate 51, thereby forming the regions partially exposing the upper surface of the p-type cladding layer 55 between the dummy ridge portions 63b and the end portions of the n-type GaAs substrate 51.

Figure 23:
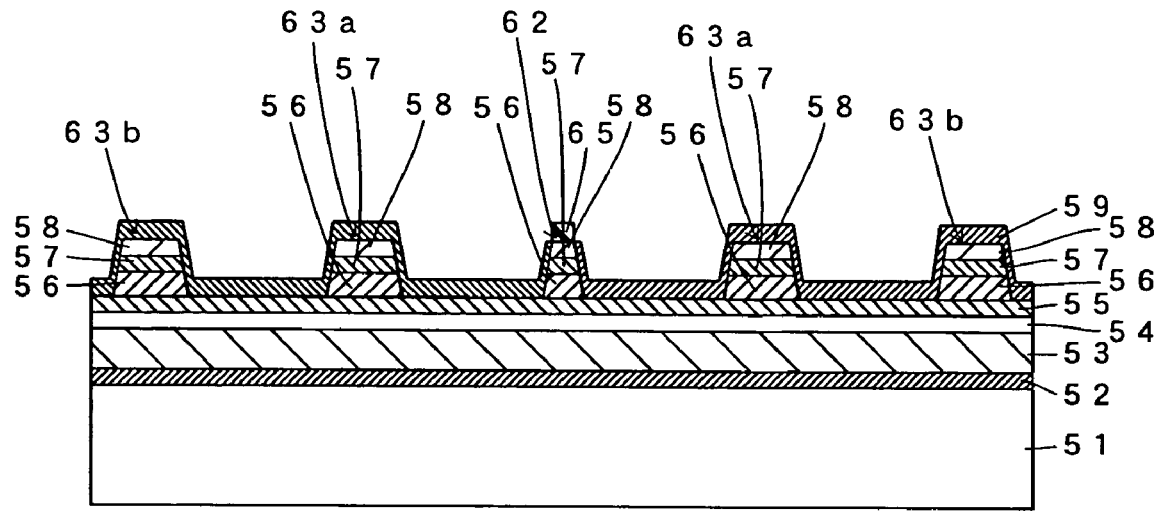

As shown in FIG. 23, the SiO$_2$ layers 65 formed on the dummy ridge portions 63a and 63b are removed while leaving only the SiO$_2$ layer 65 formed on the ridge portion 62. The SiO$_2$ layer 65 left on the ridge portion 62 is employed as a mask for growing the current blocking layers 59 prepared by stacking the n-type AlInP layers, doped with Se, having the thickness of about 0.5 μm and the n-type GaAs layers having the thickness of about 0.3 μm to cover the upper surface of the p-type first cladding layer 55, both side surfaces of the ridge portion 62 and the upper surfaces and both side surfaces of the dummy ridge portions 63a and 63b.

Then, the mask of the SiO$_2$ layer 65 left on the ridge portion 62 is removed. Thereafter heat treatment is performed in a nitrogen atmosphere at 520° C. for 10 minutes, thereby converting the p-type first cladding layer 55, the p-type second cladding layers 56 and the intermediate layers 57 to the p types.

Figure 24:
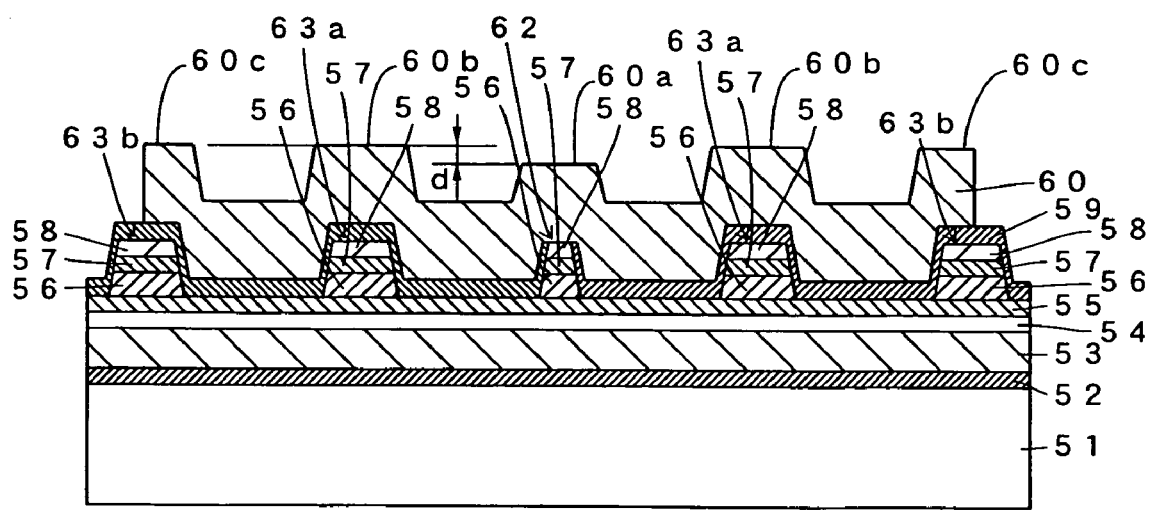

As shown in FIG. 24, the first p-side electrode 60 is formed by vacuum evaporation or the like to cover the exposed upper surface of the ridge portion 62 and the upper surfaces of the current blocking layers 59. The first p-side electrode 60 is formed in the irregular shape reflecting the shapes of the ridge portion 62, the dummy ridge portions 63a and 63b and the current blocking layers 59. Therefore, the height of the portions 60b and 60c of the first p-side electrode 60 located on the dummy ridge portions 63a and 63b exceeds that of the portion 60a located on the ridge portion 62 by the thickness (=d) of the current blocking layers 59.

Thereafter the back surface of the n-type GaAs substrate 51 is etched for forming the n-side electrode 61 on this back surface, as show in FIG. 21. Thereafter heat treatment is performed in H$_2$/N$_2$ ambient at 430° C. for 5 minutes, thereby attaining ohmic contact between the first p-side electrode 60 and the n-side electrode 61. The semiconductor laser device according to the fifth embodiment is formed in the aforementioned manner.

Figure 25:
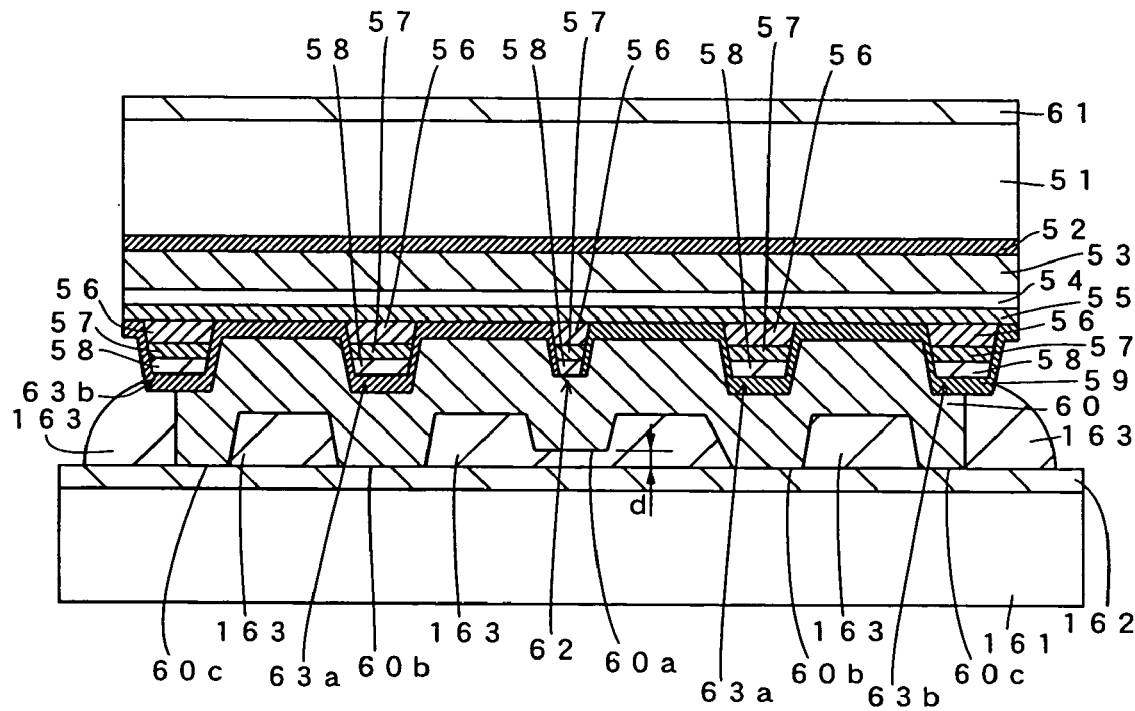
FIG. 25 is a sectional view illustrating the semiconductor laser device according to the fifth embodiment shown in FIG. 21 in a state mounted on a submount in a junction-down system.
Figure 26:
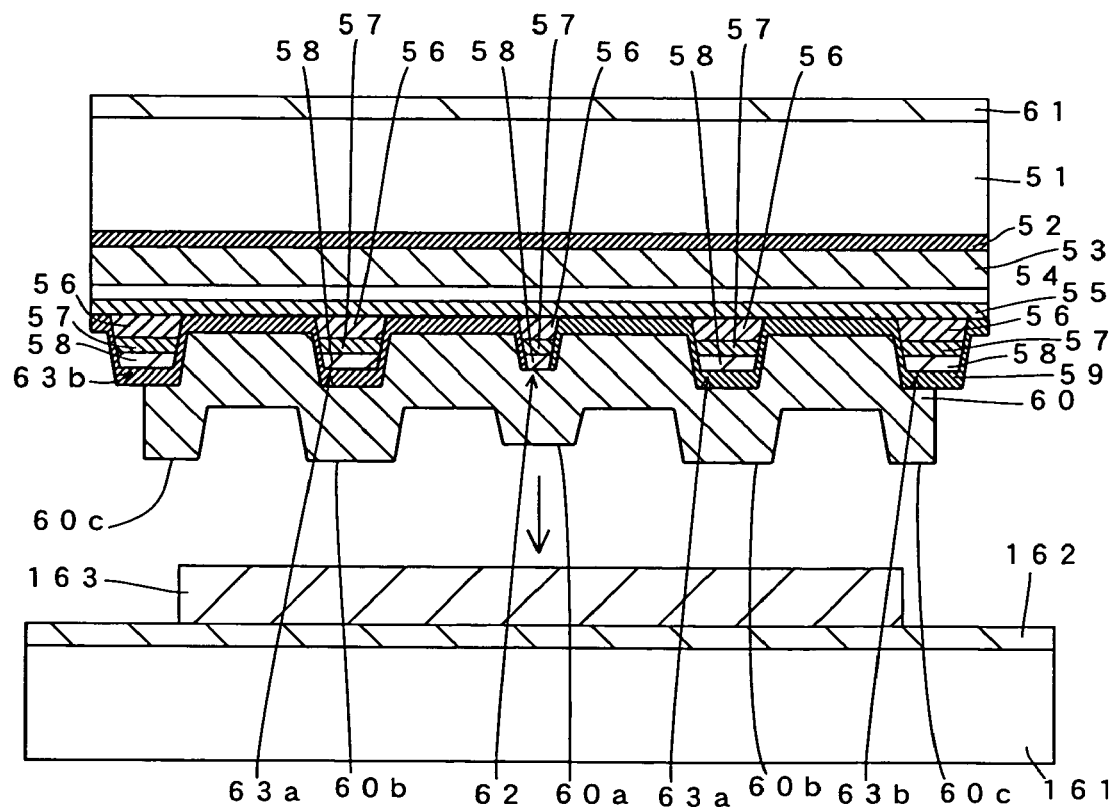
FIG. 26 is a sectional view for illustrating a method of mounting the semiconductor laser device according to the fifth embodiment shown in FIG. 21 on the submount in the junction-down system.

Referring to FIGS. 25 and 26, the semiconductor laser device according to the fifth embodiment is mounted on a metal film (electrode) 162 of a submount 161 through a welding material 163 of a low melting point metal such as solder while directing a projecting portion of the first p-side electrode 60 formed on the front surface of the semiconductor laser device downward. The height of the portions 60b and 60c of the first p-side electrode 60 located on the dummy ridge portions 63a and 63b exceeds that of the portion 60a located on the ridge portion 62 by the thickness (=d) of the current blocking layers 59, and hence a prescribed gap (=d) is defined between the submount 161 and the portion 60a of the first p-side electrode 60 formed on the ridge portion 62 when the aforementioned semiconductor laser device according to the fifth embodiment is mounted on the submount 161 in a junction-down system. Thus, stress applied to the ridge portion 62 can be reduced.

According to the fifth embodiment, as hereinabove described, the two dummy ridge portions 63a and 63b are provided on each side of the ridge portion 62 so that the contact area between the semiconductor laser device and the submount 161 is increased when the former is mounted on the latter in the junction-down system, whereby the semiconductor laser device can be more stably mounted.

According to the fifth embodiment, as hereinabove described, the current blocking layers 59 are formed on the upper surfaces and both side surfaces of the dummy ridge portions 63a and 63b so that no current flows to the dummy ridge portions 63a and 63b also when the welding material 163 of solder for mounting the semiconductor laser device on the submount 161 in the junction-down system as shown in FIGS. 25 and 26 adheres to the side surfaces of the dummy ridge portions 63a and 63b. Thus, the current fed to the semiconductor laser device flows only to the ridge portion 62, whereby the semiconductor laser device can attain high quantum efficiency.

According to the fifth embodiment, further, the outer dummy ridge portions 63b are formed slightly inward beyond the end portions of the n-type GaAs substrate 51 so that not the outer dummy ridge portions 63b but the current blocking layers 59 having upper surfaces parallel to the n-type GaAs substrate 51 are formed on the end portions of the n-type GaAs substrate 51. Thus, the welding material 163 of solder for mounting the semiconductor laser device on the submount 161 hardly reaches the p-type first cladding layer 55, the emission layer 54 and the n-type cladding layer 53 from the current blocking layers 59 on the end portions of the n-type GaAs substrate 51. Consequently, end portions of the p- and n-side semiconductor layers further hardly cause a short, whereby the reliability of the semiconductor laser device can be further improved.

Sixth Embodiment

Figure 27:
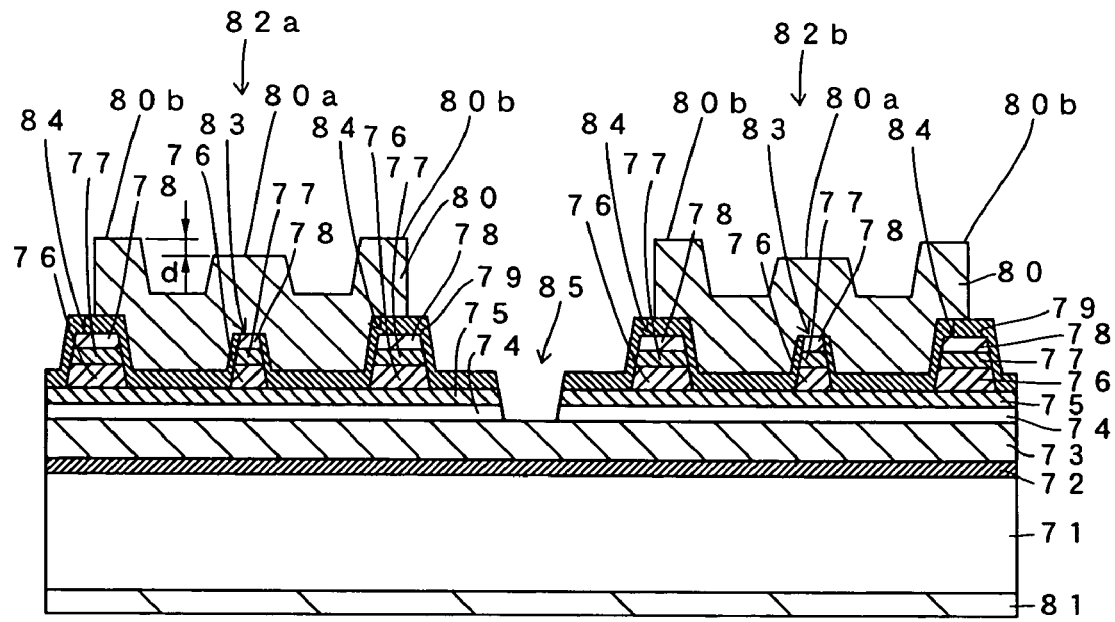
FIG. 27 is a sectional view for illustrating a semiconductor laser device according to a sixth embodiment of the present invention.

Referring to FIG. 27, the present invention is applied to a semiconductor laser device (multi-beam laser) having two emission portions according to a sixth embodiment of the present invention.

The structure of the semiconductor laser device according to the sixth embodiment is described with reference to FIG. 27. The semiconductor laser device according to the sixth embodiment is provided with two emission portions 82a and 82b. More specifically, an n-type buffer layer 72 and an n-type cladding layer 73 are successively formed on an n-type GaAs substrate 71. Two emission layers 74 are formed on the n-type cladding layer 73 on positions corresponding to the two emission portions 82a and 82b respectively. P-type first cladding layers 75 are formed on the emission layers 74 respectively. Mesa (trapezoidal) ridge portions 83 having a width (lower end width) of about 2.5 μm and mesa (trapezoidal) dummy ridge portions 84 having a width (lower end width) of about 30 μm are formed on the upper surfaces of the emission layers 74 respectively. The dummy ridge portions 84 are examples of the "support portion(s)" in the present invention. The ridge portions 83 and the dummy ridge portions 84 are constituted of p-type second cladding layers 76, intermediate layers 77 and contact layers 78 respectively. The center distance between the ridge portions 83 and the dummy ridge portions 84 is about 60 μm. The overall chip width (width of the n-type GaAs substrate 71 shown in FIG. 27) is about 400 μm, and the width of regions corresponding to the emission portions 82a and 82b is about 200 μm. An element isolation trench 85 having a width of about 10 μm to about 50 μm is formed for isolating the emission portions 82a and 82b from each other.

According to the sixth embodiment, the dummy ridge portions 84 are formed slightly inward beyond end portions of the n-type GaAs substrate 71. Thus, regions partially exposing the upper surface of the p-type first cladding layer 55 are formed between the dummy ridge portions 84 and the end portions of the n-type GaAs substrate 71. Current blocking layers 79 prepared by stacking n-type AlInP layers, doped with Se, having a thickness of about 0.5 μm and n-type GaAs layers having a thickness of about 0.3 μm are formed to cover the upper surface of the p-type first cladding layer 55, both side surfaces of the ridge portions 83 and the upper surfaces and both side surfaces of the dummy ridge portions 84. The layers 72 to 78 of the semiconductor laser device according to the sixth embodiment are similar in composition and thickness to the layers 2 to 8 of the semiconductor laser device according to the first embodiment respectively.

According to the sixth embodiment, first p-side electrodes 80 consisting of Cr/Au layers, having a total thickness of about 3 μm, prepared by stacking Cr layers and Au layers successively from the sides closer to the p-type first cladding layers 75 are formed to cover the exposed upper surfaces of the ridge portions 83 and the upper surfaces of the current blocking layers 79. The first p-side electrodes 80 are formed in irregular shapes reflecting the shapes of the ridge portions 83, the dummy ridge portions 84 and the current blocking layers 79. Therefore, the height of portions 80b of the first p-side electrodes 80 located on the dummy ridge portions 84 exceeds that of portions 80a located on the ridge portions 83 by the thickness (=d) of the current blocking layers 79. The first p-side electrodes 80 are examples of the "first metal electrode" in the present invention.

An n-side electrode 81 consisting of an Au—Ge/Au layer prepared by stacking an Au—Ge layer and an Au layer successively from the side closer to the n-type GaAs substrate 71 is formed on the back surface of the n-type GaAs substrate 71. Thus, the semiconductor laser device according to the sixth embodiment is formed.

Figure 28:
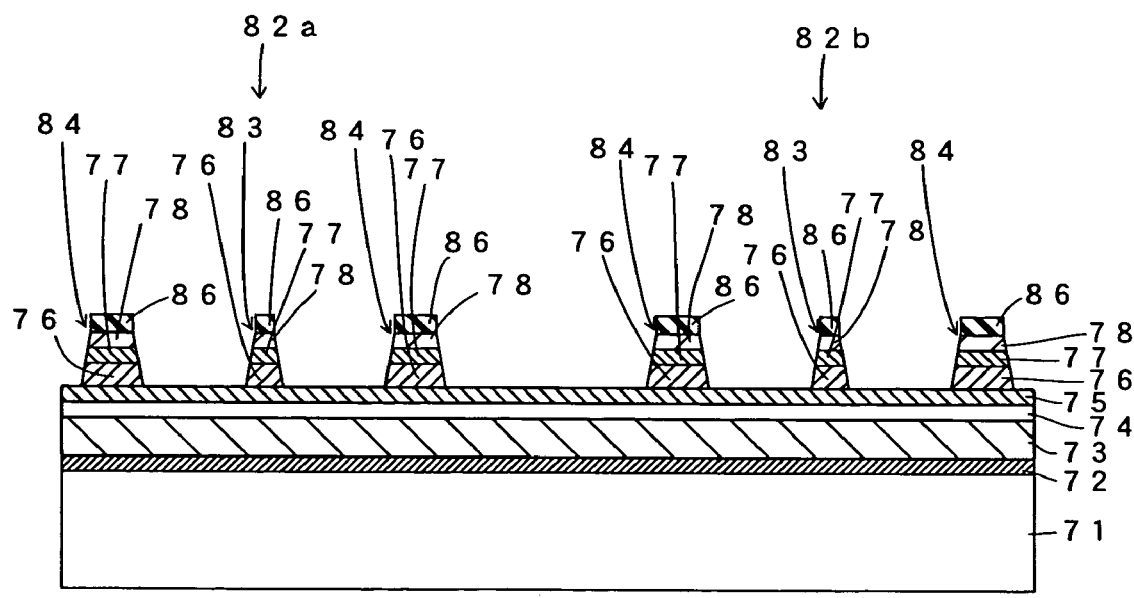
FIGS. 28 to 31 are sectional views for illustrating a process of fabricating the semiconductor laser device according to the sixth embodiment of the present invention.

A process of fabricating the semiconductor laser device according to the sixth embodiment is described with reference to FIGS. 27 to 31. The n-type buffer layer 72, the n-type cladding layer 73, the emission layers 74, the p-type first cladding layers 75, the p-type second cladding layers 76, the intermediate layers 77 and the contact layers 78 are successively formed on the n-type GaAs substrate 71 through a step similar to that of the first embodiment shown in FIG. 3. Thereafter SiO₂ layers 86 are formed on the contact layers 78 by photolithography and etching at prescribed intervals, as shown in FIG. 28. The SiO₂ layers 86 are employed as masks for etching the p-type second cladding layers 76, the intermediate layers 77 and the contact layers 88, thereby forming the mesa (trapezoidal) ridge portions 83 and the pairs of dummy ridge portions 84 on the regions corresponding to the emission portions 82a and 82b respectively. At this time, the dummy ridge portions 84 are formed slightly inward beyond the end portions of the n-type GaAs substrate 71, thereby forming the regions partially exposing the upper surfaces of the p-type cladding layers 75 between the dummy ridge portions 84 and the end portions of the n-type GaAs substrate 71.

Figure 29:
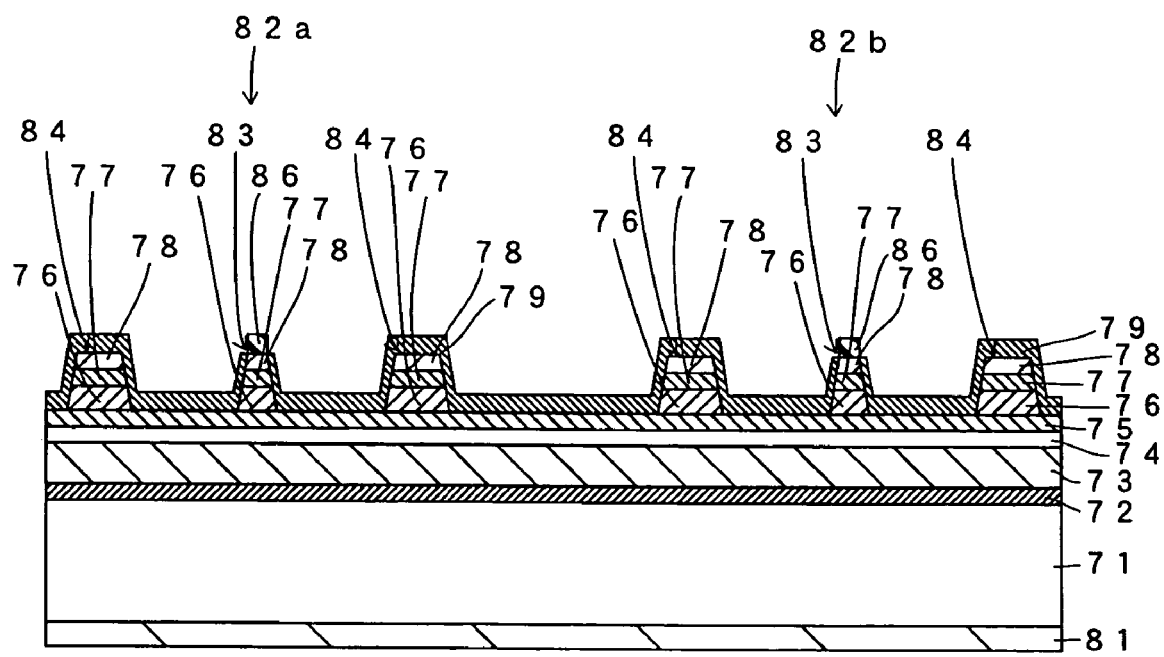

As shown in FIG. 29, the SiO₂ layers 86 formed on the dummy ridge portions 84 are removed while leaving only the SiO₂ layers 86 formed on the ridge portions 83. The SiO₂ layers 86 left on the ridge portions 83 are employed as masks for growing the current blocking layers 79 prepared by stacking the n-type AlInP layers, doped with Se, having the thickness of about 0.5 μm and the n-type GaAs layers having the thickness of about 0.3 μm to cover the upper surfaces of the p-type first cladding layers 75, both side surfaces of the ridge portions 83 and the upper surfaces and both side surfaces of the dummy ridge portions 84.

Then, the masks of the SiO₂ layers 86 left on the ridge portions 83 are removed. Thereafter heat treatment is performed in a nitrogen atmosphere at 520° C. for 10 minutes, thereby converting the p-type first cladding layers 75, the p-type second cladding layers 76 and the intermediate layers 77 to the p types.

Figure 30:
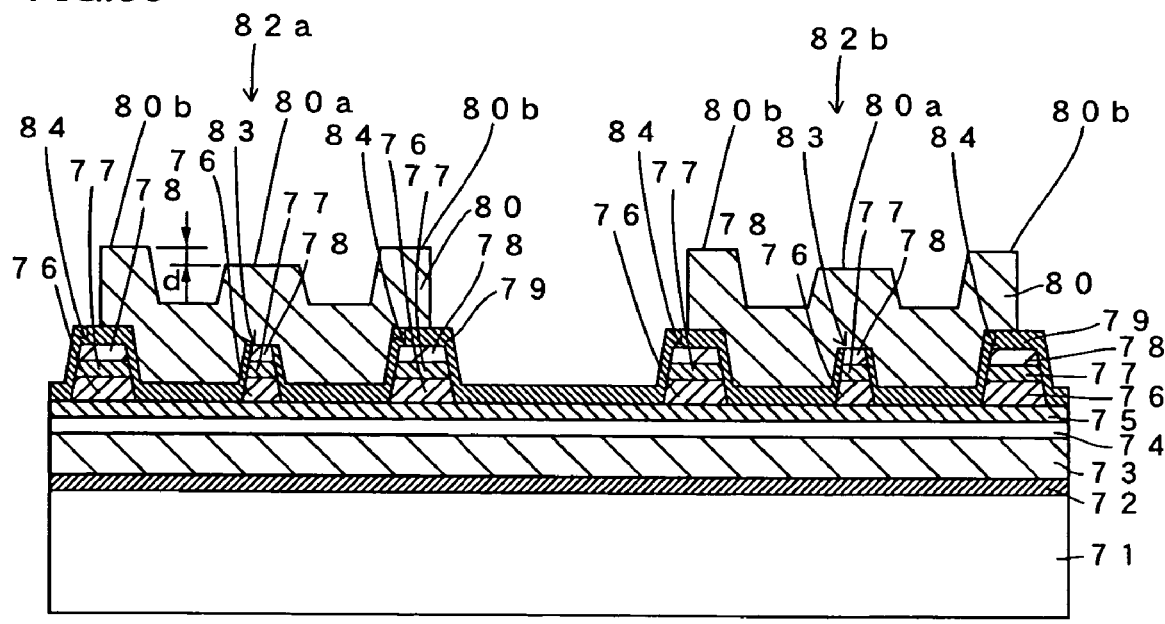

As shown in FIG. 30, the first p-side electrodes 80 are formed by vacuum evaporation or the like to cover the exposed upper surfaces of the ridge portions 83 and the upper surfaces of the current blocking layers 79. The first p-side electrodes 80 are formed in the irregular shapes reflecting the shapes of the ridge portions 83, the dummy ridge portions 84 and the current blocking layers 79, whereby the height of the portions 80b of the first p-side electrodes 80 located on the dummy ridge portions 84 exceeds that of the portions 80a located on the ridge portions 83 by the thickness (=d) of the current blocking layers 79.

Figure 31:
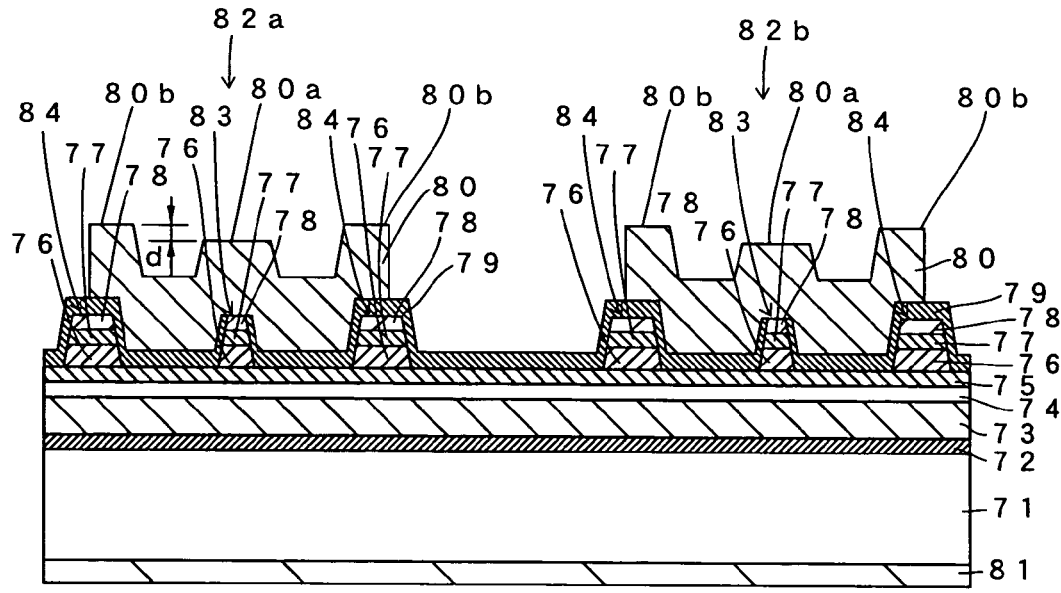

Thereafter the back surface of the n-type GaAs substrate 71 is etched for forming the n-side electrode 81 on this back surface, as show in FIG. 31. Thereafter heat treatment is performed in H₂/N₂ ambient at 430° C. for 5 minutes, thereby attaining ohmic contact between the first p-side electrodes 80 and the n-side electrode 81.

Thereafter the current blocking layer 79, the p-type first cladding layers 75 and the emission layers 74 are etched by photolithography and etching thereby forming the element isolation trench 85 having the width of about 10 μm to about 50 μm, as shown in FIG. 27. The semiconductor laser device according to the sixth embodiment having the two emission portions 82a and 82b is formed in the aforementioned manner.

Figure 32:
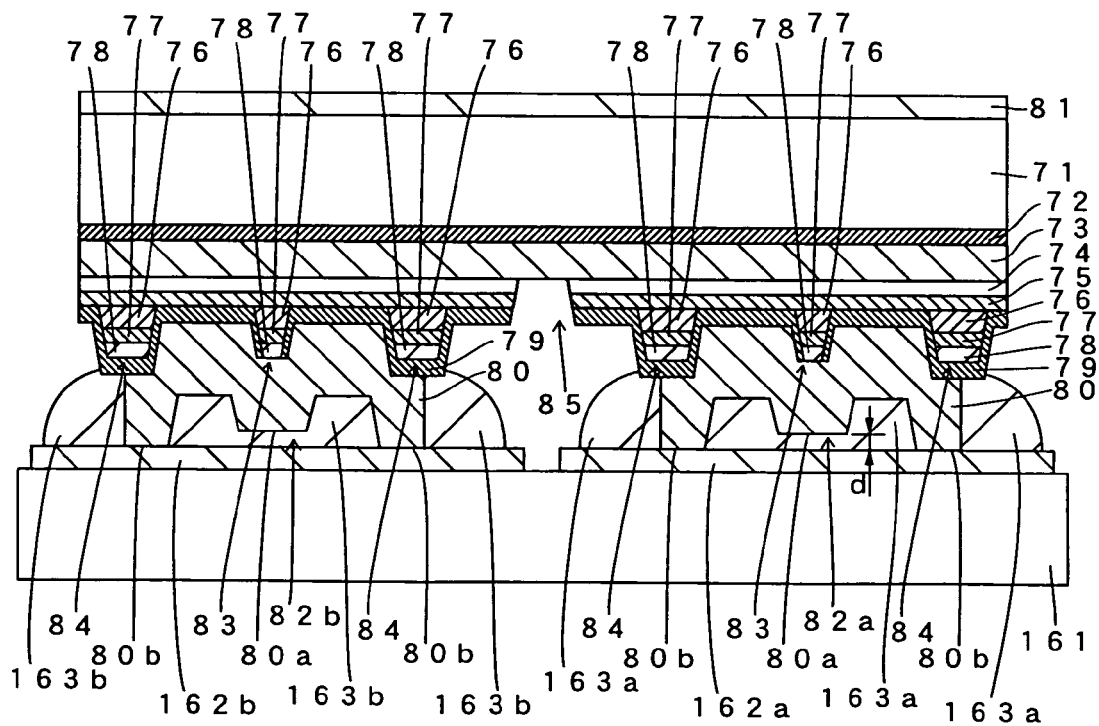
FIG. 32 is a sectional view illustrating the semiconductor laser device according to the sixth embodiment shown in FIG. 27 in a state mounted on a submount in a junction-down system.
Figure 33:
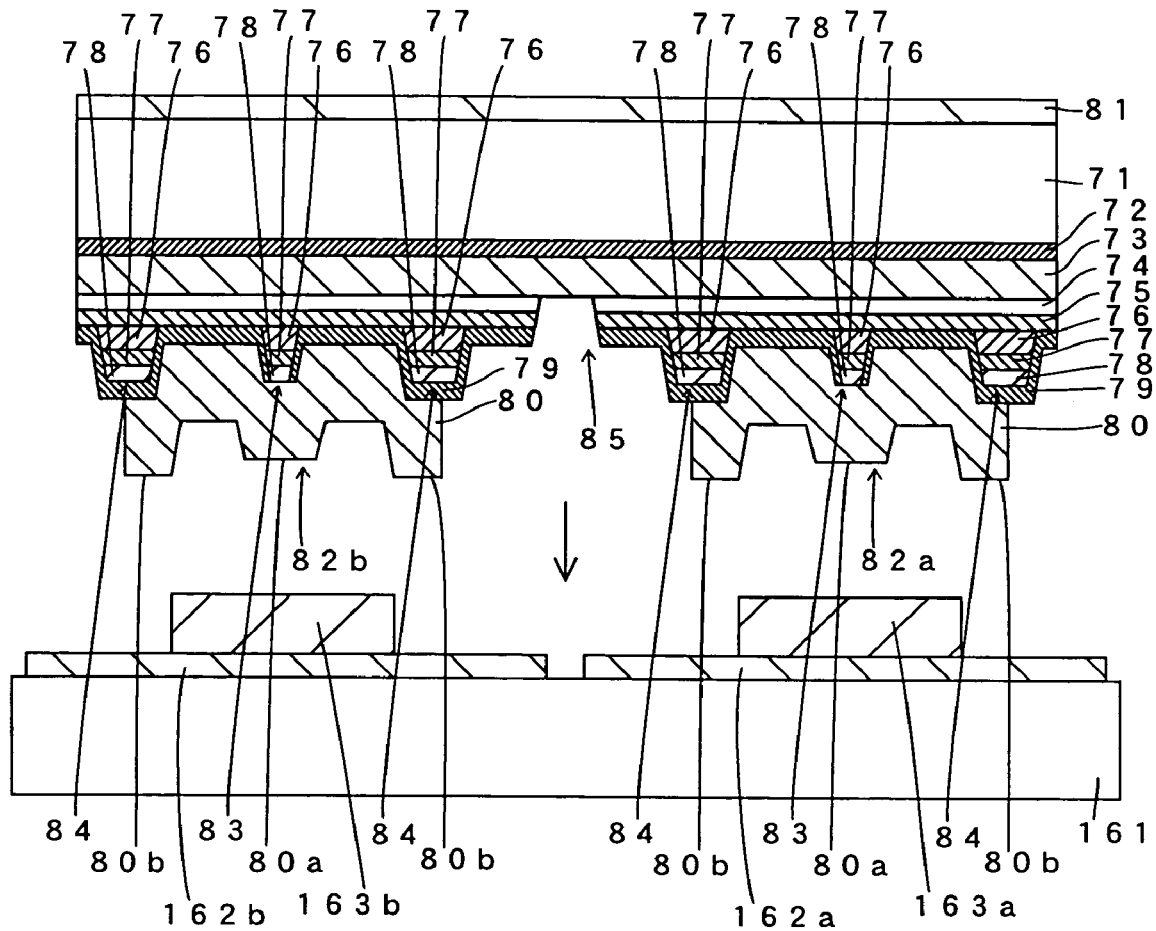
FIG. 33 is a sectional view for illustrating a method of mounting the semiconductor laser device according to the sixth embodiment shown in FIG. 27 on the submount in the junction-down system.

Referring to FIGS. 32 and 33, the semiconductor laser device according to the sixth embodiment is mounted on metal films (electrodes) 162a and 162b of a submount 161 through welding materials 163a and 163b of a low melting point metal such as solder while directing projecting portions of the first p-side electrodes 80 formed on the front surface of the semiconductor laser device downward. The height of the portions 80b of the first p-side electrodes 80 located on the dummy ridge portions 84 exceeds that of the portions 80a located on the ridge portions 83 by the thickness (=d) of the current blocking layers 79, and hence prescribed gaps (=d) are defined between the submount 161 and the portions 80a of the first p-side electrodes 80 located on the ridge portions 83 when the aforementioned semiconductor laser device according to the sixth embodiment is mounted on the submount 161 in a junction-down system. Thus, stress applied to the ridge portions 83 can be reduced.

According to the sixth embodiment, as hereinabove described, the current blocking layers 79 are formed on the upper surfaces and both side surfaces of the dummy ridge portions 84 so that no current flows to the dummy ridge portions 84 also when the welding materials 163a and 163b of solder for mounting the semiconductor laser device on the submount 161 in the junction-down system adhere to the side surfaces of the dummy ridge portions 84. Thus, the current fed to the semiconductor laser device flows only to the ridge portions 83, whereby the semiconductor laser device (multi-beam laser) having the two emission portions 82a and 82b can attain high quantum efficiency.

According to the sixth embodiment, further, the dummy ridge portions 84 are formed slightly inward beyond the end portions of the n-type GaAs substrate 71 so that not the dummy ridge portions 84 but the current blocking layers 79 having upper surfaces parallel to the n-type GaAs substrate 71 are formed on the end portions of the n-type GaAs substrate 71. Thus, the welding materials 163a and 163b of solder for mounting the semiconductor laser device on the submount 161 hardly reach the p-type first cladding layers 75, the emission layers 74 and the n-type cladding layers 73 from the current blocking layers 79 on the end portions of the n-type GaAs substrate 71. Consequently, end portions of the p- and n-side semiconductor layers further hardly cause a short, whereby the reliability of the semiconductor laser device can be further improved.

Seventh Embodiment

Figure 34:
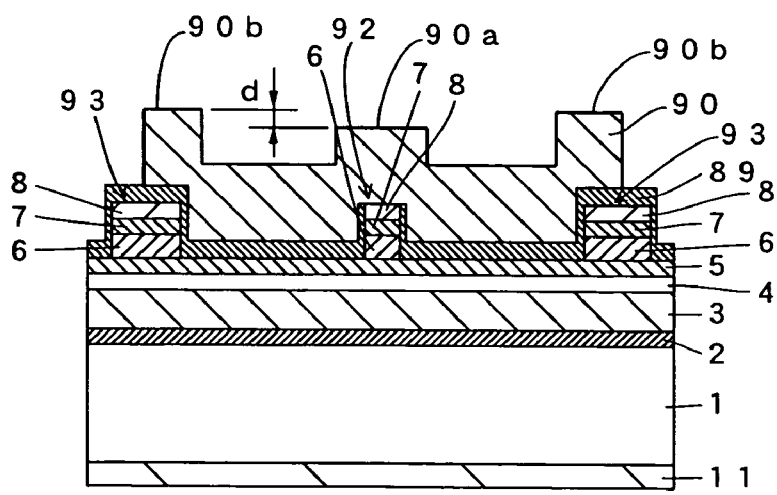
FIG. 34 is a sectional view for illustrating a semiconductor laser device according to a seventh embodiment of the present invention.

Referring to FIG. 34, a ridge portion and dummy ridge portions have perpendicular side surfaces in a semiconductor laser device according to a seventh embodiment of the present invention, dissimilarly to the aforementioned first to sixth embodiments.

The structure of the semiconductor laser device according to the seventh embodiment is described with reference to FIG. 34. In the semiconductor laser device according to the seventh embodiment, an n-type buffer layer 2, an n-type cladding layer 3, an emission layer 4 and a p-type first cladding layer 5 are successively formed on an n-type GaAs substrate 1, similarly to the first embodiment. Further, a ridge portion 92 having a width (lower end width) of about 2.5 μm and dummy ridge portions 93 having a width (lower end width) of about 50 μm are formed on the upper surface of the p-type first cladding layer 5. The dummy ridge portions 93 are examples of the "support portion(s)" in the present invention. The ridge portion 92 and the dummy ridge portions 93 are constituted of p-type second cladding layers 6, intermediate layers 7 and contact layers 8 respectively.

According to the seventh embodiment, the ridge portion 92 and the dummy ridge portions 93 are formed to have perpendicular side surfaces. The center distance between the ridge portion 92 and the dummy ridge portions 93 is about 100 μm. The chip width (width of the n-type GaAs substrate 1 shown in FIG. 34) is about 300 μm. The dummy ridge portions 93 are formed slightly inward beyond end portions of the n-type GaAs substrate 1. Thus, regions partially exposing the upper surface of the p-type first cladding layer 5 are formed between the dummy ridge portions 93 and the end portions of the n-type GaAs substrate 1. Current blocking layers 89 prepared by stacking n-type AlInP layers, doped with Se, having a thickness of about 0.5 μm and n-type GaAs layers having a thickness of about 0.3 μm are formed to cover the upper surface of the p-type first cladding layer 5, both side surfaces of the ridge portion 92 and the upper surfaces and both side surfaces of the dummy ridge portions 93. The layers 2 to 8 in the semiconductor laser device according to the seventh embodiment are similar in composition and thickness to the layers 2 to 8 of the semiconductor laser device according to the first embodiment respectively.

According to the seventh embodiment, a first p-side electrode 90 consisting of a Cr/Au layer, having a total thickness of about 3 μm, prepared by stacking a Cr layer and an Au layer successively from the side closer to the p-type first cladding layer 5 is formed to cover the exposed upper surface of the ridge portion 92 and the upper surfaces of the current blocking layers 89. The first p-side electrode 90 is formed in an irregular shape reflecting the shapes of the ridge portion 92, the dummy ridge portions 83 and the current blocking layers 89. Therefore, the height of portions 90b of the first p-side electrode 90 located on the dummy ridge portions 93 exceeds that of a portion 90a located on the ridge portion 92 by the thickness (=d) of the current blocking layers 89. The first p-side electrode 90 is an example of the "first metal electrode" in the present invention.

An n-side electrode 11 consisting of an Au—Ge/Au layer prepared by stacking an Au—Ge layer and an Au layer successively from the side closer to the n-type GaAs substrate 1 is formed on the back surface of the n-type GaAs substrate 1. Thus, the semiconductor laser device according to the seventh embodiment is formed.

Figure 35:
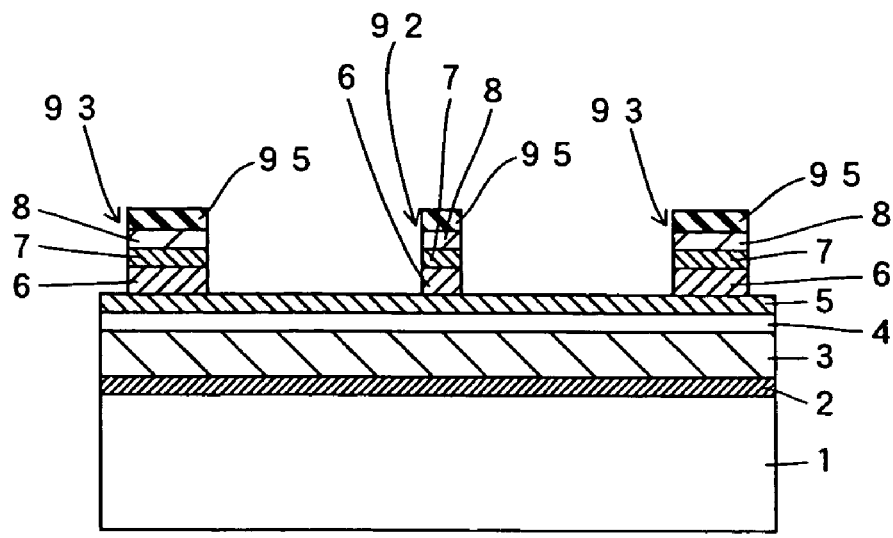
FIGS. 35 to 37 are sectional views for illustrating a process of fabricating the semiconductor laser device according to the seventh embodiment of the present invention.

A process of fabricating the semiconductor laser device according to the seventh embodiment is described with reference to FIGS. 34 to 37. First, the n-type buffer layer 2, the n-type cladding layer 3, the emission layer 4, the p-type first cladding layer 5, the p-type second cladding layers 6, the intermediate layers 7 and the contact layers 8 are successively formed on the n-type GaAs substrate 1 through a step similar to that of the first embodiment shown in FIG. 3. As shown in FIG. 35, $SiO_2$ layers 95 are formed on the contact layers 8 by photolithography and etching at prescribed intervals. The $SiO_2$ layers 95 are employed as masks for etching the p-type second cladding layers 6, the intermediate layers 7 and the contact layers 8 thereby forming the ridge portion 92 and the dummy ridge portions 93 having the perpendicular side surfaces respectively. The ridge portion 92 and the dummy ridge portions 93 having the perpendicular side surfaces can be easily formed by adjusting etching conditions. At this time, the dummy ridge portions 93 are formed slightly inward beyond the end portions of the n-type GaAs substrate 1, thereby forming the regions partially exposing the upper surface of the p-type first cladding layer 5 between the dummy ridge portions 93 and the end portions of the n-type GaAs substrate 1.

Figure 36:
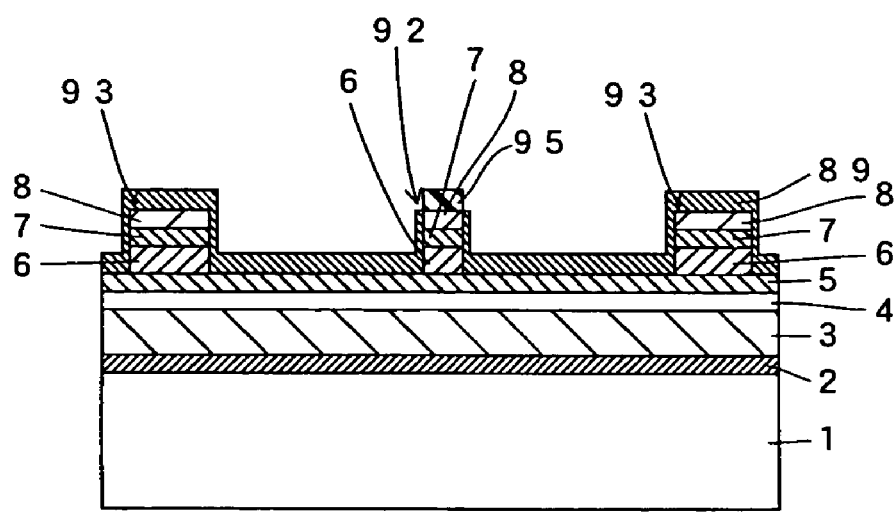

As shown in FIG. 36, the $SiO_2$ layers 95 are removed from the dummy ridge portions 93 while leaving only the central $SiO_2$ layer 95 on the ridge portion 92. The $SiO_2$ layer 95 left on the ridge portion 92 is employed as a mask for growing the current blocking layers 89 prepared by stacking the n-type AlInP layers, doped with Se, having the thickness of about 0.5 μm and the n-type GaAs layers having the thickness of about 0.3 μm to cover the upper surface of the p-type first cladding layer 5, both side surfaces of the ridge portion 92 and the upper surfaces and both side surfaces of the dummy ridge portions 93.

Then, the mask of the $SiO_2$ layer 95 left on the ridge portion 92 is removed. Thereafter heat treatment is performed in a nitrogen atmosphere at 520° C. for 10 minutes, thereby converting the p-type first and second cladding layers 5 and 6 and the intermediate layers 7 to the p types.

Figure 37:
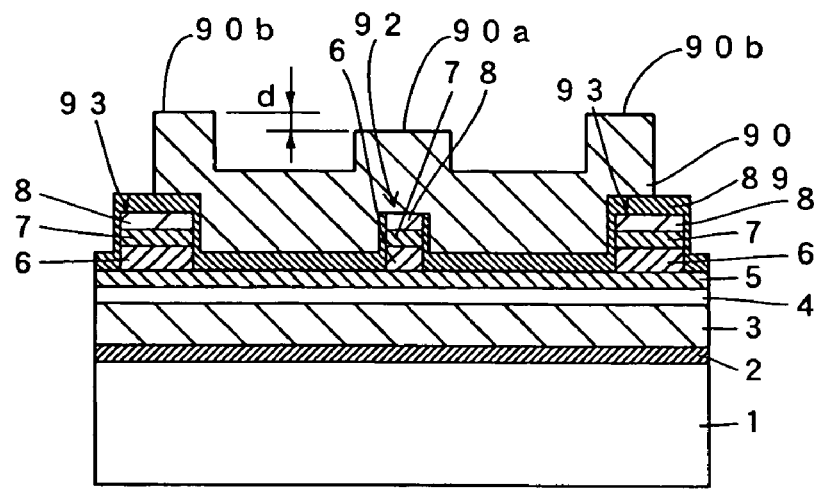

As shown in FIG. 37, the first p-side electrode 90 is formed by vacuum evaporation or the like to cover the exposed upper surface of the ridge portion 92 and the upper surfaces of the current blocking layers 89. The first p-side electrode 90 is formed in the irregular shape reflecting the shapes of the ridge portion 92, the dummy ridge portions 83 and the current blocking layers 89. Therefore, the height of the portions 90b of the first p-side electrode 90 located on the dummy ridge portions 93 exceeds that of the portion 90a located on the ridge portion 92 by the thickness (=d) of the current blocking layers 89. The first p-side electrode 90 is formed to have perpendicular side surfaces reflecting the perpendicular side surfaces of the ridge portion 92 and the dummy ridge portions 93.

Thereafter the back surface of the n-type GaAs substrate 1 is etched for forming the n-side electrode 11 on this back surface as shown in FIG. 34. Thereafter heat treatment is performed in $H_2/N_2$ ambient at 430° C. for 5 minutes, thereby attaining ohmic contact between the first p-side electrode 90 and the n-side electrode 11. The semiconductor laser device according to the seventh embodiment of the present invention is formed in the aforementioned manner.

Figure 38:
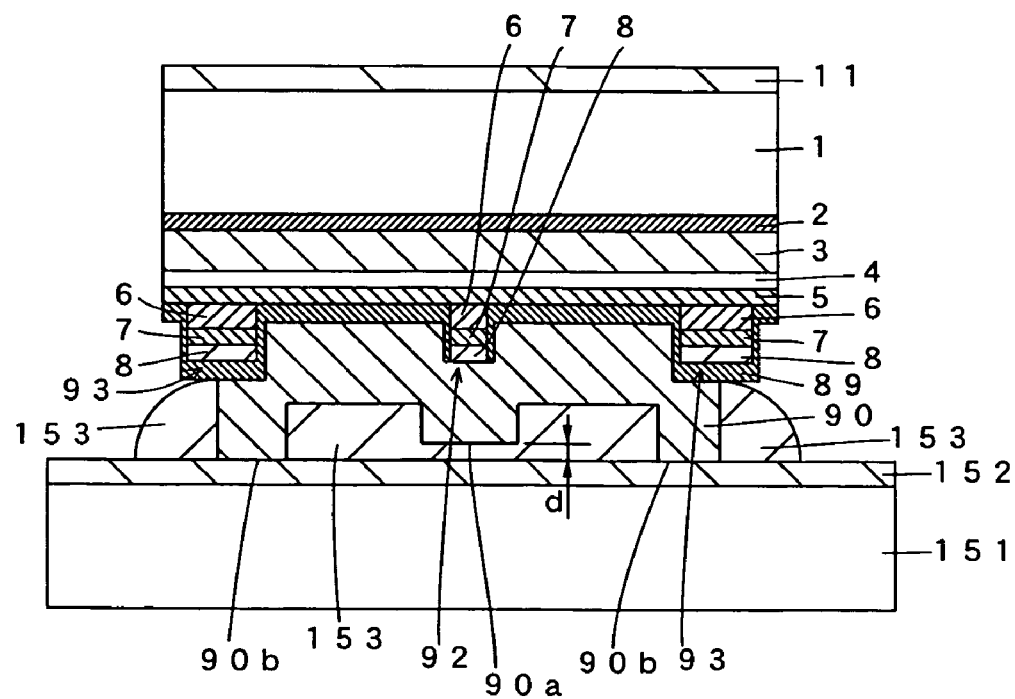
FIG. 38 is a sectional view illustrating the semiconductor laser device according to the seventh embodiment shown in FIG. 34 in a state mounted on a submount in a junction-down system.
Figure 39:
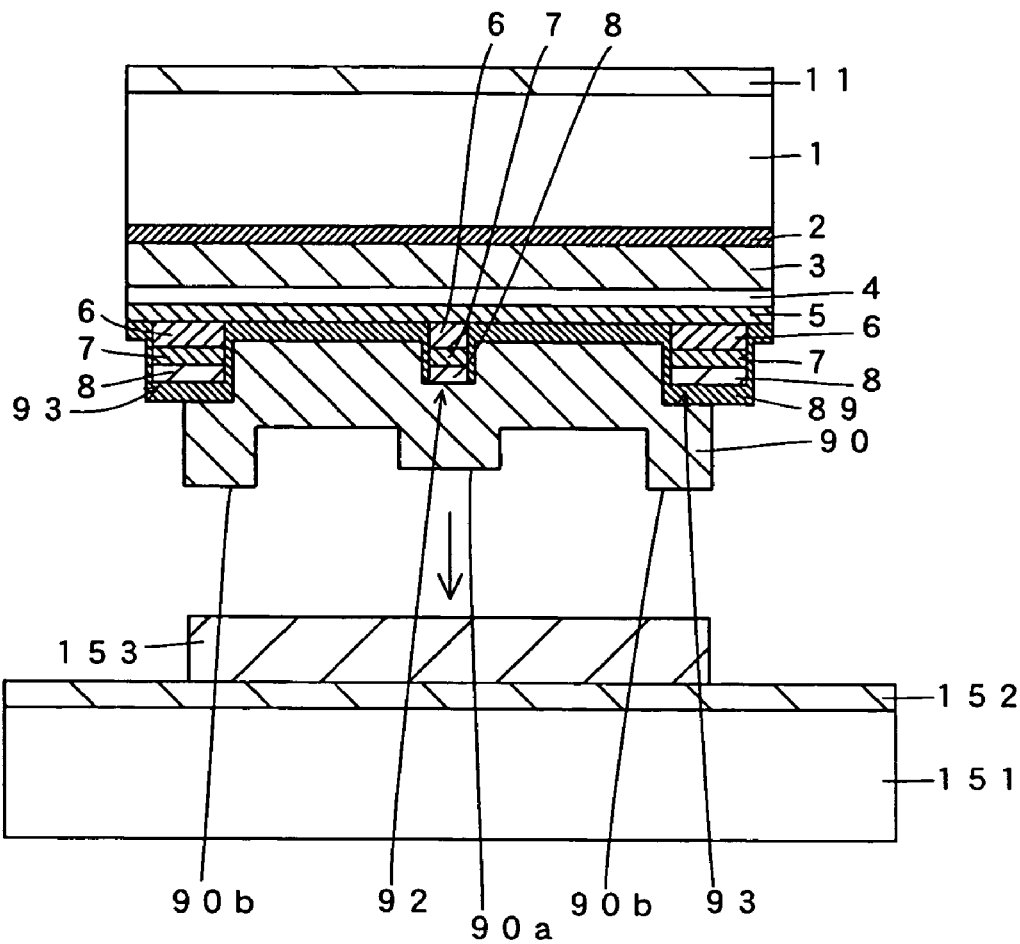
FIG. 39 is a sectional view for illustrating a method of mounting the semiconductor laser device according to the seventh embodiment shown in FIG. 34 on the submount in the junction-down system.

Referring to FIGS. 38 and 39, the semiconductor laser device according to the seventh embodiment is mounted on a metal film (electrode) 152 of a submount 151 through a welding material 153 of a low melting point metal such as solder while directing a projecting portion of the first p-side electrode 90 formed on the front surface of the semiconductor laser device downward. The height of the portions 90b of the first p-side electrode 90 located on the dummy ridge portions 93 exceeds that of the portion 90a located on the ridge portion 92 by the thickness (=d) of the current blocking layers 89, and hence a prescribed gap (=d) is defined between the submount 151 and the portion 90a of the first p-side electrode 90 located on the ridge portion 92 when the aforementioned semiconductor laser device according to the seventh embodiment is mounted on the submount 151 in a junction-down system. Thus, stress applied to the ridge portion 92 can be reduced.

According to the seventh embodiment, as hereinabove described, the dummy ridge portions 93 are formed to have the perpendicular side surfaces so that the first p-side electrode 90 also has the perpendicular side surfaces reflecting those of the dummy ridge portions 93, whereby the welding material 153 of solder is easily collected between the perpendicular inner side surfaces of the dummy ridge portions 93. Thus, the welding material 153 of solder can be embedded between the perpendicular inner side surfaces of the dummy ridge portions 93 with excellent reproducibility, while the welding material 153 of solder can be prevented from extruding toward the end surfaces of the semiconductor laser device. Consequently, the semiconductor laser device can be further inhibited from a short resulting from the welding material 153 of solder reaching the end surfaces thereof.

According to the seventh embodiment, further, the dummy ridge portions 93 are formed slightly inward beyond the end portions of the n-type GaAs substrate 1 so that not the dummy ridge portions 93 but the current blocking layers 89 having upper surfaces parallel to the n-type GaAs substrate 1 are formed on the end portions of the n-type GaAs substrate 1. Thus, the welding material 153 of solder for mounting the semiconductor laser device on the submount 151 hardly reaches the p-type first cladding layer 5, the emission layer 4 and the n-type cladding layer 3 from the current blocking layers 89 on the end portions of the n-type GaAs substrate 1. Consequently, end portions of the p- and n-side semiconductor layers further hardly cause a short, whereby the reliability of the semiconductor laser device can be further improved.

According to the seventh embodiment, as hereinabove described, the current blocking layers 89 are formed on the upper surfaces and both side surfaces of the dummy ridge portions 93 so that no current flows to the dummy ridge portions 93 also when the welding material 153 of solder for mounting the semiconductor laser device on the submount 151 in the junction-down system adheres to the side surfaces of the dummy ridge portions 93. Thus, the current fed to the semiconductor laser device flows only to the ridge portion 92, whereby the semiconductor laser device can attain high quantum efficiency.

Eighth Embodiment

Figure 40:
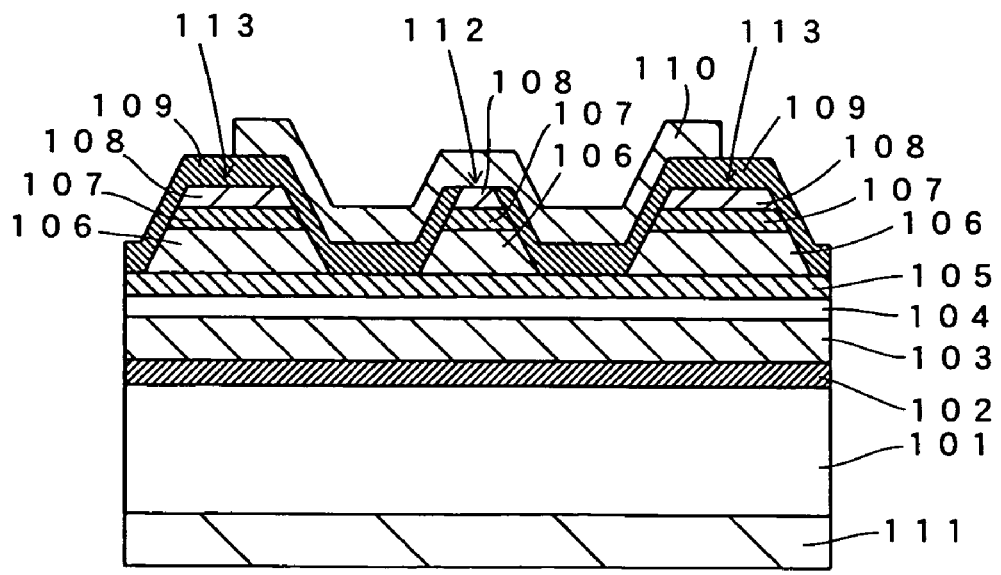
FIG. 40 is a sectional view for illustrating a semiconductor laser device according to an eighth embodiment of the present invention.

Referring to FIG. 40, the interval between the lower ends of a ridge portion and dummy ridge portions is set to at least about 20 μm and not more than about 100 μm in a semiconductor laser device according to an eighth embodiment of the present invention.

In the semiconductor laser device according to the eighth embodiment, a buffer layer 102 of n-type GaInP having a thickness of about 0.3 μm, an n-type cladding layer 103 of n-type AlGaInP having a thickness of about 2 82 m, an MQW active layer (quantum well active layer) 104 of GaInP/AlGaInP and a p-type first cladding layer 105 of p-type AlGaInP having a thickness of about 0.3 μm are successively formed on an n-type GaAs substrate 101. A mesa (trapezoidal) ridge portion 112 and a pair of dummy ridge portions 113 are formed on the p-type first cladding layer 105. The ridge portion 112 and the pair of dummy ridge portions 113 are constituted of p-type second cladding layers 106 of p-type AlGaInP having a thickness of about 1.2 μm, intermediate layers 107 of p-type GaInP having a thickness of about 0.1 μm and contact layers 108 of p-type GaAs having a thickness of about 0.3 μm respectively. The dummy ridge portions 113 are examples of the "support portion(s)" in the present invention.

According to the eighth embodiment, the interval between the lower ends of the ridge portion 112 and the dummy ridge portions 113 is set to at least about 20 μm and not more than about 100 μm.

Current blocking layers 109 of n-type AlInP having a thickness of about 0.3 μm are formed to cover both side surfaces of the ridge portion 112, the upper surface of the p-type first cladding layer 105 and both side surfaces and the upper surfaces of the dummy ridge portions 113. A p-side ohmic electrode 110 is formed on the ridge portion 112 (contact layer 108) and prescribed regions of the current blocking layers 109. An n-side ohmic electrode 111 is formed on the back surface of the n-type GaAs substrate 101. The aforementioned p-side ohmic electrode 110 is preferably prepared from a material having high thermal conductivity and excellent heat dissipativity such as Au (gold) having thermal conductivity of 315 W/m·K (27° C.). This p-side ohmic electrode 110 is an example of the "first metal electrode" in the present invention.

In the semiconductor laser device according to the eighth embodiment having the aforementioned structure, a voltage is applied to the p- and n-side ohmic electrodes 110 and 111 thereby injecting electrons and holes into the MQW active layer 104 from the n-type cladding layer 103 and the p-type first cladding layer 105 respectively. Consequently, the MQW active layer 104 emits a red laser beam.

A process of fabricating the semiconductor laser device according to the eighth embodiment is described with reference to FIGS. 40 to 46.

Figure 41:
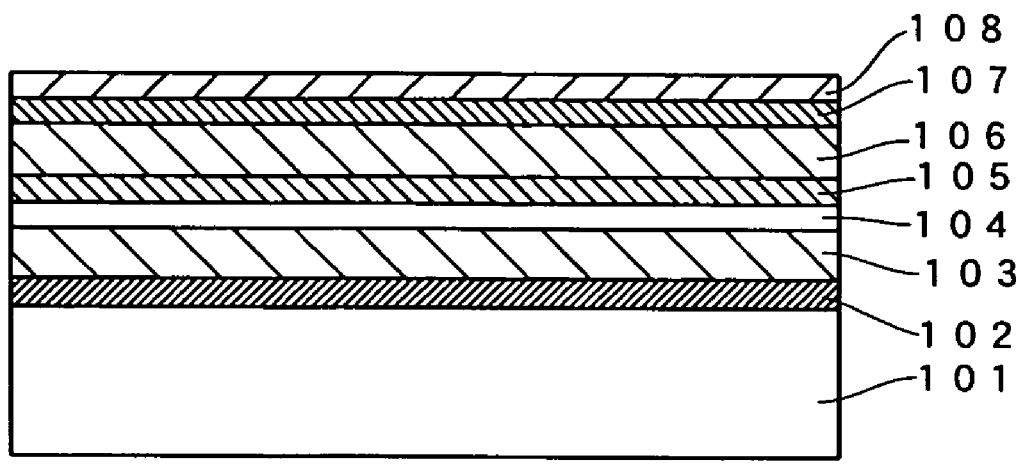
FIGS. 41 to 46 are sectional views for illustrating a process of fabricating the semiconductor laser device according to the eighth embodiment of the present invention.

As shown in FIG. 41, the buffer layer 102 of n-type GaInP having the thickness of about 0.3 μm, the n-type cladding layer 103 of n-type AlGaInP having the thickness of about 2 μm, the MQW active layer (quantum well active layer) 104 of GaInP/AlGaInP, the p-type first cladding layer 105 of p-type AlGaInP having the thickness of about 0.3 μm, the p-type second cladding layers 106 of p-type AlGaInP having the thickness of about 1.2 μm, the intermediate layers 107 of p-type GaInP having the thickness of about 0.1 μm and the contact layers 108 of p-type GaAs having the thickness of about 0.3 μm are successively grown on the n-type GaAs substrate 101 by MOVPE (metal organic vapor phase epitaxy).

Figure 42:
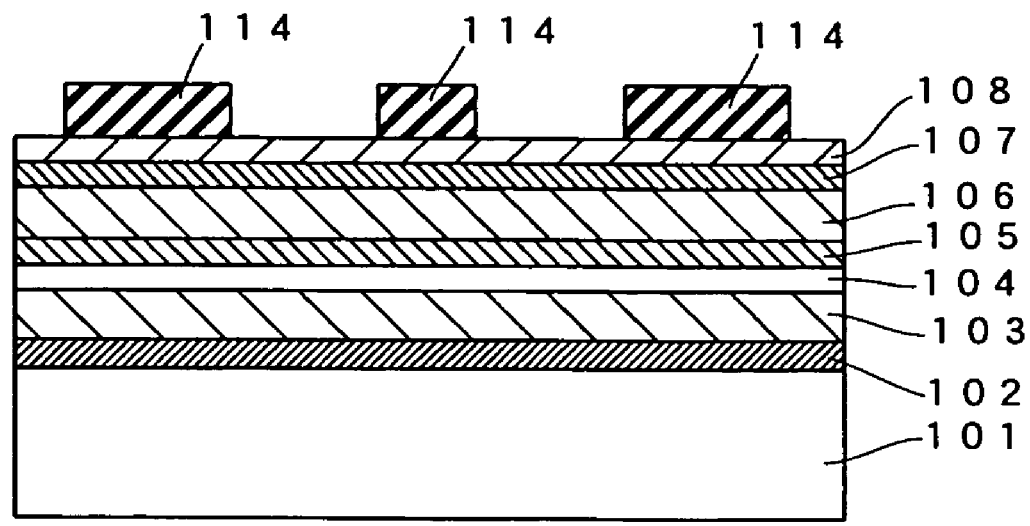

As shown in FIG. 42, the SiO$_2$ layers 114 having the thickness of about 0.2 μm are formed on the contact layer 108 by sputtering, vacuum evaporation or electron beam evaporation, thereafter patterning the SiO$_2$ layers 114 by photolithography and etching. The SiO$_2$ layers 114 are etched with buffered hydrofluoric acid. These SiO$_2$ layers 114 are examples of the "mask consisting of a dielectric substance" in the present invention.

Figure 43:
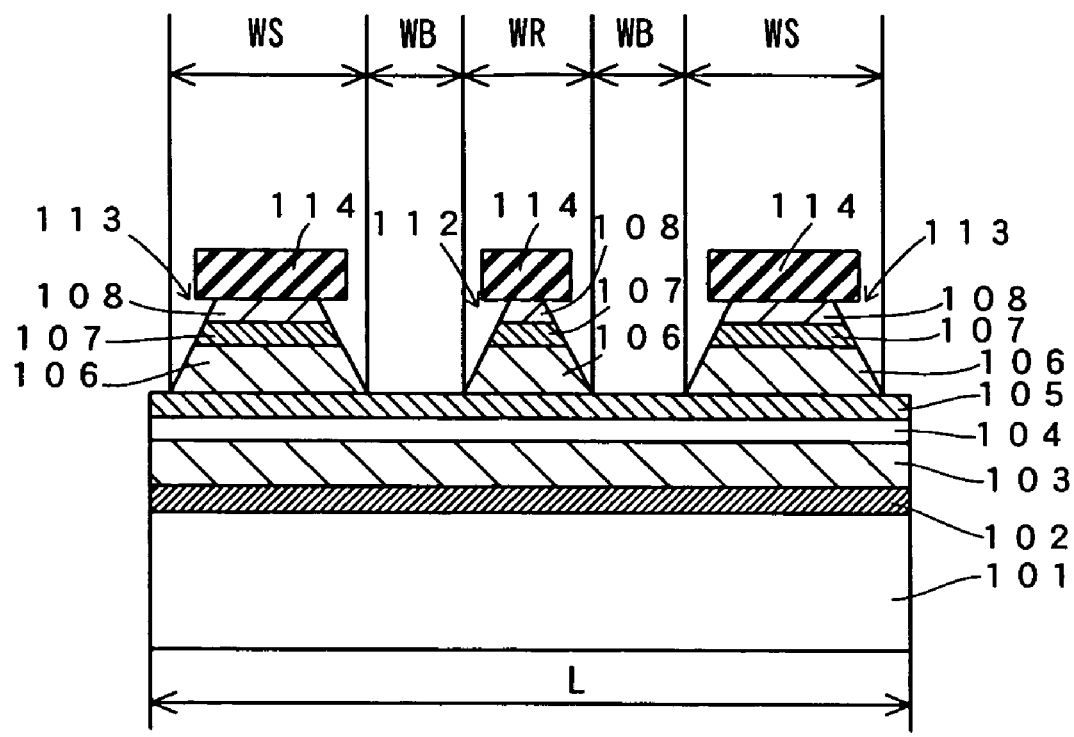

As shown in FIG. 43, the SiO$_2$ layers 114 are employed as masks for etching the p-type second cladding layers 106, the intermediate layers 107 and the contact layers 108 thereby forming the striped (elongated) ridge and dummy ridge portions 112 and 113. This etching step is carried out by wet-etching prescribed regions of the contact layers 108, the intermediate layers 107 and the p-type second cladding layers 106 with a tartaric acid-based or phosphoric acid-based etching solution. In this case, the etching depth is about 1.3 μm, for example. Thus, the striped dummy ridge portions 113 are parallelly formed on both sides of the striped ridge portion 112 at a prescribed interval.

Figure 44:
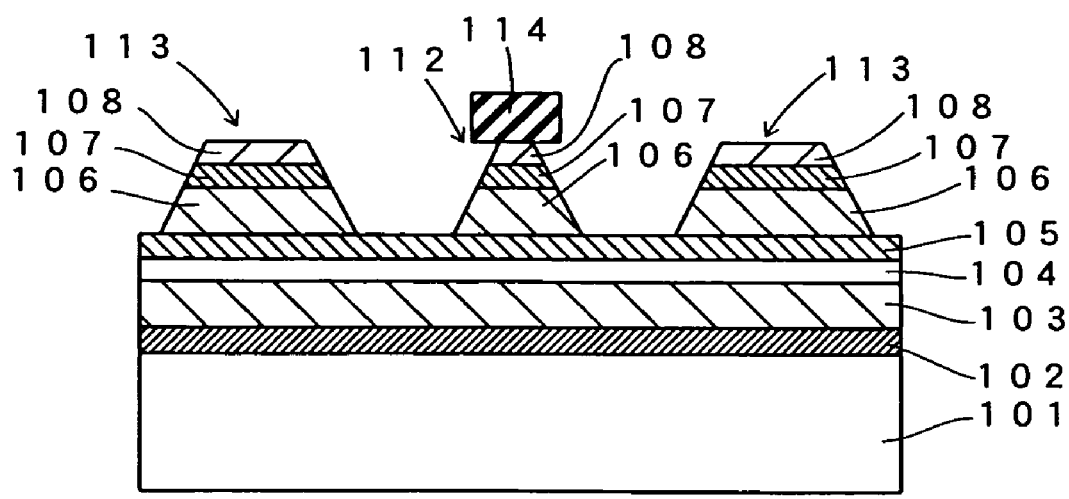

As shown in FIG. 44, the SiO$_2$ layers 114 formed on the dummy ridge portions 113 are removed by photolithography and etching with buffered hydrofluoric acid.

Figure 45:
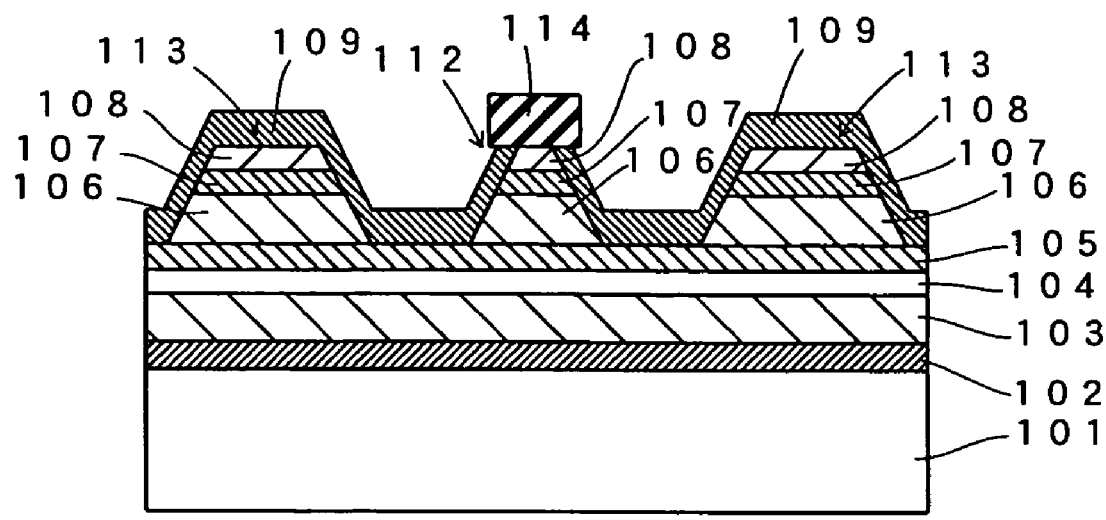

As shown in FIG. 45, the SiO$_2$ layer 114 left on the ridge portion 112 is employed as a selective growth mask for crystal-growing the current blocking layers 109 of n-type AlInP on the upper surface of the p-type first cladding layer 105, the upper surfaces and both side surfaces of the dummy ridge portions 113 and both side surfaces of the ridge portion 112 by MOVPE with the thickness of about 0.3 μm. As to the crystal growth conditions for the current blocking layers 109, the growth temperature is preferably at least about 600° C. and not more than about 700° C., and the growth pressure is preferably at least about 50 Torr and not more than about 100 Torr. The SiO$_2$ layer 114 left on the ridge portion 112 is thereafter removed by etching.

Figure 46:
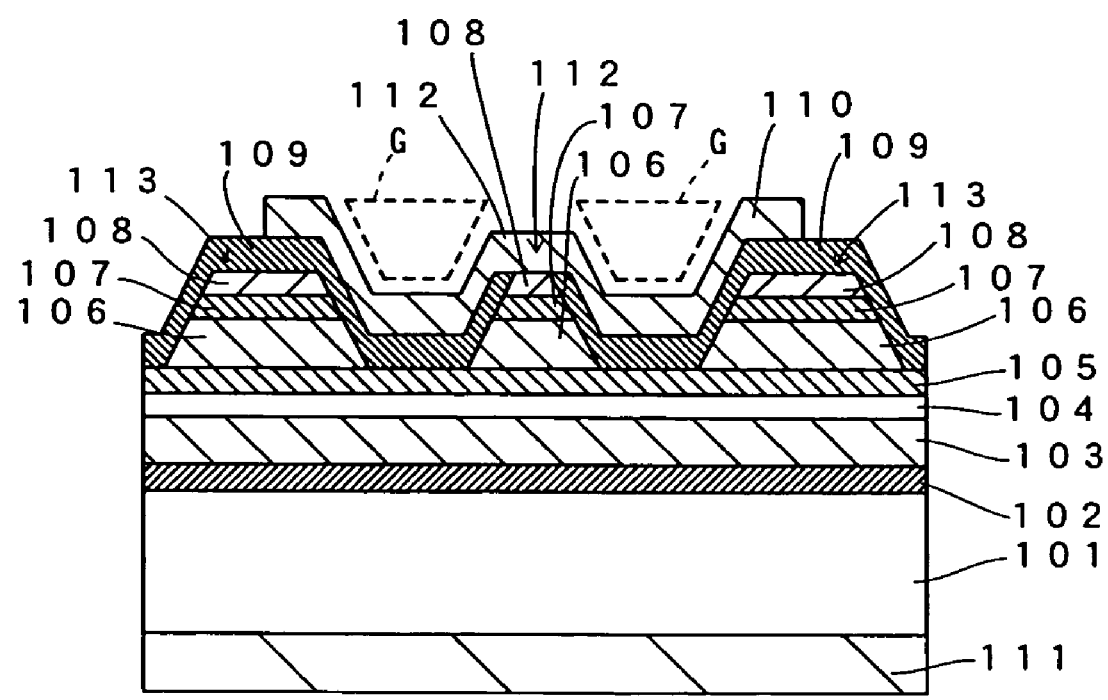

Finally, the p-side ohmic electrode 110 is formed on the ridge portion 112 (contact layer 108) and the prescribed regions of the current blocking layers 109 by sputtering, vacuum evaporation or electron beam evaporation, as shown in FIG. 46. The back surface of the n-type GaAs substrate 101 is so etched as to reduce the thickness between the back surface of the n-type GaAs substrate 101 and the upper surface of the p-side ohmic electrode 110 to about 100 μm. Further, the n-side ohmic electrode 111 is formed on the back surface of the n-type GaAs substrate 101 by sputtering, vacuum evaporation or electron beam evaporation. The semiconductor laser device according to the eighth embodiment is formed in the aforementioned manner.

The aforementioned SiO$_2$ layers 114 formed on the contact layer 108 are patterned in response to the shapes of the ridge portion 112 and the dummy ridge portions 113 set as described below.

The shapes of the ridge portion 112 and the dummy ridge portions 113 are now described. In the following description, the widths of the lower ends of the ridge portion 112 and the dummy ridge portions 113 are defined as a ridge width WR and a dummy ridge width WS respectively, as shown in FIG. 43. The width of the semiconductor laser device (chip: the width of the n-type GaAs substrate 101) is defined as a chip width L. Further, the interval between the ridge portion 112 and the dummy ridge portion 113 provided on each side thereof, i.e., the interval between the lower ends of the ridge portion 112 and each dummy ridge portion 113 is defined as a ridge interval WB. Indentations of the p-side ohmic electrode 110 defined between the ridge portion 112 and the dummy ridge portions 113 are defined as electrode trenches G.

According to the eighth embodiment, the ridge width WR, the dummy ridge width WS, the ridge interval WB and the chip width L shown in FIG. 43 are set to satisfy the following expression:

$$L \geq 2WS + WR + 2WB \quad (1)$$

For example, the chip width L, the dummy ridge width WS, the ridge width WR and the ridge interval WB are set to 300 μm, 50 μm, 2.5 μm and 50 μm respectively. In this case, the right-hand side of the above expression (1) is 202.5 μm, to satisfy the condition.

The aforementioned ridge interval WB is preferably set to at least 20 μm and not more than 100 μm. The ridge interval WB is preferably at least 20 μm for a reason based on a graph shown in FIG. 47 obtained by the following experiment:

The inventor has noted that the current blocking layers 109 of n-type AlInP are grown to extend on the SiO$_2$ layers 114 or polycrystalline-grown on the SiO$_2$ layers 114 to vary the operating voltage of the semiconductor laser device, and made the following experiment:

First, a plurality of semiconductor laser devices were prepared through the aforementioned fabrication process according to the eighth embodiment while varying the ridge interval WB (see FIG. 43). The ridge intervals WB of the plurality of semiconductor laser devices were set at pitches of 5 μm in the range of 5 μm to 50 μm. In each of the plurality of semiconductor laser devices prepared in the aforementioned manner, the chip width L, the dummy ridge width WS and the ridge width WR were 300 μm, 50 μm and 2.5 μm respectively. The operating voltages of the plurality of semiconductor laser devices were measured while feeding a current of 40 mA thereto.

Figure 47:
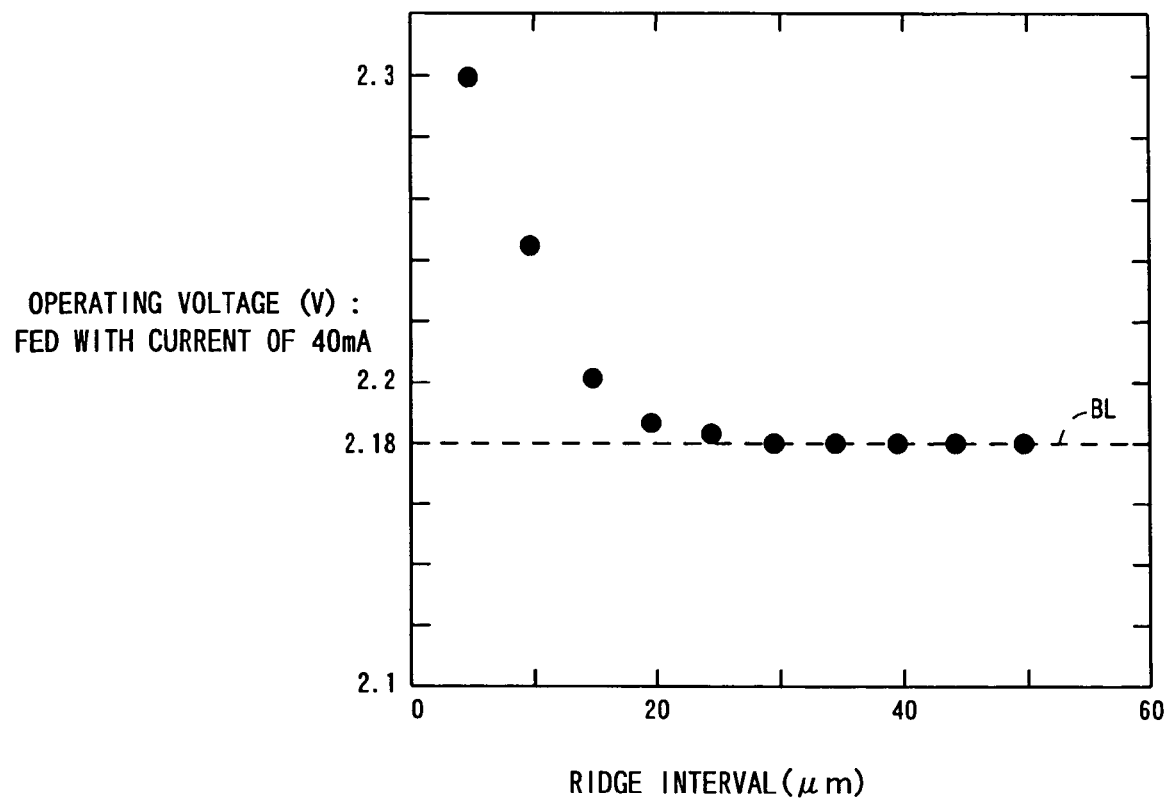
FIG. 47 is a correlation diagram showing the relation between ridge intervals and operating voltages.

FIG. 47 shows influence exerted by the ridge intervals WB on the operating voltages of the semiconductor laser devices. Referring to FIG. 47, the operating voltages of the semiconductor laser devices were abruptly reduced as the ridge intervals WB were increased from 5 μm to 20 μm. In other words, resistance values of the semiconductor laser devices were reduced as the ridge intervals WB were increased in the range of 5 μm to 20 μm. The operating voltages of the semiconductor laser devices stably remained substantially constant in the range of the ridge intervals WB of 20 μm to 50 μm, as shown by the broken line BL.

It is understood from the results of the aforementioned experiment that the selective growth property of the current blocking layers 109 of n-type AlInP with respect to the SiO$_2$ layers 114 serving as the selective growth masks and the semiconductor layers located under the same is so reduced that polycrystalline films remarkably adhere to the SiO$_2$ layers 114 to consequently increase the operating voltage if the ridge interval WB is not more than 20 μm. When the ridge interval WB is set to at least 20 μm, adhesion of polycrystalline-grown films to the current blocking layers 109 of n-type AlInP with respect to the contact layers 108 (SiO$_2$ layers 114) is so suppressed as to inhibit increase of the resistance resulting from adhesion of polycrystalline-grown films to the contact layers 108 (SiO$_2$ layers 114). Therefore, the ridge interval WB is preferably set to at least 20 μm.

On the other hand, the ridge interval WB is preferably set to not more than 100 μm, for the following reason:

When the semiconductor laser device according to the eighth embodiment is assembled in a junction-down system, the p-side ohmic electrode 110 is mounted onto a submount (not shown) or a heat sink (not shown) through a welding material of solder or the like.

In the semiconductor laser device according to the eighth embodiment, the electrode trenches G are formed on the p-side ohmic electrode 110, as shown in FIG. 46. If the ridge interval WB exceeds 100 μm, therefore, solder may not smoothly enter the electrode trenches G. In this case, spaces are defined between the p-side ohmic electrode 110 of the semiconductor laser device and the submount (not shown) or the heat sink (not shown) and heat generated from the semiconductor laser device is not sufficiently dissipated to the submount or the heat sink. Therefore, the ridge interval WB is preferably set to not more than 100 μm.

As hereinabove described, the ridge interval WB is preferably set to at least 20 μm and not more than 100 μm in the semiconductor laser device according to the eighth embodiment.

According to the eighth embodiment, as hereinabove described, the ridge interval WB is so set to at least 20 μm that the current blocking layers 109 of n-type AlInP containing an Al component are inhibited from extending onto and growing on or polycrystalline-growing on the SiO$_2$ layers 114 in formation of the current blocking layers 109. Thus, the SiO$_2$ layers 114 can be inhibited from adhesion of polycrystalline-grown films of the current blocking layers 109 consisting of n-type AlInP, whereby the resistance can be inhibited from increase resulting from adhesion of polycrystalline-grown films to the SiO$_2$ layers 114. Consequently, the semiconductor laser device can be inhibited from a voltage buildup. Therefore, power consumption can be reduced in employment of the semiconductor laser device.

According to the eighth embodiment, further, the ridge interval WB is set in the range of at least 20 μm and not more than 100 μm, whereby the resistance can be inhibited from increase without complicating the structure of the semiconductor laser device.

According to the eighth embodiment, in addition, the ridge interval WB is set to not more than 100 μm so that the welding material of solder can smoothly enter the electrode trenches G when the semiconductor laser device is assembled in the junction-down system, whereby the semiconductor laser device can be inhibited from defining spaces between the p-side ohmic electrode 110 and the submount (not shown) or the heat sink (not shown). Thus, the heat generated from the semiconductor laser device can be sufficiently dissipated to the submount or the heat sink, while the former can be stably and reliably mounted on the latter.

Ninth Embodiment

Figure 48:
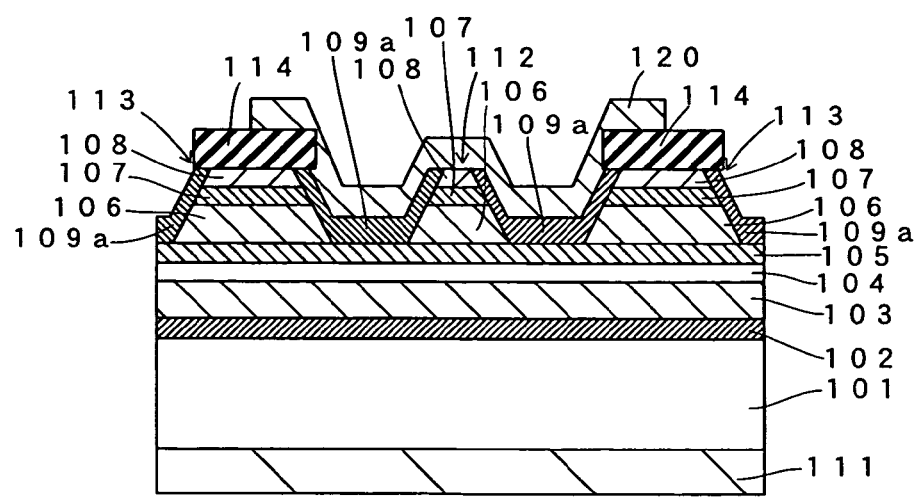
FIG. 48 is a sectional view for illustrating a semiconductor laser device according to a ninth embodiment of the present invention.

Referring to FIG. 48 a p-side ohmic electrode is formed while leaving SiO$_2$ layers on dummy ridge portions in a semiconductor laser device according to a ninth embodiment of the present invention, dissimilarly to the aforementioned eighth embodiment. The remaining structure of the ninth embodiment is similar to that of the eighth embodiment.

In the semiconductor laser device according to the ninth embodiment, a buffer layer 102, an n-type cladding layer 103, an MQW active layer (quantum well active layer) 104 and a p-type first cladding layer 105 are successively formed on an n-type GaAs substrate 101, similarly to the aforementioned eighth embodiment. A mesa (trapezoidal) ridge portion 112 and a pair of dummy ridge portions 113 are formed on the p-type first cladding layer 105. The ridge portion 112 and the pair of dummy ridge portions 113 are constituted of p-type second cladding layers 106, intermediate layers 107 and contact layers 108 respectively, similarly to the aforementioned eighth embodiment. The layers 102 to 108 of the semiconductor laser device according to the ninth embodiment are similar in composition and thickness to the layers 102 to 108 of the semiconductor laser device according to the eighth embodiment respectively.

According to the ninth embodiment, the interval between the lower ends of the ridge portion 112 and the dummy ridge portions 113 is set to at least about 20 μm and not more than about 100 μm, similarly to the aforementioned eighth embodiment. Further, SiO$_2$ layers 114 are formed on the upper surfaces of the pair of dummy ridge portions 113. Current blocking layers 109a of n-type AlInP having a thickness of 0.3 μm are formed to cover both side surfaces of the ridge portion 112, the upper surface of the p-type first cladding layer 105 and both side surfaces of the dummy ridge portions 113. A p-side ohmic electrode 120 is formed on the ridge portion 112 (contact layer 108), the current blocking layers 109a and the SiO$_2$ layers 114.

The aforementioned p-side ohmic electrode 120 is preferably prepared from a material having high thermal conductivity and excellent heat dissipativity such as Au (gold) having thermal conductivity of 315 W/m·K (27° C.). This p-side ohmic electrode 120 is an example of the "first metal electrode" in the present invention. An n-side ohmic electrode 111 is formed on the back surface of the n-type GaAs substrate 101.

Figure 49:
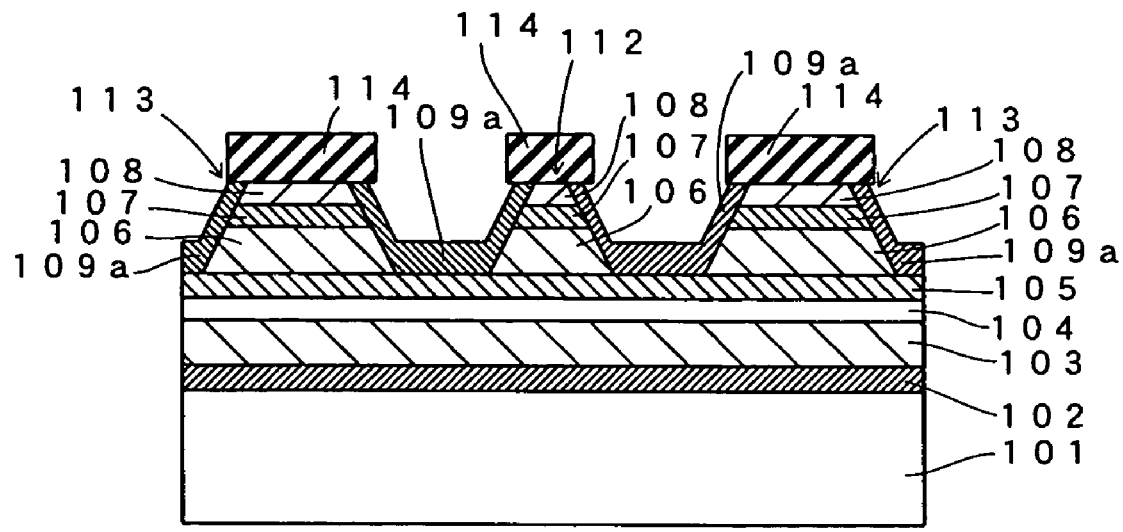
FIG. 49 is a sectional view for illustrating a process of fabricating the semiconductor laser device according to the ninth embodiment of the present invention.

A method of fabricating the semiconductor laser device according to the ninth embodiment is described with reference to FIGS. 48 and 49.

First, the ridge portion 112 and the pair of dummy ridge portions 113 are formed through steps similar to those of the eighth embodiment shown in FIGS. 41 to 43.

According to the ninth embodiment, the current blocking layers 109a of n-type AlInP are formed without removing the SiO$_2$ layers 114 from the pair of dummy ridge portions 113. In other words, the SiO$_2$ layers 114 formed on the ridge portion 112 and the pair of dummy ridge portions 113 are employed as selective growth masks for crystal-growing the current blocking layers 109a of n-type AlInP having the thickness of about 0.3 μm on the upper surface of the p-type first cladding layer 105 and both side surfaces of the ridge portion 112 and the pair of dummy ridge portions 113 by MOVPE. As to the crystal growth conditions for the aforementioned current blocking layers 109a of n-type AlInP, the growth temperature is preferably at least about 600° C. and not more than about 700° C., and the growth pressure is preferably at least 50 Torr and not more than about 100 Torr. Thereafter the SiO$_2$ layer 114 formed on the ridge portion 112 is removed by etching.

Finally, the p-side ohmic electrode 120 is formed on the ridge portion 112 (contact layer 108) and prescribed regions of the current blocking layers 109 by sputtering, vacuum evaporation or electron beam evaporation. The back surface of the n-type GaAs substrate 101 is etched for setting the thickness between the back surface of the n-type GaAs substrate 101 and the upper surface of the p-side ohmic electrode 110 to about 100 μm. Further, the n-side ohmic electrode 111 is formed on the back surface of the n-type GaAs substrate 101 by sputtering, vacuum evaporation or electron beam evaporation. The semiconductor laser device according to the ninth embodiment is formed in the aforementioned manner.

According to the ninth embodiment, as hereinabove described, the ridge interval WB is so set to at least 20 μm that the current blocking layers 109a of n-type AlInP containing an Al component are inhibited from extending onto and growing on or polycrystalline-growing on the SiO$_2$ layers 114 in formation of the current blocking layers 109a. Thus, the SiO$_2$ layer 114 formed on the ridge portion 112 can be inhibited from adhesion of polycrystalline-grown films of the current blocking layers 109a consisting of n-type AlInP, whereby the resistance can be inhibited from increase resulting from adhesion of polycrystalline-grown films to the SiO$_2$ layer 114 formed on the ridge portion 112. Consequently, the semiconductor laser device can be inhibited from a voltage buildup. Therefore, power consumption can be reduced in employment of the semiconductor laser device.

According to the ninth embodiment, further, the ridge interval WB is set in the range of at least 20 μm and not more than 100 μm, whereby the resistance can be inhibited from increase without complicating the structure of the semiconductor laser device.

According to the ninth embodiment, in addition, the ridge interval WB is set to not more than 100 μm so that a welding material of solder can smoothly enter electrode trenches G when the semiconductor laser device is assembled in a junction-down system, whereby the semiconductor laser device can be inhibited from defining spaces between the same and a submount (not shown) or a heat sink (not shown). Thus, heat generated from the semiconductor laser device can be sufficiently dissipated to the submount or the heat sink, while the former can be stably and reliably mounted on the latter.

Although the present invention has been described and illustrated in detail, it is clearly understood that the same is by way of illustration and example only and is not to be taken by way of limitation, the spirit and scope of the present invention being limited only by the terms of the appended claims.

For example, while the semiconductor layers constituting the semiconductor laser device are made of AlGaInP in each of the aforementioned first to ninth embodiments, the present invention is not restricted to this but a group III-V compound semiconductor such as AlGaAs, AlGaInAs, GaInAsP or GaN may alternatively be employed.

While the first p-side electrode 31 is formed by the metal layer containing Zn in the aforementioned third embodiment, the present invention is not restricted to this but the first p-side electrode 31 may contain a dopant having the same conductivity type as the semiconductor layer constituting the ridge portion 12. If the semiconductor layer constituting the ridge portion 12 is made of a group III-V compound semiconductor, the first p-side electrode 31 may contain at least one element selected from a group consisting of Cd, Be, Mg, Ca and Ba.

While the first p-side electrode 10 or 21 is formed by the Cr/Au layer prepared by stacking the Cr layer and the Au layer successively from the side closer to the p-type first cladding layer 5 and the second p-side electrode 22 is formed by the Pd/Au layer prepared by stacking the Pd layer and the Au layer successively from the side closer to the p-type first cladding layer 5 in each of the aforementioned first and second embodiments, the present invention is not restricted to this but another metal material such as a Ti/Pt/Au layer prepared by stacking a Ti layer, a Pt layer and an Au layer successively from the side closer to the p-type first cladding layer 5 can also be employed for the p-side electrode 10, 21 or 22. Further, the metal electrode may have at least two layers.

While the current blocking layers 9, 9a, 59, 79 or 89 are formed by multilayer films of the n-type AlInP layers doped with Se and the n-type GaAs layers in each of the aforementioned first to seventh embodiments, the present invention is not restricted to this but the current blocking layers 9, 9a, 59, 79 or 89 may alternatively formed by insulating layers of SiN or SiO$_2$.

While the interval between the ridge portion 12 and each dummy ridge portion 13 or 13a is about 50 μm in each of the aforementioned first to third embodiments, the present invention is not restricted to this but the dummy ridge portion 13 or 13a may alternatively be arranged at an interval of at least about 20 μm from the ridge portion 12. Thus, the SiO$_2$ films 15 or 15a employed as the masks for forming the current blocking layers 9 or 9a can be inhibited from growth of polycrystalline films, whereby the semiconductor laser device can be inhibited from increase of the resistance.

While the p-type second cladding layers 6, 56, 76 or 106 are removed by etching by the thickness (=d) for leaving the p-type first cladding layer(s) 5, 55, 75 or 105 in formation of the ridge portion(s) 12, 62, 83, 92 or 112 and the dummy ridge portions 13, 13a, 63a and 63b, 84, 93 or 113 in each of the aforementioned first to ninth embodiments, the present invention is not restricted to this but an etching stop layer of GaInP or the like may alternatively be provided between the p-type first cladding layer(s) 5, 55, 75 or 105 and the p-type second cladding layers 6, 56, 76 or 106. Thus, etching controllability can be improved.

While the emission layer(s) 4, 54 or 74 has the strain compensatory structure obtained by introducing compression strain into the well layers 4b in each of the aforementioned first to seventh embodiments, the present invention is not restricted to this but the emission layer(s) 4, 54 or 74 may alternatively have a strain compensatory structure obtained by introducing tensile strain into the well layers 4b, or may have no strain.

The solder constituting the welding material(s) 153 or 163 employed for the present invention may be prepared from PbSn, AuSn, AgSn or SnAgCu.

What is claimed is:

1. A semiconductor laser device, comprising:
   an emission layer formed on a substrate;
   a semiconductor layer formed on said emission layer while constituting a convex ridge portion;
   a current blocking layer comprising a semiconductor formed to cover at least the side surfaces of said ridge portion;
   a first metal electrode formed on the upper surface of said ridge portion; and
   convex support portions arranged on both sides of said ridge portion at a prescribed interval from said ridge portion,
   wherein said convex ridge portion and said support portions are mounted on a submount through a welding layer,
   the first metal electrode is formed to cover the ridge portion and the support portions, and
   the current blocking layer is formed on the upper surfaces of the support portions and the first metal electrode is formed on said current blocking layer.

2. The semiconductor laser device according to claim 1, wherein said current blocking layer consisting of a semiconductor is formed not on the upper surface of said ridge portion but on the upper surfaces of said support portions.

3. The semiconductor laser device according to claim 2, wherein said support portions are substantially flush with the upper surface of said ridge portion.

4. The semiconductor laser device according to claim 1, wherein said first metal electrode includes a plurality of metal electrode layers.

5. The semiconductor laser device according to claim 1, wherein said first metal electrode includes an upper surface having an irregular shape reflecting the shape of said convex ridge portion, the shape of said support portions and the shape of said current blocking layer.

6. The semiconductor laser device according to claim 5, wherein the height of portions of said first metal electrode located on said support portions exceeds that of a portion located on said ridge portion.

7. The semiconductor device according to claim 1, wherein said first metal electrode is so mounted on said submount that portions of said first metal electrode located on said support portions are in contact with said submount and a portion of said first metal electrode located on said ridge portion is not in contact with said submount.

8. The semiconductor device according to claim 1, wherein side surfaces of said support portions closer to end surfaces of said semiconductor laser device are arranged inward beyond said end surfaces of said semiconductor laser device at a prescribed interval.

9. The semiconductor laser device according to claim 1, wherein said current blocking layer covers side surfaces of said support portions closer to end surfaces of said semiconductor laser device, the upper surfaces of said support portions and side surfaces of said support portions closer to said ridge portion.

10. The semiconductor laser device according to claim 1, wherein the thickness of said first metal electrode is at least 5 μm.

11. The semiconductor device according to claim 1, wherein said first metal electrode contains a dopant having the same conductivity type as said semiconductor layer constituting said ridge portion.

12. The semiconductor laser device according to claim 11, wherein said semiconductor layer constituting said ridge portion consists of a group III-V compound semiconductor, and
said dopant, contained in said first metal electrode, having the same conductivity type as said semiconductor layer constituting said ridge portion includes at least one element selected from a group consisting of Zn, Cd, Be, Mg, Ca and Ba.

13. The semiconductor laser device according to claim 1, wherein a plurality of said convex support portions are arranged on each side of said ridge portion.

14. A semiconductor laser device, comprising:
an emission layer formed on a substrate; a semiconductor layer formed on said emission layer while constituting a convex ridge portion;
a current blocking layer comprising a semiconductor formed to cover at least the side surfaces of said ridge portion;
a first metal electrode formed on the upper surface of said ridge portion; and
convex support portions arranged on both sides of said ridge portion at a prescribed interval from said ridge portion,
wherein said emission layer includes a plurality of emission layers, formed on said substrate at a prescribed interval, each having an emission portion,
said semiconductor layer constituting said convex ridge portion, said current blocking layer, said first metal electrode and said convex support portions are formed on each of said plurality of emission layers,
the first metal electrode is formed to cover the ridge portion and the support portions, and
the current blocking layer is formed on the upper surfaces of the support portions and the first metal electrode is formed on said current blocking layer.

15. A semiconductor laser device, comprising:
an emission layer formed on a substrate;
a semiconductor layer formed on said emission layer while constituting a convex ridge portion;
a current blocking layer comprising a semiconductor formed to cover at least the side surfaces of said ridge portion;
a first metal electrode formed on the upper surface of said ridge portion; and
convex support portions arranged on both sides of said ridge portion at a prescribed interval from said ridge portion,
wherein the interval between the lower end of said ridge portion and the lower ends of said support portions is at least 20 μm,
the first metal electrode is formed to cover the ridge portion and the support portions, and
the current blocking layer is formed on the upper surfaces of the support portions and the first metal electrode is formed on said current blocking layer.

16. The semiconductor laser device according to claim 15, wherein the interval between the lower end of said ridge portion and the lower ends of said support portions is not more than 100 μm.

17. The semiconductor laser device according to claim 15, wherein said current blocking layer consists of a compound semiconductor containing aluminum.

18. A method of fabricating a semiconductor laser device, comprising steps of:
forming an emission layer on a substrate;
forming a semiconductor layer constituting a convex ridge portion on said emission layer;
forming a convex support portion so that an interval between the lower end of said ridge portion and the lower end of said support portion is at least 20 μm;
forming a current blocking layer consisting of a semiconductor to cover the side surfaces of said ridge portion, and the side surfaces and the upper surfaces of said support portions; and
forming a first metal electrode to cover the upper surfaces of said ridge portion and the side surfaces and upper surfaces of said support portions.

19. The method of fabricating a semiconductor laser device according to claim 18, wherein said step of forming said support portion includes a step of forming said support portion so that the interval between the lower end of said ridge portion and the lower end of said support portion is not more than 100 μm.

20. The method of fabricating a semiconductor laser device according to claim 18, wherein said step of forming said current blocking layer includes steps of:
forming a mask consisting of a dielectric substance on the upper surface of said ridge portion, and
crystal-growing said current blocking layer consisting of a semiconductor on a portion other than said mask.

21. The semiconductor laser device according to claim 1, further comprising a second metal electrode, formed on said first metal electrode, superior in adhesiveness to said first metal electrode.

* * * * *